US012787379B2

(12) United States Patent
Liaw

(10) Patent No.: US 12,787,379 B2
(45) Date of Patent: Nov. 3, 2026

(54) SEMICONDUCTOR DEVICE AND METHOD FOR FORMING THE SAME

(71) Applicant: Taiwan Semiconductor Manufacturing Company, Ltd., Hsinchu (TW)

(72) Inventor: Jhon-Jhy Liaw, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 517 days.

(21) Appl. No.: 18/478,054

(22) Filed: Sep. 29, 2023

(65) Prior Publication Data

US 2025/0113562 A1 Apr. 3, 2025

(51) Int. Cl.

| | |
|---|---|
| ***H01L 29/06*** | (2006.01) |
| ***H01L 21/8234*** | (2006.01) |
| ***H01L 27/088*** | (2006.01) |
| ***H01L 29/08*** | (2006.01) |
| ***H01L 29/423*** | (2006.01) |
| ***H01L 29/66*** | (2006.01) |
| ***H01L 29/86*** | (2006.01) |
| ***H10D 30/67*** | (2025.01) |
| ***H10D 62/10*** | (2025.01) |
| ***H10D 62/13*** | (2025.01) |

(Continued)

(52) U.S. Cl.

CPC ....... *H10D 62/118* (2025.01); *H10D 30/6735* (2025.01); *H10D 30/6757* (2025.01); *H10D 62/151* (2025.01); *H10D 64/017* (2025.01); *H10D 84/0128* (2025.01); *H10D 84/013* (2025.01); *H10D 84/038* (2025.01); *H10D 84/83* (2025.01)

(58) Field of Classification Search

CPC ................ H10D 30/024; H10D 30/62; H10D 30/6735; H10D 30/6757; H10D 62/121; H10D 62/118; H10D 64/017; H10D 84/0128; H10D 84/0158; H10D 84/0167; H10D 84/0193; H10D 84/834; H10D 84/853; H10P 14/3462

See application file for complete search history.

(56) References Cited

U.S. PATENT DOCUMENTS 9,209,247 B2 12/2015 Colinge et al.
9,236,267 B2 1/2016 De et al.

(Continued)

*Primary Examiner* — John A Bodnar

(74) *Attorney, Agent, or Firm* — Birch, Stewart, Kolasch Birch, LLP

(57) ABSTRACT

A semiconductor device includes a first circuit cell having first transistors, and a second circuit cell having second transistors and arranged with the first circuit cell in an X-direction. Each of the first transistors includes first nanostructures vertically stacked from each other. Each of the second transistors includes second nanostructures vertically stacked from each other. A cell pitch of the first circuit cell and a cell pitch of the second circuit cell in a Y-direction are the same. A first pitch of the first nanostructures in the Z-direction and a second pitch of the second nanostructures in the Z-direction are the same. A first thickness of the first nanostructures in the Z-direction is greater than a second thickness of the second nanostructures in the Z-direction. A first width of the first nanostructures in the Y-direction is greater than a second width of the second nanostructures in the Y-direction.

20 Claims, 54 Drawing Sheets

(51) Int. Cl.

| | |
|---|---|
| ***H10D 64/01*** | (2025.01) |
| ***H10D 84/01*** | (2025.01) |
| ***H10D 84/03*** | (2025.01) |
| ***H10D 84/83*** | (2025.01) |

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2021/0083055 A1* | 3/2021 | Liaw | H10D 30/014 |

* cited by examiner

SEMICONDUCTOR DEVICE AND METHOD FOR FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, gate-all-around (GAA) transistors have been incorporated into memory devices (including, for example, static random-access memory, or SRAM, cells) and core devices (including, for example, standard logic, or STD, cells) to reduce chip footprint while maintaining reasonable processing margins.

However, although existing technologies for fabricating circuit cells including GAA transistors have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
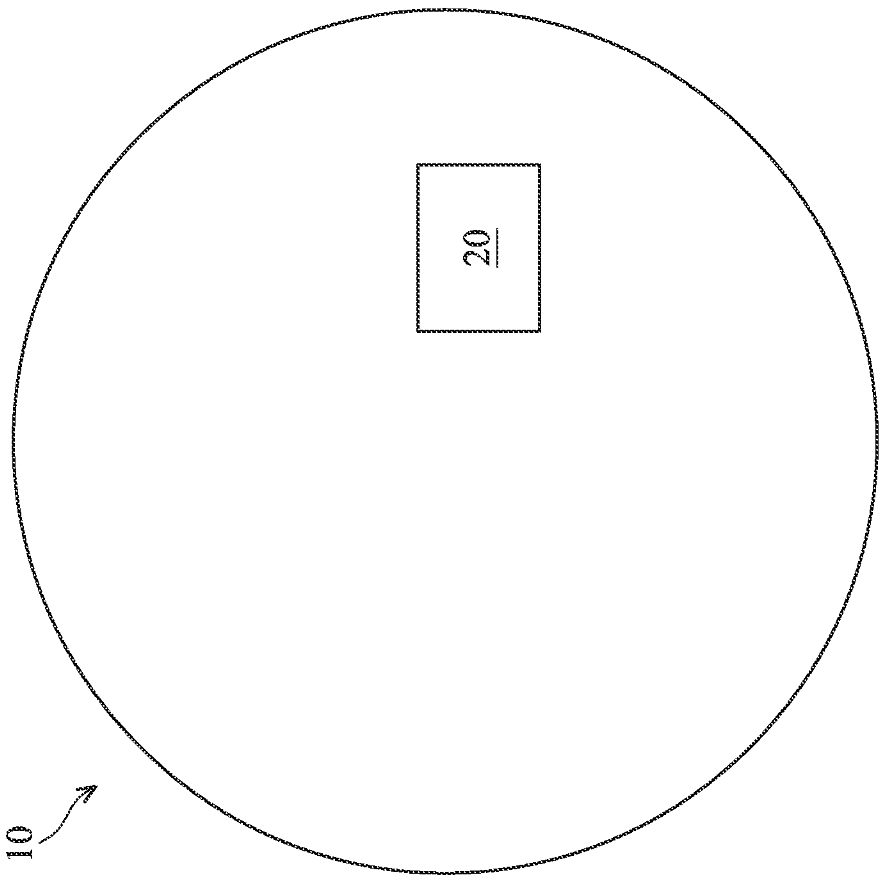
FIG. 1 is a fragmentary diagrammatic top view of an integrated circuit (IC) chip, in portion or entirety, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor structures, and more particularly to semiconductor structures with field-effect transistors (FETs), such as three-dimensional gate-all-around (GAA) transistors, in memory (e.g., SRAM) and/or standard logic cells of an integrated circuit (IC) structure. Generally, a GAA transistor may include a plurality of vertically stacked sheets (e.g., nanosheets), wires (e.g., nanowires), or rods (e.g., nanorods) in a channel region of the transistor, thereby allowing better gate control, lowered leakage current, and improved scaling capability for various IC applications. While existing technologies for fabricating GAA transistors have been generally adequate for their intended applications, they have not been entirely satisfactory in all aspects.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and devices having circuit cells with transistors having different channel widths and channel thicknesses for different application, such that the device benefits are maximized. The details of the structure and manufacturing methods of the present disclosure are described below in conjunction with the accompanying drawings, which illustrate the process of making GAA transistors, according to some embodiments.

The various aspects of the present disclosure will now be described in more detail with reference to the figures. For avoidance of doubts, an X-direction, a Y-direction, and a Z-direction in the figures are perpendicular to one another and are used consistently. Throughout the present disclosure, like reference numerals denote like features unless otherwise indicated.

FIG. 1 is a fragmentary diagrammatic top view of an integrated circuit (IC) chip 10, in portion or entirety, in accordance with some embodiments of the present disclosure. The IC chip 10 may include various passive microelectronic devices and active microelectronic devices, such as resistors, capacitors, inductors, diodes, P-type field effect transistors (PFETs), N-type field effect transistors (NFETs), metal-oxide semiconductor field effect transistors (MOSFETs), CMOS transistors, bipolar junction transistors (BJTs), laterally diffused MOS (LDMOS) transistors, high voltage transistors, high frequency transistors, other suitable components, or a combination thereof. The various microelectronic devices can be configured to provide the IC chip 10 with functionally distinct regions, such as a core region (also referred to as a logic region), a memory region (e.g., a static random access memory (SRAM) region), an analog region, a peripheral region (also referred to as an input/output (I/O) region), a dummy region, and/or other suitable region. As shown in FIG. 1, the IC chip 10 includes a logic region 20. The logic region 20 may include an array of circuit cells having various logic cells or standard (STD) cells. The logic cells or STD cells may include transistors and interconnect structures that combine to provide a logic device and/or a logic function, such as an inverter, an AND, an NAND, an OR, an NOR, a NOT, an XOR, an XNOR, a Flip-Flop, other suitable logic devices, or a combination thereof. FIG. 1 has been simplified for the sake of clarity to better understand the inventive concepts of the present disclosure. Additional features can be added in the IC chip 10, and some of the features described herein can be replaced, modified, or eliminated in other embodiments of the IC chip 10.

FIGS. 2A to 2E are circuit schematics of various STD cells in the array of circuit cells in the logic region 20 of the IC chip 10, in accordance with some embodiments of the present disclosure.

Figure 2C:
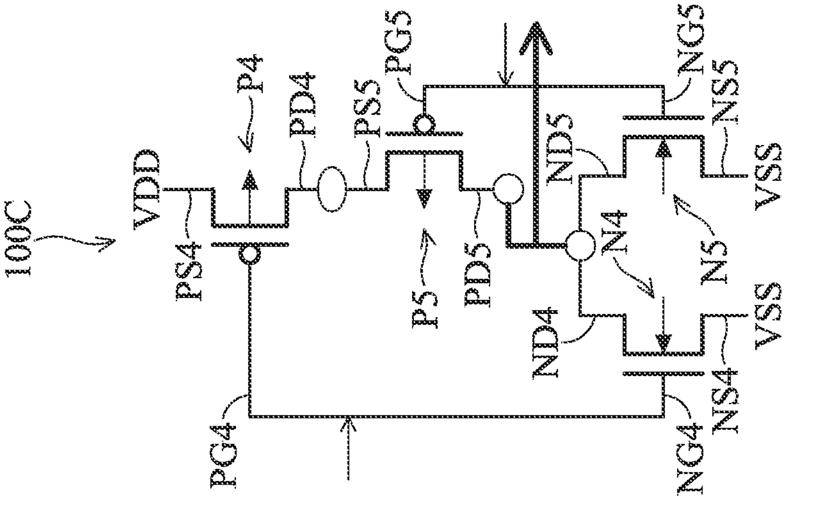
FIGS. 2A, 2B, 2C, 2D, and 2E are circuit schematics of various STD cells in an array of circuit cells in the logic region of the IC chip, in accordance with some embodiments of the present disclosure.
Figure 2B:
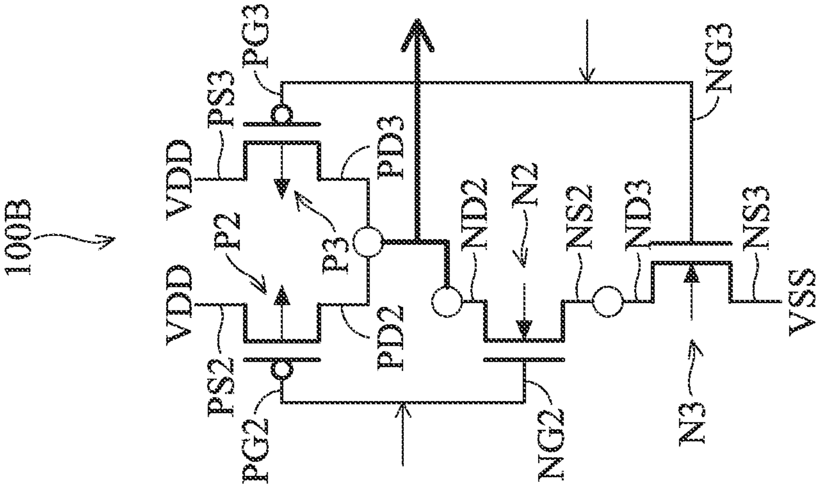
Figure 2A:
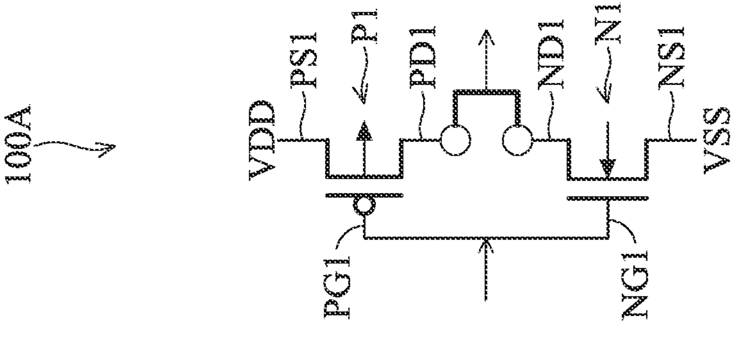

FIG. 2A shows an inverter 100A including an N-type transistor N1 and a P-type transistor P1. The N-type transistor N1 includes a source terminal NS1, a drain terminal ND1, and a gate terminal NG1, and the P-type transistor P1 includes a source terminal PS1, a drain terminal PD1, and a gate terminal PG1.

As shown in FIG. 2A, the gate terminals NG1 and PG1 are coupled with each other to operate as an input terminal of the inverter 100A. The drain terminals ND1 and PD1 are coupled with each other to operate as an output terminal of the inverter 100A. The source terminal PS1 is coupled to a VDD voltage. The source terminal NS1 is coupled to a VSS voltage (or a ground voltage).

FIG. 2B shows a NAND (also referred to as a NAND logic gate, a NAND device or a NAND cell) 100B including N-type transistors N2, N3 and P-type transistors P2, P3. The N-type transistor N2 includes a source terminal NS2, a drain terminal ND2, and a gate terminal NG2, and the N-type transistor N3 includes a source terminal NS3, a drain terminal ND3, and a gate terminal NG3. The P-type transistor P2 includes a source terminal PS2, a drain terminal PD2, and a gate terminal PG2, and the P-type transistor P3 includes a source terminal PS3, a drain terminal PD3, and a gate terminal PG3.

As shown in FIG. 2B, the gate terminals NG2 and PG2 are coupled with each other to operate as a first input terminal of the NAND 100B, and the gate terminals NG3 and PG3 are coupled with each other to operate as a second input terminal of the NAND 100B. The drain terminals ND2, PD2, and PD3 are coupled with each other to operate as an output terminal of the NAND 100B. In some embodiments, the connection of the drain terminals ND2, PD2, and PD3 are referred to as a "common drain." The source terminals PS2 and PS3 are coupled to the VDD voltage. The source terminal NS3 is coupled to VSS voltage (or a ground voltage). The source terminal NS2 and drain terminal ND3 are coupled with each other.

FIG. 2C shows a NOR (also referred to as a NOR logic gate, a NOR device or a NOR cell) 100C including N-type transistors N4, N5 and P-type transistors P4, P5. The N-type transistor N4 includes a source terminal NS4, a drain terminal ND4, and a gate terminal NG4, and the N-type transistor N5 includes a source terminal NS5, a drain terminal ND5, and a gate terminal NG5. The P-type transistor P4 includes a source terminal PS4, a drain terminal PD4, and a gate terminal PG4, and the P-type transistor P5 includes a source terminal PS5, a drain terminal PD5, and a gate terminal PG5.

As shown in FIG. 2C, the gate terminals NG4 and PG4 are coupled with each other to operate as a first input terminal of the NOR 100C, and the gate terminals NG5 and PG5 are coupled with each other to operate as a second input terminal of the NOR 100C. The drain terminals ND4, ND5, and PD5 are coupled with each other to operate as an output terminal of the NOR 100C. In some embodiments, the connection of the drain terminals ND4, ND5, and PD5 are referred to as "common drain." The source terminal PS4 is coupled to the VDD voltage. The source terminals NS4 and NS5 are coupled to VSS voltage (or a ground voltage). The source terminal PS5 and drain terminal PD4 are coupled with each other.

Figure 2D:
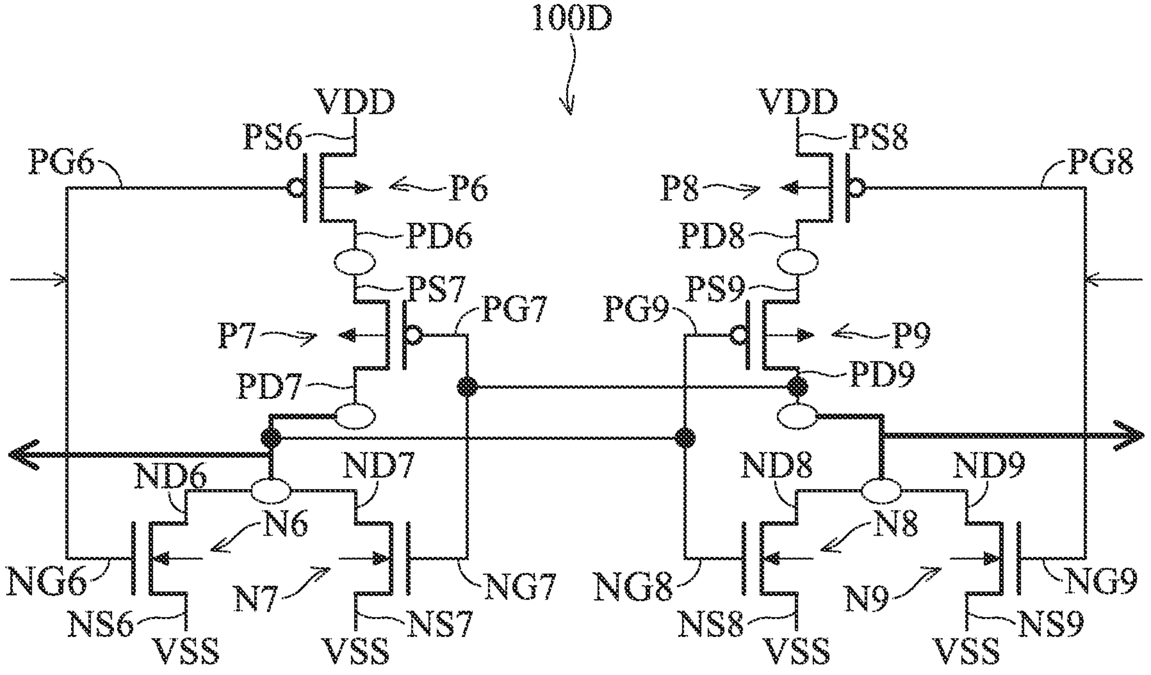

FIG. 2D shows a flip-flop (also referred to as a flip-flop device or a flip-flop cell) 100D including N-type transistors N6, N7, N8, N9 and P-type transistors P6, P7, P8, P9. The N-type transistor N6 includes a source terminal NS6, a drain terminal ND6, and a gate terminal NG6; the N-type transistor N7 includes a source terminal NS7, a drain terminal ND7, and a gate terminal NG7; the N-type transistor N8 includes a source terminal NS8, a drain terminal ND8, and a gate terminal NG8; and the N-type transistor N9 includes a source terminal NS9, a drain terminal ND9, and a gate terminal NG9. The P-type transistor P6 includes a source terminal PS6, a drain terminal PD6, and a gate terminal PG6; the P-type transistor P7 includes a source terminal PS7, a drain terminal PD7, and a gate terminal PG7; the P-type transistor P8 includes a source terminal PS8, a drain terminal PD8, and a gate terminal PG8; and the P-type transistor P9 includes a source terminal PS9, a drain terminal PD9, and a gate terminal PG9.

As shown in FIG. 2D, the flip-flop 100D is a set-reset (SR) NOR latch. The NOR latch may include a pair of cross-coupled NOR. Specifically, the output terminal of a first NOR is coupled to the second input terminal of a second NOR, and the output terminal of the second NOR is coupled to the second input terminal of the first NOR. The details of the other connections of the flip-flop 100D are similar to the NOR 100C, and may not be described in detail herein.

Figure 2E:
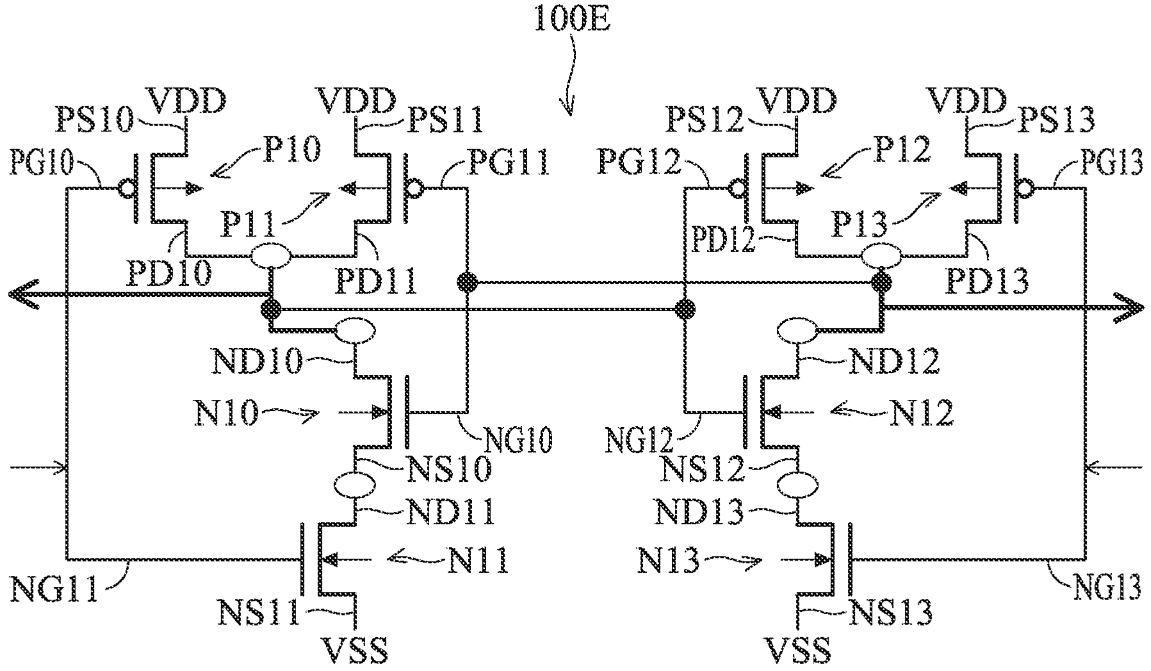

FIG. 2E shows a flip-flop 100E including N-type transistors N10, N11, N12, N13 and P-type transistors P10, P11, P12, P13. The N-type transistor N10 includes a source terminal NS10, a drain terminal ND10, and a gate terminal NG10; the N-type transistor N11 includes a source terminal NS11, a drain terminal ND11, and a gate terminal NG11; the N-type transistor N12 includes a source terminal NS12, a drain terminal ND12, and a gate terminal NG12; and the N-type transistor N13 includes a source terminal NS13, a drain terminal ND13, and a gate terminal NG13. The P-type transistor P10 includes a source terminal PS10, a drain terminal PD10, and a gate terminal PG10; the P-type transistor P11 includes a source terminal PS11, a drain terminal PD11, and a gate terminal PG11; the P-type transistor P12 includes a source terminal PS12, a drain terminal PD12, and a gate terminal PG12; and the P-type transistor P13 includes a source terminal PS13, a drain terminal PD13, and a gate terminal PG13.

As shown in FIG. 2E, the flip-flop 100E is a SR NAND latch. The NAND latch may include a pair of cross-coupled NAND. Specifically, the output terminal of a first NAND is coupled to the first input terminal of a second NAND, and the output terminal of the second NAND is coupled to the first input terminal of the first NAND. The details of the other connections of the flip-flop 100E are similar to the NAND 100B, and may not be described in detail herein.

Figure 3:
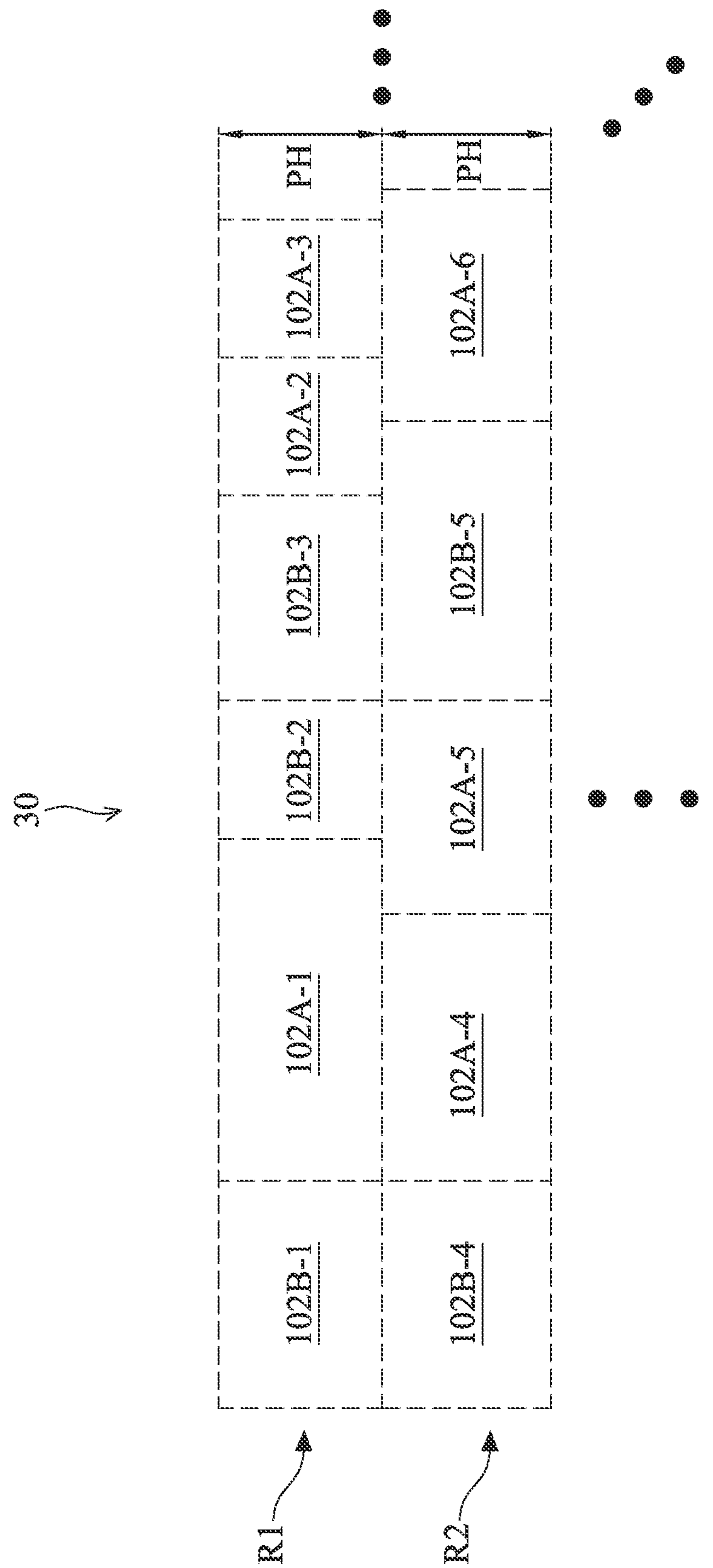
FIG. 3 illustrates a block diagram of an array of the circuit cells for different application, in accordance with some embodiments of the present disclosure.

FIG. 3 illustrates a block diagram of an array 30 of the circuit cells for different application, in accordance with some embodiments of the present disclosure. The array 30 includes circuit cells 102A (including circuit cells 102A-1 to 102A-6) and 102B (including circuit cells 102B-1 to 102B-5), for example STD cells discussed above, arranged in rows (e.g., rows R1 and R2 shown in FIG. 3). The transistors in the circuit cells 102A have wider width and thicker thickness nanostructures (channel layers) for high speed application and the transistors in the circuit cells 102B have narrower width and thinner thickness nanostructures for low power application. As shown in FIG. 3, the circuit cells 102A and 102B for different application can be arbitrarily placed in array 30 according to design requirements. As such, the circuit cells 102A and 102B for different applications can be designed in single array 30 to maximize the device benefits, instead of designing circuit cells for different applications in different arrays. Furthermore, each of the circuit cells 102A and 102B have the same gate pitch and cell pitch PH to provide a design flexibility on speed/power optimization.

Figure 4:
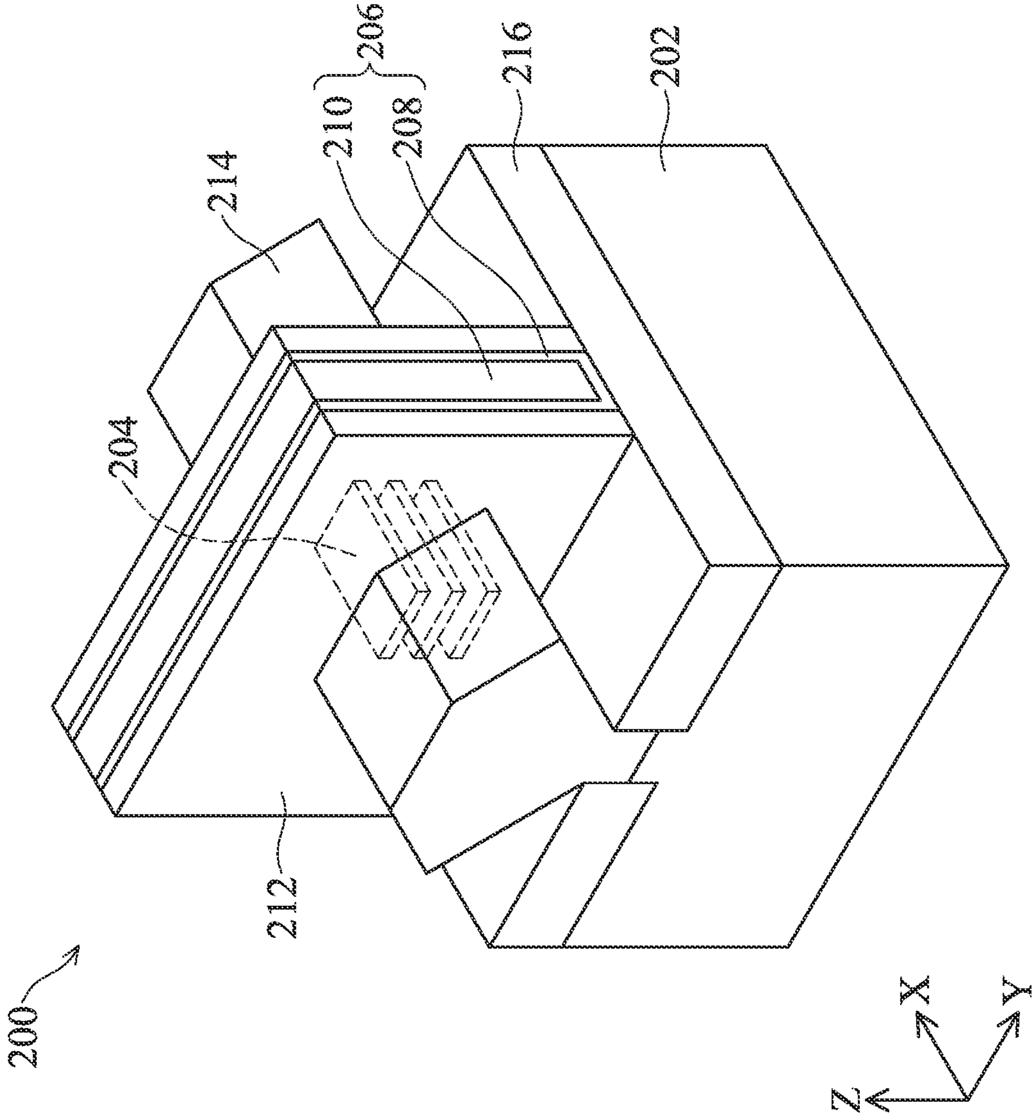
FIG. 4 is a perspective view of an embodiment of a GAA transistor in the array of circuit cells, in accordance with some embodiments of the present disclosure.

Each of the circuit cells discussed above is constructed by transistors. The transistors may be planar transistors, fin field-effect transistor (FinFET) transistors, gate-all-around (GAA) transistors, nano-wire transistors, nano-sheet transistors, or a combination thereof. For the sake of providing an example, an exemplary GAA transistor is illustrated in FIG. 4. However, it should be understood that the application should not be limited to a particular type of device, except as specifically claimed.

Referring to FIG. 4, a perspective view of an exemplary GAA transistor 200 is illustrated. The GAA transistor 200 is formed over a substrate 202. The substrate 202 may contains a semiconductor material, such as bulk silicon (Si). The GAA transistor 200 also includes one or more nanostructures 204 (dash lines) extending in the X-direction and vertically stacked (or arranged) in the Z-direction. More specifically, the nanostructures 204 are spaced apart from each other in the Z-direction. In some embodiments, the nanostructures 204 may also be referred to as channels, channel layers, nanosheets, or nanowires.

The GAA transistor 200 further includes a gate structure 206 including a gate dielectric layer 208 and a gate electrode 210. The gate dielectric layer 208 wraps around the nanostructures 204 and the gate electrode 210 wraps around the gate dielectric layer 208 (not shown in FIG. 4, may refer to FIGS. 5B to 5E). As shown in FIG. 4, gate spacers 212 are on sidewalls of the gate structure 206 and over the nanostructures 204 (not shown in FIG. 4, may refer to FIGS. 5C and 5D)

The GAA transistor 200 further includes source/drain features 214. As shown in FIG. 4, two source/drain features 214 are on opposite sides of the gate structure 206. The nanostructures 204 (dash lines) extend in the X-direction to connect one source/drain feature 214 to the other source/drain feature 214. The source/drain features 214 may also be referred to as source/drain, or source/drain regions. In some embodiments, source/drain feature(s) may refer to a source or a drain, individually or collectively dependent upon the context.

Isolation feature 216 is over the substrate 202 and under the gate dielectric layer 208, the gate electrode 210, and the gate spacers 212. The isolation feature 216 is used for isolating the GAA transistor 200 from other devices. In some embodiments, the isolation feature 216 may include different structures, such as shallow trench isolation (STI) structure, deep trench isolation (DTI) structure. Therefore, the isolation feature 216 is also referred as to as a STI feature or DTI feature.

Figure 5A:
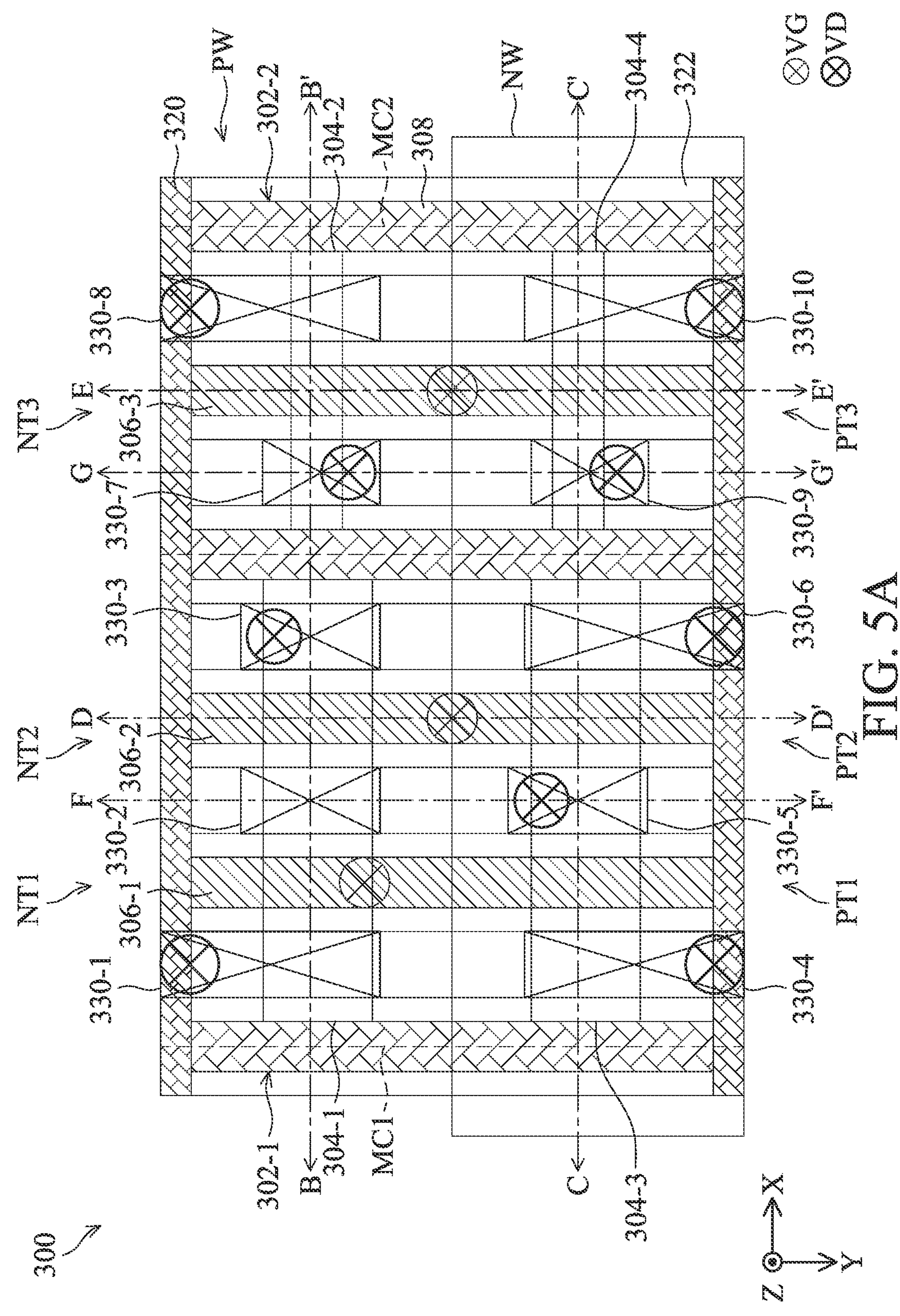
FIG. 5A illustrates a top view (or a layout) of an array of the circuit cells for different application in the logic region of the IC chip, in accordance with some embodiments of the present disclosure.
Figure 5B:
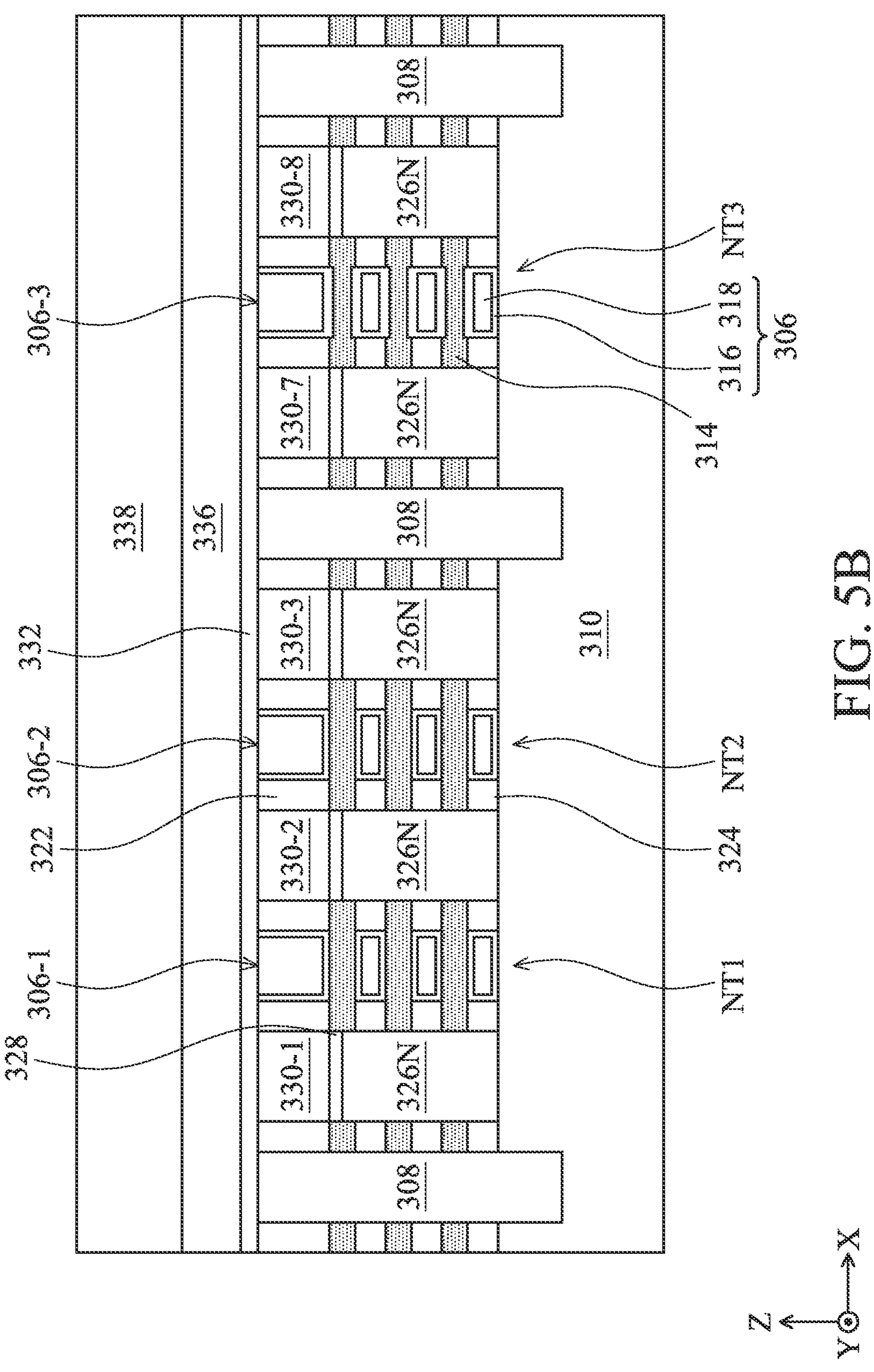
FIG. 5B illustrates an X-Z cross-sectional view of the array of the circuit cells along a line B-B' of FIG. 5A, respectively, in accordance with some embodiments of the present disclosure.
Figure 5C:
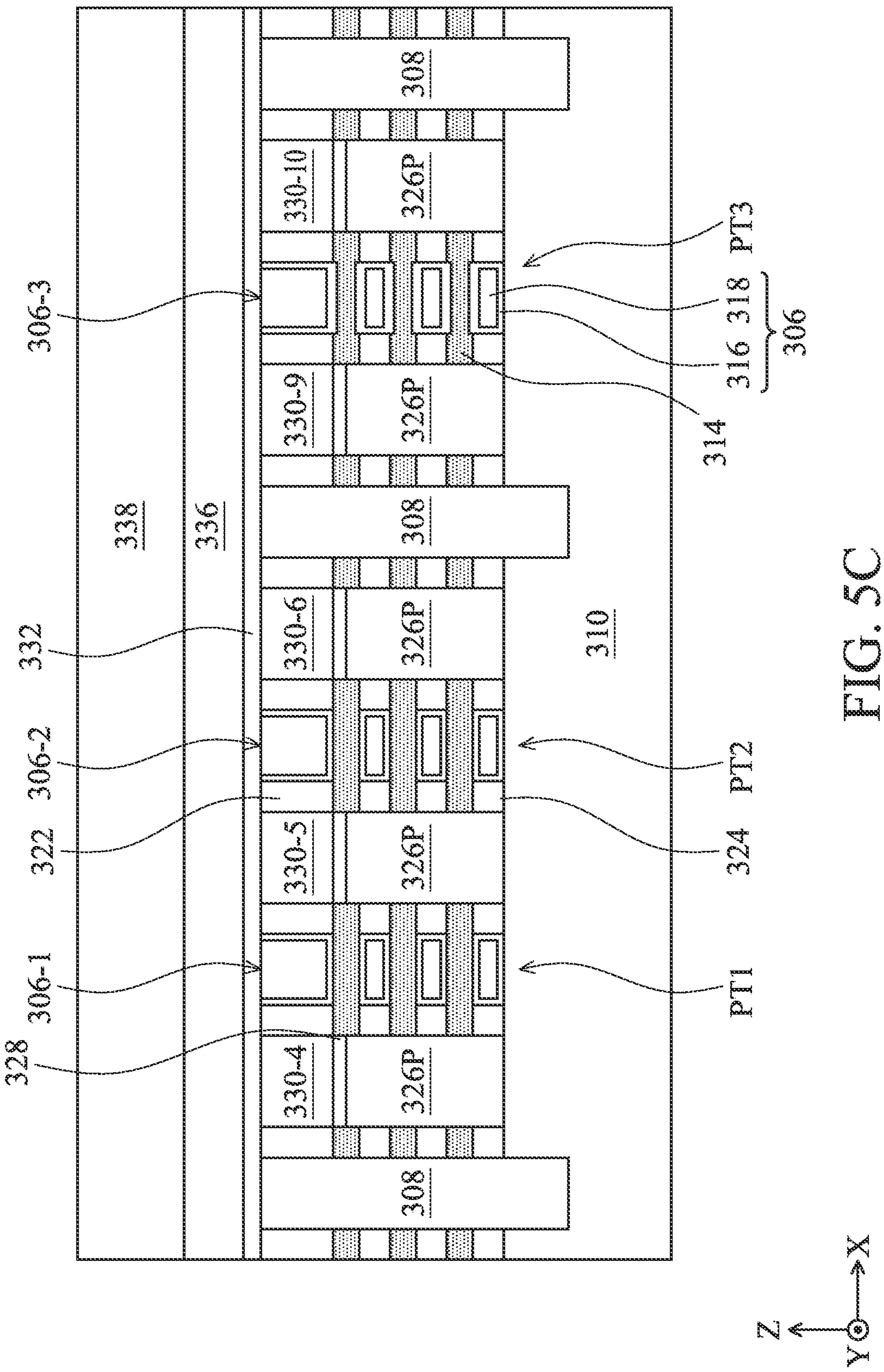
FIG. 5C illustrates an X-Z cross-sectional view of the array of the circuit cells along a line C-C' of FIG. 5A, respectively, in accordance with some embodiments of the present disclosure.
Figure 5D:
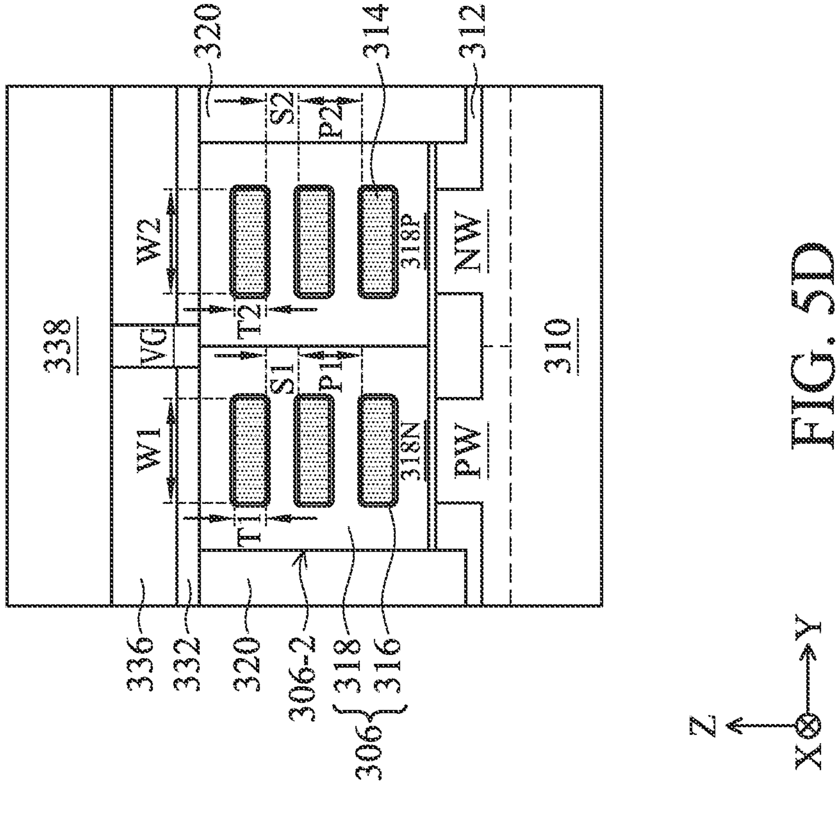
FIG. 5D illustrates a Y-Z cross-sectional view of the array of the circuit cells along a line D-D' of FIG. 5A, respectively, in accordance with some embodiments of the present disclosure.
Figure 5E:
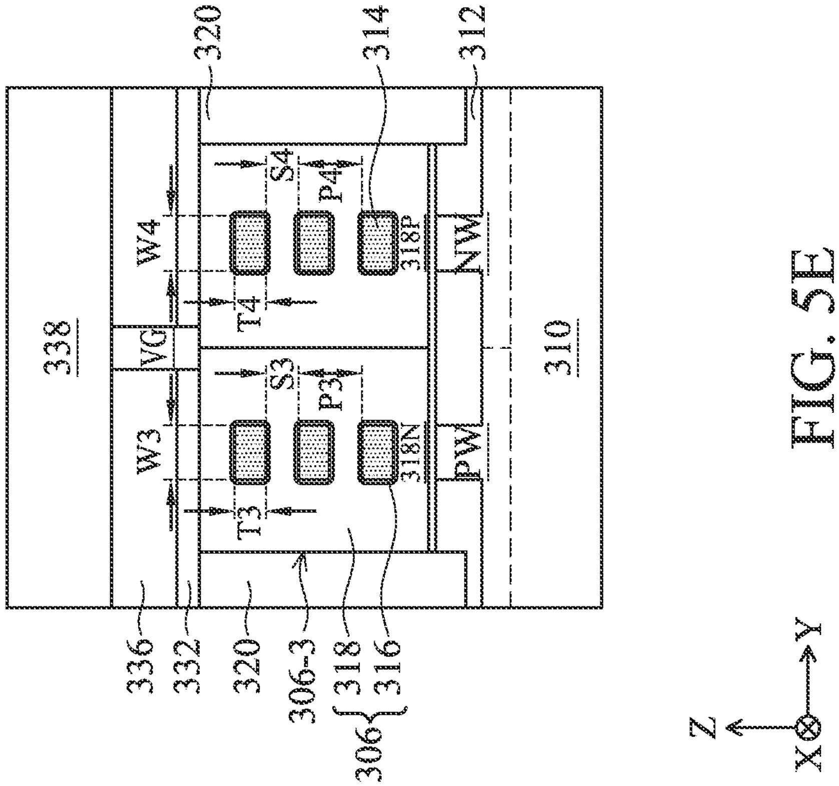
FIG. 5E illustrates a Y-Z cross-sectional view of the array of the circuit cells along a line E-E' of FIG. 5A, respectively, in accordance with some embodiments of the present disclosure.
Figure 5G:
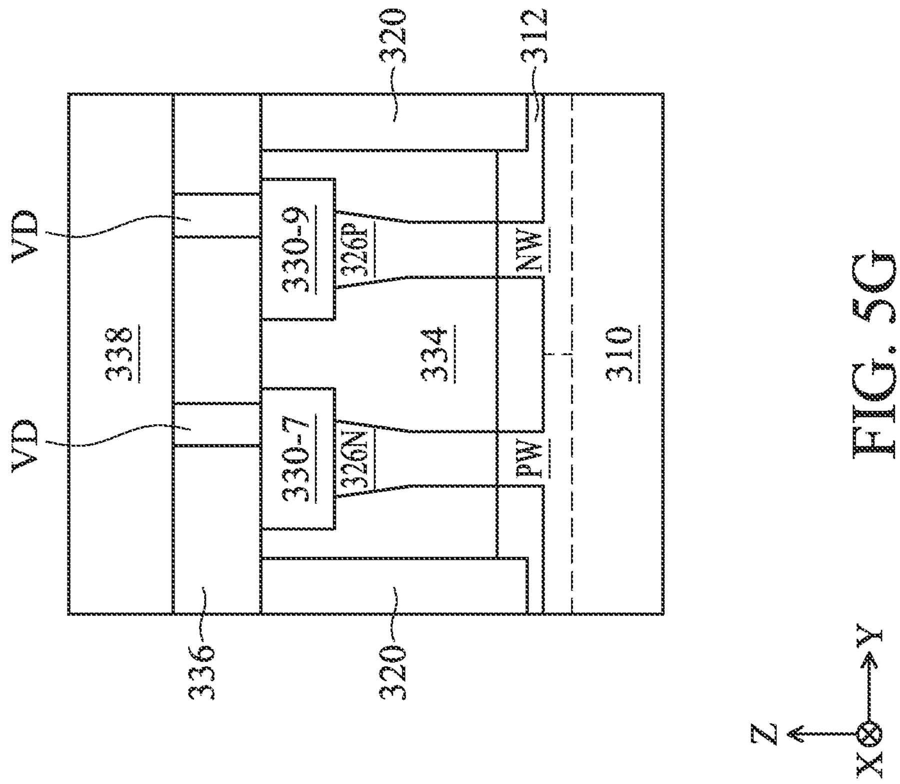
FIG. 5G illustrates a Y-Z cross-sectional view of the array of the circuit cells along a line G-G' of FIG. 5A, respectively, in accordance with some embodiments of the present disclosure.
Figure 5F:
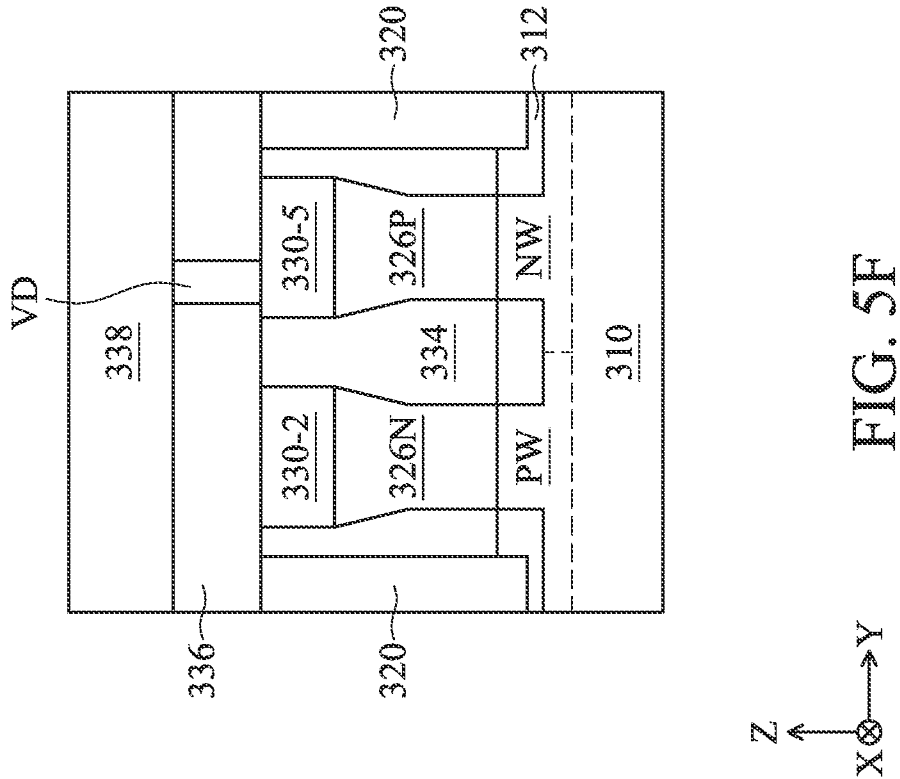
FIG. 5F illustrates a Y-Z cross-sectional view of the array of the circuit cells along a line F-F' of FIG. 5A, respectively, in accordance with some embodiments of the present disclosure.

FIG. 5A illustrates a top view (or a layout) of an array 300 of the circuit cells for different application in the logic region 20 of the IC chip 10, in accordance with some embodiments of the present disclosure. FIG. 5B illustrates an X-Z cross-sectional view of the array 300 of the circuit cells along a line B-B' of FIG. 5A, respectively, in accordance with some embodiments of the present disclosure. FIG. 5C illustrates an X-Z cross-sectional view of the array 300 of the circuit cells along a line C-C' of FIG. 5A, respectively, in accordance with some embodiments of the present disclosure. FIG. 5D illustrates a Y-Z cross-sectional view of the array 300 of the circuit cells along a line D-D' of FIG. 5A, respectively, in accordance with some embodiments of the present disclosure. FIG. 5E illustrates a Y-Z cross-sectional view of the array 300 of the circuit cells along a line E-E' of FIG. 5A, respectively, in accordance with some embodiments of the present disclosure. FIG. 5F illustrates a Y-Z cross-sectional view of the array 300 of the circuit cells along a line F-F' of FIG. 5A, respectively, in accordance with some embodiments of the present disclosure. FIG. 5G illustrates a Y-Z cross-sectional view of the array 300 of the circuit cells along a line G-G' of FIG. 5A, respectively, in accordance with some embodiments of the present disclosure.

The array 300 shown in FIGS. 5A to 5G include circuit cells, for example standard circuit cells (STD cells). As discussed above, the STD cells may include logic circuits or logic devices, including but not limited to logic circuits such as inverters, NANDs, NORs, flip-flops, or a combination thereof. In some embodiments, the array 300 shown in FIGS. 5A to 5G is a portion of the array 30 discussed above. For the sake of providing an example, the array 30 shows a circuit cell 302-1 (which includes a NAND) with a cell boundary MC1 and a circuit cell 302-2 (which includes an inverter) with a cell boundary MC2 in the same row of the array 300. It should be understood that the circuit cells 302-1 and 302-2 are merely examples. The present disclosure applies to other types of STD cells as well, for example cells including NORs, ANDs, ORs, flip-flops, or a combination thereof.

The circuit cell 302-1 serves as the circuit cells 102A discussed above, and the circuit cell 302-2 serves as the circuit cells 102B discussed above. For example, the circuit cell 302-1 may be the circuit cell 102A-1 shown in FIG. 3 with transistors having wider width and thicker thickness nanostructures (channel layers) for high speed application. The circuit cell 302-2 may be the circuit cell 102B-2 shown in FIG. 3 with transistors having narrower width and thinner thickness nanostructures (channel layers) for low power application. In some embodiments, the circuit cells 302-1 and 302-2 have the same cell pitch (lengths of the cell boundaries MC1 and MC2 in the Y-direction), as the cell pitch PH discussed in FIG. 3.

The array 300 includes active areas, such as active areas 304-1 to 304-4, (may be collectively referred to as the active areas 304) that extend lengthwise in the X-direction. Each of active areas 304 includes channel regions, source regions, and drain regions (where source regions and drain regions are collectively referred to as source/drain regions herein) of transistors (e.g., the GAA transistor 200) of the array 300. The active areas 304-3 and 304-4 are disposed over an N-type well (or N-Well) NW. The active areas 304-1 and 304-2 are disposed over a P-type well (or P-Well) PW that is adjacent to the N-type well NW in the Y-direction.

The array 300 further includes gate structures, such as gate structures 306-1 to 306-3 (may be collectively referred to as the gate structures 306). The gate structures 306-1 to 306-3 extend substantially parallel to one another, extend lengthwise in the Y-direction perpendicular to the X-direction, and are separated from each other in the X-direction, as shown in FIG. 5A. The gate structures 306-1 to 306-3 are disposed over the channel regions of the respective active areas 304-1 to 304-4 (i.e., the (vertically stacked) nanostructures) and disposed between respective source/drain regions of the active areas 304-1 to 304-4 (i.e., P-type source/drain features and/or N-type source/drain features, respectively). In some embodiments, gate structures 306-1 to 306-3 wrap and/or surround suspended, vertically stacked nanostructures 314 in the channel regions of the active areas 304-1 to 304-4, respectively (as shown in FIGS. 4D and 4E). More specifically, as shown in FIGS. 5A to 5G, each of the gate structures 306-1 to 306-3 wrap around the nanostructures 314 in the channel regions of two of the active areas 304-1 to 304-4. For example, the gate structure 306-1 wraps around the nanostructures 314 in the active area 304-1 over the P-type well PW and the nanostructures 314 in the active area 304-3 over the N-type well NW.

The active areas 304-1 to 304-4 and the gate structures 306-1 to 306-10 are configured to provide each of circuit cells 302-1 and 302-2 with transistors. In the circuit cell 302-1, the gate structure 306-1 engages the active area 304-1 to construct an N-type transistor NT1 similar to the N-type transistor N3 of the NAND 100B discussed above, the gate structure 306-1 engages the active area 304-3 to construct a P-type transistor PT1 similar to the P-type transistor P3 of the NAND 100B discussed above, the gate structure 306-2 engages the active area 304-1 to construct an N-type transistor NT2 similar to the N-type transistor N2 of the NAND 100B discussed above, and the gate structure 306-2 engages the active area 304-3 to construct a P-type transistor PT2 similar to the P-type transistor P2 of the NAND 100B discussed above.

In the circuit cell 302-2, the gate structure 306-3 engages the active area 304-2 to construct an N-type transistor NT3 similar to the N-type transistor N1 of the inverter 100A discussed above, and the gate structure 306-3 engages the active area 304-4 to construct a P-type transistor PT3 similar to the P-type transistor P1 of the inverter 100A discussed above.

Therefore, the transistors used for circuit cells 302-1 and 302-2 are formed. In some embodiments, the N-type transistors NT1 to NT3 of the circuit cells 302-1 and 302-2 are arranged in the X-direction, the P-type transistors PT1 to PT3 of the circuit cells 302-1 and 302-2 are arranged in the X-direction. Furthermore, each of the N-type transistors NT1 to NT3 is arranged with one of the P-type transistors PT1 to PT3 in the Y-direction and share one gate structure with that P-type transistor. For example, in the circuit cell 302-1, the N-type transistor NT1 and the P-type PT1 transistor are arranged in the Y-direction and share the gate structure 306-1, and the N-type transistor NT2 and the P-type transistor PT2 are arranged in the Y-direction and share the gate structure 306-2. In the circuit cell 302-2, the N-type transistor NT3 and the P-type PT3 transistor are arranged in the Y-direction and share the gate structure 306-3.

The array 300 further includes dielectric gate structures 308 for separating the circuit cells 302-1 and 302-2 from each other in the X-direction. The dielectric gate structures 308 extend lengthwise in the Y-direction. The dielectric gate structures 308 and the circuit cells 302-1 and 302-2 (or the gate structures 306-1 to 306-3) are arranged in the X-direction. More specifically, in the array 300, three dielectric gate structures 308 and the circuit cells 302-1 and 302-2 (or the gate structures 306-1 to 306-3) are arranged in the X-direction, and three dielectric gate structures 308 separate or isolate the circuit cells 302-1 and 302-2 from each other. It should be noted that the dielectric gate structures 308 also separate or electrically isolate the circuit cells 302-1 and 302-2 from other circuit cells in the same row of the array 300.

Referring to FIGS. 5B to 5G, the array 300 includes a substrate 310, over which the various features are formed, such as the gate structures 306 and dielectric gate structures 308 above. The substrate 310 may contains a semiconductor material, such as bulk silicon (Si). In some other embodiments, the substrate 310 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). Alternatively, the substrate 310 may be a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates may be fabricated using separation by implantation of oxygen (SIMOX), wafer bonding, and/or other suitable methods.

The N-type well NW and the P-type well PW are formed in or on the substrate 310, as shown in FIGS. 5B to 5G. In the present embodiment, the P-type well PW is P-type doped region configured for N-type transistors, and the N-type well NW is N-type doped region configured for P-type transistors. The N-type well NW is doped with N-type dopants, such as phosphorus, arsenic, other N-type dopant, or a combination thereof. The P-type well PW is doped with P-type dopants, such as boron, indium, other P-type dopant, or a combination thereof. In some implementations, the substrate 310 includes doped regions formed with a combination of P-type dopants and N-type dopants. The various N-type wells and/or P-type wells can be formed directly on and/or in the substrate 310, for example, providing a p-well structure, an n-well structure, a dual-well structure, a raised structure, or a combination thereof. An ion implantation process, a diffusion process, and/or other suitable doping process can be performed to form the various wells.

Similar to the isolation feature 216 discussed above, the array 300 further includes an isolation feature (or isolation structure) 312 over the substrate 310 and isolating the adjacent active areas 304. The isolation feature 312 may include silicon oxide, silicon nitride, silicon oxynitride, other suitable isolation material (for example, including silicon, oxygen, nitrogen, carbon, or other suitable isolation constituent), or a combination thereof. The isolation feature 312 may include different structures, such as shallow trench isolation (STI) structures, deep trench isolation (DTI) structures, and/or local oxidation of silicon (LOCOS) structures. In some embodiments, STI features include a multi-layer structure that fills the trenches, such as a silicon nitride comprising layer disposed over a thermal oxide comprising liner layer. In another example, STI features include a dielectric layer disposed over a doped liner layer (including, for example, boron silicate glass (BSG) or phosphosilicate glass (PSG)). In yet another example, STI features include a bulk dielectric layer disposed over a liner dielectric layer, where the bulk dielectric layer and the liner dielectric layer include materials depending on design requirements.

Each of the transistors (the N-type transistors NT1 to NT3 and the P-type transistors PT1 to PT3) in the circuit cells 302-1 and 302-2 includes nanostructures 314 similar to the nanostructures 204 discussed above. As shown in FIGS. 5B to 5E, the nanostructures 314 are suspended over the N-type well NW and the P-type well PW of the substrate 310. In some embodiments, three nanostructures 314 are vertically stacked (or vertically arranged) from each other in the Z-direction for each of the transistors (the N-type transistors NT1 to NT3 and the P-type transistors PT1 to PT3). However, there may be another appropriate number of nanostructures in one transistor. For example, there may be from 2 to 10 nanostructures 314 in one transistor. The nanostructures 314 further extend lengthwise in the X-direction (FIGS. 5B and 5C) and widthwise in the Y-direction (FIGS. 5D and 5E).

As discussed above, the circuit cell 302-1 includes the transistors (the N-type transistors NT1 and NT2 and the P-type transistors PT1 and PT2) having wider width and thicker thickness nanostructures 314 (channel layers) for high speed application, and the circuit cell 302-2 includes the transistors (the N-type transistor NT3 and the P-type transistor PT3) having narrower width and thinner thickness nanostructures 314 (channel layers) for low power application. In some embodiments, each of the nanostructures 314 of the N-type transistors NT1 and NT2 in the circuit cell 302-1 has a width W1 in the Y-direction and in a range from about 7 nm to about 100 nm, as shown in FIG. 5D. Each of the nanostructures 314 of the P-type transistors PT1 and PT2 in the circuit cell 302-1 has a width W2 in the Y-direction and in a range from about 7 nm to about 100 nm, as shown in FIG. 5D. Each of the nanostructures 314 of the N-type transistor NT3 in the circuit cell 302-2 has a width W3 in the Y-direction and in a range from about 5 nm to about 30 nm, as shown in FIG. 5E. Each of the nanostructures 314 of the P-type transistor PT3 in the circuit cell 302-2 has a width W4 in the Y-direction and in a range from about 5 nm to about 30 nm, as shown in FIG. 5E.

In some embodiments, the width W1 and the width W2 are respectively greater than the width W3 and the width W4, as shown in FIGS. 5D and 5E. In some embodiments, the width W1 and the width W2 are the same and the width W3 and the width W4 are the same. The ratio of the width W1 to the width W3 (W1/W3) is in a range from about 1.3 to about 10, and the ratio of the width W2 to the width W4 (W2/W4) is in a range from about 1.3 to about 10.

In some embodiments, each of the nanostructures 314 of the N-type transistors NT1 and NT2 in the circuit cell 302-1 has a thickness T1 in the Z-direction and in a range from about 3.5 nm to about 8 nm, as shown in FIG. 5D. Each of the nanostructures 314 of the P-type transistors PT1 and PT2 in the circuit cell 302-1 has a thickness T2 in the Z-direction and in a range from about 3.5 nm to about 8 nm, as shown in FIG. 5D. Each of the nanostructures 314 of the N-type transistor NT3 in the circuit cell 302-2 has a thickness T3 in the Z-direction and in a range from about 3 nm to about 7 nm, as shown in FIG. 5E. Each of the nanostructures 314 of the P-type transistor PT3 in the circuit cell 302-2 has a thickness T4 in the Z-direction and in a range from about 3 nm to about 7 nm, as shown in FIG. 5E.

In some embodiments, the thickness T1 and the thickness T2 are respectively greater than the thickness T3 and the thickness T4, as shown in FIGS. 5D and 5E. In some embodiments, the thickness T1 and the thickness T2 are the same and the thickness T3 and the thickness T4 are the same. The ratio of the thickness T1 to the thickness T3 (T1/T3) is in a range from about 1.05 to about 1.3, and the ratio of the thickness T2 to the thickness T4 (T2/T4) is in a range from about 1.05 to about 1.3.

As shown in FIGS. 5D and 5E, in each of the transistors in the circuit cells 302-1 to 302-6, three nanostructures 314 are spaced apart from each other in the Z-direction. In some embodiments, the nanostructures 314 of the N-type transistors NT1 and NT2 in the circuit cell 302-1 are spaced apart from each other by a distance S1 in the Z-direction and in a range from about 4 nm to about 14 nm, as shown in FIG. 5D. The nanostructures 314 of the P-type transistors PT1 and PT2 in the circuit cell 302-1 are spaced apart from each other by a distance S2 in the Z-direction and in a range from about 4 nm to about 14 nm, as shown in FIG. 5D. The nanostructures 314 of the N-type transistor NT3 in the circuit cell 302-2 are spaced apart from each other by a distance S3 in the Z-direction and in a range from about 4.5 nm to about 15 nm, as shown in FIG. 5E. The nanostructures 314 of the P-type transistor PT3 in the circuit cell 302-2 are spaced apart from each other by a distance S4 in the Z-direction and in a range from about 4.5 nm to about 15 nm, as shown in FIG. 5E. In some embodiments, the distance S1 and the distance S2 are respectively less than the distance S3 and the distance S4, as shown in FIGS. 5D and 5E. In some embodiments, the distance S1 and the distance S2 are the same and the distance S3 and the distance S4 are the same.

As shown in FIGS. 5D and 5E, in each of the transistors in the circuit cells 302-1 to 302-6, the nanostructures 314 have vertically a pitch P (one nanostructure thickness (one of the nanostructure thicknesses T1 to T4)+one nanostructure space (one of the distances S1 to S4)) in the Z-direction and in a range from about 8 nm to about 20 nm. In some embodiments, the nanostructures 314 of the N-type transistors NT1 and NT2 in the circuit cell 302-1 have vertically a pitch P1 in the Z-direction and in a range from about 8 nm to about 20 nm, as shown in FIG. 5D. The nanostructures 314 of the P-type transistors PT1 and PT2 in the circuit cell 302-1 have vertically a pitch P2 in the Z-direction and in a range from about 8 nm to about 20 nm, as shown in FIG. 5D. The nanostructures 314 of the N-type transistor NT3 in the circuit cell 302-2 have vertically a pitch P3 in the Z-direction and in a range from about 8 nm to about 20 nm, as shown in FIG. 5E. The nanostructures 314 of the P-type transistor PT3 in the circuit cell 302-2 have vertically a pitch P4 in the Z-direction and in a range from about 8 nm to about 20 nm, as shown in FIG. 5E. In some embodiments, the pitches P1 to P4 are the same.

Furthermore, each of the nanostructures 314 in the circuit cell 302-2 has a dumbbell-shape in the X-Z cross-sectional view, and each of the nanostructures 314 in the circuit cell 302-1 has a rectangular shape, as shown in FIGS. 5B and 5C. More specifically, in the X-Z cross-sectional view, each of the nanostructures 314 in the circuit cell 302-2 has a middle portion and side portions on opposite sides of the middle portion in the X-direction. The middle portion is wrapped around by the gate structure 306 and the side portions are vertically between inner spacers 324 (discussed below). The middle portion has the thickness T3 or T4, but the side portions has the thickness T1 or T2 as the nanostructures 314 in the circuit cell 302-1. Therefore, in each of the nanostructures 314 in the circuit cell 302-2, the thickness of the side portions is greater than the thickness of the middle portion, as shown in FIGS. 5B and 5C.

As such, the nanostructures 314 of the N-type transistor NT3 and P-type transistor PT3 in the circuit cell 302-2 has narrower width and thinner thickness than the nanostructures 314 of the N-type transistors NT1 and NT2 and P-type transistors PT1 and PT2 in the circuit cell 302-1. The transistors having narrower width and thinner thickness nanostructures 314 in the circuit cell 302-2 may have stronger gate control to nanostructures 314, such that the drain induced barrier lowering (DIBL) effect and swing effect are reduced. Therefore, the circuit cell 302-2 is used for low power application. If the width and thickness of the nanostructures 314 in the circuit cell 302-2 are too small (the widths W3 and W4 are less than about 5 nm and/or the thicknesses T3 and T4 are less than about 3 nm), the performance of the transistors in the circuit cell 302-2 may be affected. If the width and thickness of the nanostructures 314 in the circuit cell 302-2 are too large (the widths W3 and W4 are greater than about 30 nm and/or the thicknesses T3 and T4 are greater than about 7 nm), the DIBL effect and swing effect cannot be significantly reduced. The transistors having wider width and thicker thickness nanostructures 314 in the circuit cell 302-1 may have larger electron transport speed. Therefore, the circuit cell 302-1 is used for high speed application.

Furthermore, N-type transistors are preferred to have thinner thickness nanostructures 314 for short channel improvement and also no impact ion performance (electron mobility is not sensitive to sheet thickness), and P-type transistors are preferred to have thicker thickness nanostructures 314 to have best performance (due to hole mobility is more sensitive to sheet thickness). As such, in some embodiments, the thickness T2 of the nanostructures 314 in the circuit cell 302-1 and the thickness T4 of the nanostructures 314 in the circuit cell 302-2 are respectively greater than the thickness T1 of the nanostructures 314 in the circuit cell 302-1 and the thickness T3 of the nanostructures 314 in the circuit cell 302-2. In some embodiments, the ratio of the thickness T2 to the thickness T1 (T2/T1) is in a range from about 1.05 to about 1.3, and the ratio of the thickness T4 to the thickness T3 (T4/T3) is in a range from about 1.05 to about 1.3.

The nanostructures 314 may include a semiconductor material, such as silicon, germanium, silicon carbide, silicon phosphide, gallium arsenide, gallium phosphide, indium phosphide, indium arsenide, and/or indium antimonide, silicon germanium (SiGe), SiPC, GaAsP, AlInAs, AlGaAs, GaInAs, GaInP, and/or GaInAsP. In some embodiments, the nanostructures 314 include silicon for N-type transistors. In other embodiments, the nanostructures 314 include silicon germanium for P-type transistors. In some embodiments, the nanostructures 314 are all made of silicon, and the type of the transistors depend on work function metal layer wrapping around the nanostructures 314. In some embodiments, the nanostructures 314 are epitaxially grown using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer deposition (ALD), ultrahigh vacuum CVD (UHVCVD), reduced pressure CVD (RPCVD), a combination thereof, or the like, may also be utilized.

As discussed above, the gate structures 306-1 to 306-3 engage the active areas to construct the transistors. More specifically, the gate structures 306-1 to 306-3 wrap around the nanostructures 314 in the channel regions of the active areas 304-1 to 304-4. Each of the gate structures 306-1 to 306-3 has a gate dielectric layer 316 and a gate electrode layer 318. The gate dielectric layers 316 wrap around each of the nanostructures 314 and the gate electrode layers 318 wrap around the gate dielectric layer 316. In some embodiments, a thickness of the gate dielectric layers 316 is in a range from about 1 nm to about 3 nm. In some embodiments, each of the gate structures 306 further includes an interfacial layer (such as having silicon dioxide, silicon oxynitride, or other suitable materials) between the gate dielectric layer 316 and the nanostructures 314. The gate dielectric layers 316 may include oxide with nitrogen doped dielectric material (initial layer) combined with metal content high-K dielectric material (K value (dielectric constant)>13). For example, gate dielectric layers 316 may include hafnium oxide ($HfO_2$), which has a dielectric constant in a range from about 18 to about 40. Alternatively, the gate dielectric layers 316 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The gate dielectric layers 316 may be formed by chemical oxidation, thermal oxidation, ALD, CVD, and/or other suitable methods.

The gate electrode layer 318 is formed to wrap around the gate dielectric layer 316 and the center portions of the nanostructures 314, as shown in FIGS. 5B and 5C. In some embodiments, the gate electrode layer 318 may include an N-type work function metal layer 318N for N-type transistor (e.g., N-type transistors NT1 to NT3) or a P-type work function metal layer 318P for P-type transistor (e.g., P-type transistors PT1 to PT3) wrapping around the nanostructures 314. The N-type work function metal layer 318N and the P-type work function metal layer 318P may be selected from a group consisting of TiN, TaN, TiAl, TiAlN, TaAl, TaAlN, TaAlC, TaCN, Al, Cu, Co, Ni, Pt, W, or a combination thereof, in accordance with some embodiments. The material of the N-type work function metal layer 318N and the P-type work function metal layer 318P may be the same. In some embodiments, the material of the N-type work function metal layer 318N and the P-type work function metal layer 318P are different.

In some embodiments, the N-type work function metal layer 318N is a material such as Ti, Al, Ag, Mn, Zr, TiAl, TiAlC, TaC, TaCN, TaSiN, TaAl, TaAlC, TiAlN, other suitable N-type work function materials, or combinations thereof. For example, the N-type work function metal layer may be deposited utilizing ALD, CVD, or the like. However, any suitable materials and processes may be utilized to form the N-type work function metal layer 318N. In some embodiments, the P-type work function metal layer 318P is a material such as TIN, TaN, Ru, Mo, Al, WN, $ZrSi_2$, $MoSi_2$, $TaSi_2$, $NiSi_2$, other metal oxides, metal nitrides, metal silicates, transition metal-oxides, transition metal-nitrides, transition metal-silicates, oxynitrides of metals, metal aluminates, zirconium silicate, zirconium aluminate, other suitable P-type work function materials, combinations of these, or the like. Additionally, the P-type work function metal layer 318P may be deposited using a deposition process such as ALD, CVD, or the like, although any suitable deposition process may be used.

In some embodiments, the gate electrode layer 318 may include a single layer or alternatively a multi-layer structure. In some embodiments, the gate electrode layer 318 may further include a capping layer, a barrier layer, and a fill material (not shown). The capping layer may be formed adjacent to the gate dielectric layers 316 and may be formed from a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as ALD, CVD, or the like, although any suitable deposition process may be used. The barrier layer may be formed adjacent the capping layer, and may be formed of a different material than the capping layer. For example, the barrier layer may be formed of a material such as one or more layers of a metallic material such as TiN, TaN, Ti, TiAlN, TiAl, Pt, TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as atomic layer deposition, chemical vapor deposition, or the like, although any suitable deposition process may be used.

As discussed above, the dielectric gate structures 308 extend lengthwise in the Y-direction (e.g., parallel to the gate structures 306) to separate the circuit cells 302-1 and 302-2 from each other, as show in FIGS. 5A, 5B, and 5C. Unlike the gate structures 306, however, the dielectric gate structures 308 are not functional gate structures (e.g., do not contain the gate dielectric layer 316 and the gate electrode layer 318). Instead, the dielectric gate structures 308 may be made of electrically insulating materials (e.g., dielectric materials) to provide electrical isolation between various circuit cells. In some embodiments, the dielectric gate structures 308 may be single dielectric layer or multiple layers and selected from a group consisting of $SiO_2$, SiOC, SiON, SiOCN, carbon content oxide, nitrogen content oxide, carbon and nitrogen content oxide, metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), multiple metal content oxide, or a combination thereof.

As discussed above, the dielectric gate structures 308 and the gate structures 306 are arranged in the X-direction. In the same row of the array 300, a gate pitch of the gate structures 306 and a gate pitch of one gate structure 306 to one dielectric gate structure 308 are substantially the same. Furthermore, a gate length of the gate structures 306 in the X-direction and a gate length of the dielectric gate structures 308 in the X-direction are the same.

The array 300 further includes gate end dielectric structures 320 are at ends of the gate structures 306 and the dielectric gate structures 308. More specifically, the gate end dielectric structures 320 are on opposite sides of the gate structures 306 and the dielectric gate structures 308 in the Y-direction, as shown in FIGS. 5A, and 5D to 5G. Although not shown in FIG. 5A, in some embodiments, the gate end dielectric structures 320 also separate the gate structures 306 and/or the dielectric gate structures 308 from gate structures and/or dielectric gate structures of other circuit cells (not shown) in other rows of the array 300. Furthermore, the gate end dielectric structures 320 extend vertically into the isolation feature 312, as shown in FIGS. 5D to 5G. Therefore, the isolation feature 312 are in contact with sidewalls and bottom surfaces of the gate end dielectric structures 320. The material of the gate end dielectric structures 320 is selected from a group consisting of $Si_3N_4$, SiON, SiOC, SiOCN, metal content dielectric, high K material (K>=9), or a combination thereof.

The array 300 further includes gate spacers 322 similar to gate spacers 212 discussed above. More specifically, the gate spacers 322 are on sidewalls (or opposite sides) of the gate structures 306 and the dielectric gate structures 308 in the X-direction, and over the nanostructures 314 in the Z-direction, as shown in FIGS. 5B and 5C. The gate spacers 322 are over the nanostructures 314 and on top sidewalls of the gate structures 322 and the dielectric gate structures 308, and thus are also referred to as gate top spacers or top spacers. The gate spacers 322 may include multiple dielectric materials and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, air gap, or a combination thereof. In some embodiments, the gate spacers 322 may include a single layer or a multi-layer structure.

As shown in FIGS. 5B and 5C, the array 300 further includes inner spacers 324 on the sidewalls (or opposite sides) of the gate structures 306 and the dielectric gate structures 308 in the X-direction, and below the topmost nanostructures 314 in the Z-direction. Furthermore, the inner spacers 324 are laterally between the source/drain features 326N (or 326P) and the gate structures 306 and between the source/drain features 326N (or 326P) and the dielectric gate structures 308. The inner spacers 324 are also vertically between adjacent nanostructures 314 and between bottommost nanostructures 314 and the substrate 310. The inner spacers 324 may include a dielectric material having higher K value (dielectric constant) than the gate spacers 322 and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), air gap, or a combination thereof. In some embodiments, the thickness of the gate spacers 322 in the X-direction and the thickness of the inner spacers 324 in the X-direction are the same. In other embodiments, the thickness of the gate spacers 322 in the X-direction is less than the thickness of the inner spacers 324 in the X-direction due to the gate spacers 322 are trimmed during sequent processes for forming source/drain contacts.

Referring to FIGS. 5B, 5C, 5F, and 5G, the array 300 further includes source/drain features 326N and source/drain features 326P over the substrate 310 and in the source/drain regions of the active areas 304. More specifically, the source/drain features 326N and the source/drain features 326P are respectively disposed between the two respective gate structures 306 or one respective gate structure 306 and one respective dielectric gate structure 308. As shown in FIGS. 5B and 5C, the source/drain features 326N are disposed on opposite sides of the respective gate structure 306 in the X-direction to form N-type transistor (e.g., the N-type transistors NT1 to NT3). Similarly, the source/drain features 326P are disposed on opposite sides of the respective gate structure 306 in the X-direction to form P-type transistor (e.g., the P-type transistors PT1 to PT3).

Since the nanostructures 314 in the circuit cell 302-2 are narrower and thinner than the nanostructures 314 in the circuit cell 302-1, the source/drain features 326N/326P in the circuit cell 302-2 are smaller than the source/drain features 326N/326P in the circuit cell 302-1. More specifically, as shown in FIGS. 5F and 5G, a length of the source/drain features 326N/326P in the circuit cell 302-1 in the Y-direction is greater than a length of the source/drain features 326N/326P in the circuit cell 302-2 in the Y-direction, in accordance with some embodiments.

Similar to the source/drain features 214 discussed above, the nanostructures 314 extend in the X-direction to connect one source/drain feature 326N/326P to the other source/drain feature 326N/326P. More specifically, the source/drain features 326N and the source/drain features 326P are also disposed on opposite sides of the respective nanostructures 314 in the X-direction. Therefore, the source/drain features 326N and the source/drain features 326P are attached and electrically connected to the nanostructures 314 in the X-direction. Furthermore, every two adjacent transistors in the X-direction share one source/drain feature 326N/326P, as shown in FIGS. 5B and 5C. The source/drain features 326N/326P may also be referred to as source/drain, or source/drain regions. In some embodiments, source/drain feature(s) may refer to a source or a drain, individually or collectively dependent upon the context.

The source/drain features 326N and 326P may be formed by using epitaxial growth. In some embodiments, the source/drain features 326N may include epitaxially-grown material selected from a group consisting of SiP, SiC, SiPC, SiAs, Si, or a combination thereof. In some embodiments, the epitaxially-grown material of the source/drain features 326N may be doped with N-type dopants (such as phosphorus, arsenic, other N-type dopant, or a combination thereof) having a doping concentration in a range from about $2\times10^{19}/cm^3$ to $8\times10^{21}/cm^3$. In some embodiments, the source/drain features 326N for N-type transistors may be respectively referred to as N-type features and N-type source/drain features.

In some embodiments, the source/drain features 326P may include epitaxially-grown material selected from a group consisting of boron-doped SiGe, boron-doped SiGeC, boron-doped Ge, boron-doped Si, boron and carbon doped SiGe, or a combination thereof. In some embodiments, the epitaxially-grown material of the source/drain features 326P may be doped with P-type dopants (such as boron, indium, other P-type dopant, or a combination thereof) having a doping concentration in a range from about $1\times10^{19}/cm^3$ to $3\times10^{21}/cm^3$. In some embodiments, the source/drain features 326P for P-type transistors may be respectively referred to as P-type source/drain features.

Still referring to FIGS. 4C, 4D, and 4F, the array 300 further includes silicide features 328 over and in contact with the source/drain features 326N and 326P. In some embodiment, the silicide feature 328 is between the adjacent two gate structures 306 in the X-direction. The silicide features 328 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. In some embodiments, the silicide features 328 over the source/drain features 326N and the silicide features 328 over the source/drain features 326P have different material. For example, the silicide features 328 over the source/drain features 326N include TiSi and the silicide features 328 over the source/drain features 326P include silicide material selected from a group consist of PtSi, NiSi, CoSi, or MoSi.

Referring to FIGS. 5A, 5B, 5C, 5F, and 5G, the array 300 further includes source/drain contacts 330-1 to 330-6 for circuit cell 302-1 and source/drain contacts 330-7 to 330-10 for circuit cell 302-2 (may be collectively referred to as the source/drain contacts 330), over and in contact with the silicide features 328, and over and electrically connected to the silicide features 328 and the source/drain features 326N and 326P. The source/drain contacts 330 extend lengthwise the Y-direction. The source/drain contacts 330 are self-aligned source/drain contacts. This means that the source/drain contacts 330 are formed by using the gate spacers 322 as masks. Therefore, the source/drain contacts 330 are in direct contact with the gate spacers 322, as shown in FIGS. 5B and 5C. In some embodiments, the gate spacers 322 are trimmed due to the gate spacers 322 serving as the mask for forming the source/drain contacts 330. Therefore, the thickness of the gate spacers 322 in the X-direction is less than the thickness of the inner spacers 324 in the X-direction, as discussed above. In the top view, as shown in FIGS. 5A, the source/drain contacts 330-1, 330-4, and 330-6 overlap the cell boundary MC1, and the source/drain contacts 330-8 and 330-10 overlap the cell boundary MC2, in accordance with some embodiments.

As shown in FIG. 5A, in the top view, the source/drain contact 330-1 is adjacent to the gate structure 306-1 (or is adjacent to the N-type transistor NT1) in the X-direction; the source/drain contact 330-2 is between the gate structures 306-1 and 306-2 (or between the N-type transistors NT1 and NT2) in the X-direction; the source/drain contact 330-3 is adjacent to the gate structure 306-2 (or is adjacent to the N-type transistor NT2) in the X-direction; the source/drain contact 330-4 is adjacent to the gate structure 306-1 (or is adjacent to the P-type transistor PT1) in the X-direction; the source/drain contact 330-5 is between the gate structures 306-1 and 306-2 (or between the P-type transistors PT1 and PT2) in the X-direction; the source/drain contact 330-6 is adjacent to the gate structure 306-2 (or is adjacent to the P-type transistor PT2) in the X-direction; the source/drain contact 330-7 is adjacent to the gate structure 306-3 (or is adjacent to the N-type transistor NT3) in the X-direction; the source/drain contact 330-8 is adjacent to the gate structure 306-3 (or is adjacent to the N-type transistor NT3) in the X-direction; and the source/drain contact 330-9 is adjacent to the gate structure 306-3 (or is adjacent to the P-type transistor PT3) in the X-direction; and the source/drain contact 330-10 is adjacent to the gate structure 306-3 (or is adjacent to the P-type transistor PT3) in the X-direction. In some aspects, the source/drain contacts 330-1, 330-3, 330-4, 330-6, 330-7, 330-8, 330-9, and 330-10 each is between one dielectric gate structure 308 and one gate structure 306.

As discussed above, each of the source/drain contacts 330 is over and electrically connected to the respective source/drain features 326N/326P. Specifically, as shown in FIGS. 5A, 5B, 5C, 5F, and 5G, the source/drain contact 330-1 is over and electrically connected to the source/drain feature 326N of the N-type transistor NT1; the source/drain contact 330-2 is over and electrically connected to the source/drain feature 326N shared by the N-type transistors NT1 and NT2; the source/drain contact 330-3 is over and electrically connected to the source/drain feature 326N of the N-type transistor NT2; the source/drain contact 330-4 is over and electrically connected to the source/drain feature 326P of the P-type transistor PT1; the source/drain contact 330-5 is over and electrically connected to the source/drain feature 326P shared by the P-type transistors PT1 and PT2; the source/drain contact 330-6 is over and electrically connected to the source/drain feature 326P of the P-type transistor PT2; the source/drain contact 330-7 is over and electrically connected to the source/drain feature 326N of the N-type transistor NT3; the source/drain contact 330-8 is over and electrically connected to the source/drain feature 326N of the N-type transistor NT3; the source/drain contact 330-9 is over and electrically connected to the source/drain feature 326P of the P-type transistor PT3; and the source/drain contact 330-10 is over and electrically connected to the source/drain feature 326P of the P-type transistor PT3.

In some embodiments, some of the source/drain contacts are over and in contact with the gate end dielectric structures 320. For example, as shown in FIGS. 5A, the source/drain contact 330-1, 330-4, 330-6, 330-8, 330-10 are over in contact with the gate end dielectric structures 320. In some embodiments, the source/drain contacts 330-1, 330-4, 330-6, 330-8, 330-10 extend in the Y-direction to overlap the cell boundaries (e.g., the cell boundaries MC1 and MC2 discussed above) of the circuit cells in a top view, as shown in FIG. 5A. As shown in FIGS. 5B and 5C, top surfaces of the source/drain contacts 330 are substantially level with top surfaces of the gate structures 306. The top surfaces of the source/drain contacts 330 are planar. In other words, each of the source/drain contacts 330 has a planar top surface that is level with top surfaces of the gate structure 306.

The source/drain contacts 330 may each include a conductive material such as Al, Cu, W, Co, Ti, Ta, Ru, Rh, Ir, Pt, Mo, TiN, TiAl, TiAlN, TaN, TaC, combinations of these, or the like, although any suitable material may be deposited using a deposition process such as sputtering, CVD, electroplating, electroless plating, or the like. In some embodiments, the source/drain contacts 330 may each include single conductive material layer or multiple conductive layers.

Referring to FIGS. 5B to 5E, the array 300 further includes a cap layer 332, an inter-layer dielectric (ILD) layer 334, an ILD layer 336, and an inter-metal dielectric (IMD) layer 338. The cap layer 332 is over the gate structures 306 for protecting the gate structures 306. In some embodiments, the cap layer 332 includes silicon nitride ($Si_3N_4$). The ILD layer 334 is over the substrate 310, the isolation feature 312, between the source/drain features 326N/326P, and between the source/drain contacts 330. The ILD layer 336 is over the substrate 310, the isolation feature 312, the gate structures 306, the dielectric gate structure 308, the source/drain contacts 330, and the cap layer 332. The IMD layer 338 is over the ILD layer 334, the ILD layer 336, the gate structures 306, the dielectric gate structure 308, the source/drain contacts 330, and the cap layer 332.

The ILD layer 334, the ILD layer 336 and the IMD layer 338 include a dielectric material including, for example, silicon oxide, silicon nitride, silicon oxynitride, TEOS-formed oxide, PSG, BPSG, low-k dielectric material, other suitable dielectric material, or a combination thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SiLK (Dow Chemical, Midland, Michigan), polyimide, other low-k dielectric material, or a combination thereof. In some embodiments, the ILD layer 334, the ILD layer 336 and the IMD layer 338 are a dielectric layer that includes a low-k dielectric material (generally referred to as a low-k dielectric layer). The ILD layer 334, the ILD layer 336 and the IMD layer 338 may include a multilayer structure having multiple dielectric materials.

Referring to FIGS. 5B to 5G, the array 300 further includes gate vias VG and vias VD. The gate vias VG and the vias VD are disposed in the ILD layer. The gate vias VG are over and in contact with the gate structures 306 and electrically connect the gate structures 306. The vias VD are over and in contact with the source/drain contacts 330 and electrically connect the source/drain contacts 330. Furthermore, the top surfaces of the source/drain contacts 330 are substantially level with bottom surfaces of the gate vias VG. As such, there is no contact-to-via parasitic capacitance between the source/drain contacts 330 and the gate vias VG in the X-direction, thereby improving the performance of the array 300.

The materials of the gate vias VG and the vias VD are selected from a group consisting of titanium (Ti), titanium nitride (TiN), tantalum (Ta), tantalum nitride (TaN), titanium aluminum nitride (TiAlN), tungsten nitride (WN), tungsten (W), cobalt (Co), molybdenum (Mo), ruthenium (Ru), platinum (Pt), aluminum (Al), copper (Cu), other conductive materials, or a combination thereof.

Although not shown in FIGS. 5A to 5G, the array 300 may further includes metal layers in the IMD layer 338 to construct connections of the transistors in the circuit cells 302-1 and 302-2 through the gate vias VG and the vias VD. More specifically, the metal layers are respectively connected to respective gate structures 306 and respective source/drain contacts 330 through respective gate vias VG and vias VD. In some embodiments, the gate vias VG, vias VD, and metal layers are used to construct connections of the transistors in the circuit cells 302-1 and 302-2.

Figure 6:
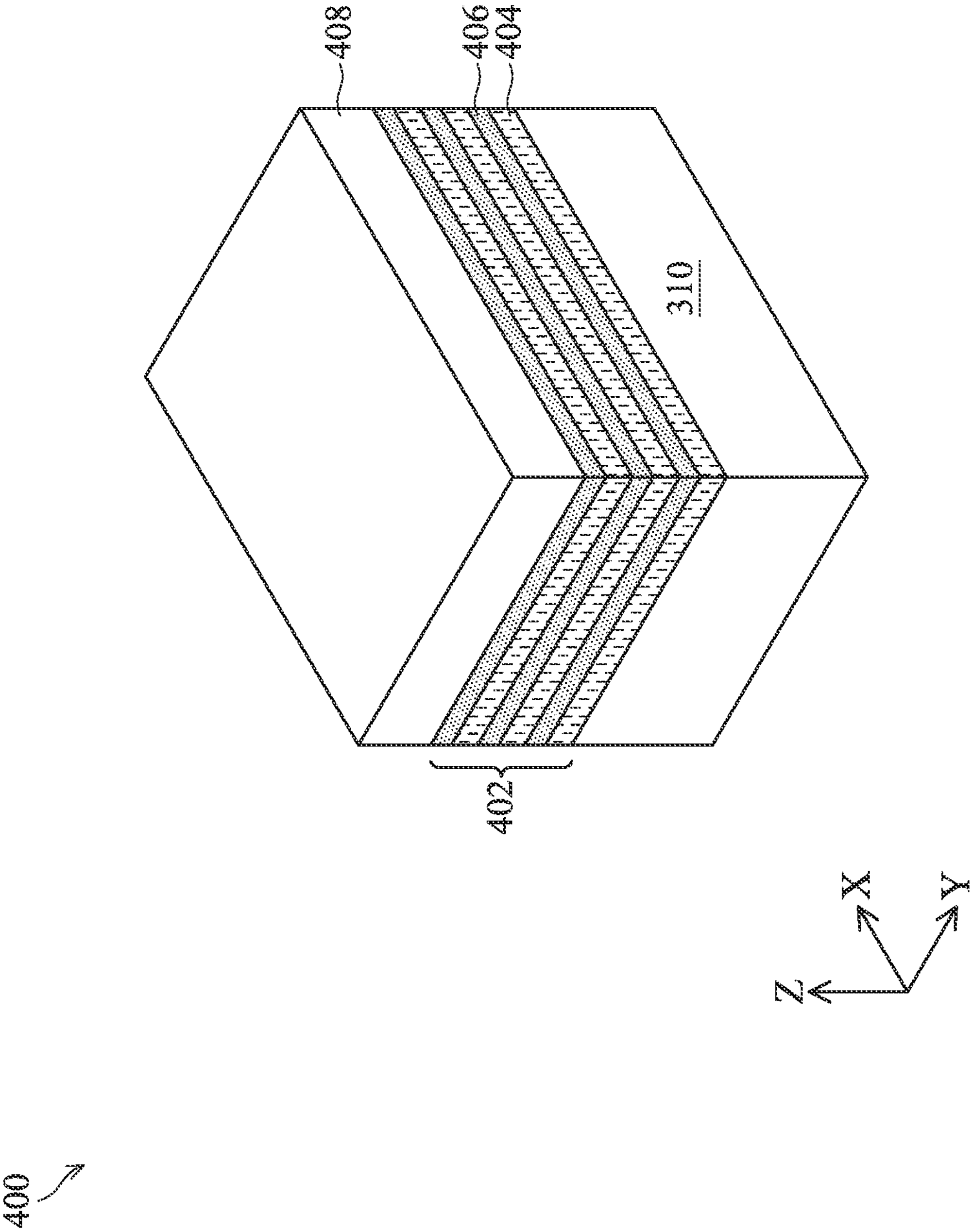
FIG. 6 is a perspective view of a workpiece at a fabrication stage for the array of the circuit cells, in accordance with some embodiments of the present disclosure.

FIG. 6 is a perspective view of a workpiece 400 at a fabrication stage for the array 300 of the circuit cells 302-1 and 302-2, in accordance with some embodiments of the present disclosure. FIGS. 7A to 14A illustrate top views (or layouts) of the workpiece 400 at various fabrication stages for the array 300 of the circuit cells 302-1 and 302-2, in accordance with some embodiments of the present disclosure. FIGS. 7B to 14B illustrate X-Z cross-sectional views of the workpiece 400 at various fabrication stage along lines B-B' of FIGS. 7A to 14A, respectively, in accordance with some embodiments of the present disclosure. FIGS. 7C to 14C illustrate X-Z cross-sectional views of the workpiece 400 at various fabrication stage along lines C-C' of FIGS. 7A to 14A, respectively, in accordance with some embodiments of the present disclosure. FIGS. 7D to 14D illustrate Y-Z cross-sectional views of the workpiece 400 at various fabrication stage along lines D-D' of FIGS. 7A to 14A, respectively, in accordance with some embodiments of the present disclosure. FIGS. 7E to 14E illustrate Y-Z cross-sectional views of the workpiece 400 at various fabrication stage along lines E-E' of FIGS. 7A to 14A, respectively, in accordance with some embodiments of the present disclosure. FIGS. 7F to 14F illustrate Y-Z cross-sectional views of the workpiece 400 at various fabrication stage along lines F-F' of FIGS. 7A to 14A, respectively, in accordance with some embodiments of the present disclosure. FIGS. 7G to 14G illustrate Y-Z cross-sectional views of the workpiece 400 at various fabrication stage along lines G-G' of FIGS. 7A to 14A, respectively, in accordance with some embodiments of the present disclosure.

Referring to FIG. 6, a stack 402 is formed over the substrate 310. In some embodiments, the substrate 310 may include one or more well regions, such as n-type well regions (e.g., the n-type well NW discussed above) doped with an n-type dopant (i.e., phosphorus (P) or arsenic (As)) or p-type well regions (e.g., the p-type well PW discussed above) doped with a p-type dopant (i.e., boron (B)), for forming different types of devices. The doping the n-type wells and the p-type wells may be formed using ion implantation or thermal diffusion.

The stack 402 includes semiconductor layers 404 and 406, and the semiconductor layers 404 and 406 are alternatingly stacked in the Z-direction. The semiconductor layers 404 and the semiconductor layers 406 may have different semiconductor compositions. In some embodiments, semiconductor layers 404 are formed of silicon germanium (SiGe) and the semiconductor layers 406 are formed of silicon (Si). In these embodiments, the additional germanium content in the semiconductor layers 404 allow selective removal or recess of the semiconductor layers 404 without substantial damages to the semiconductor layers 406, so that the semiconductor layers 404 are also referred to as sacrificial layers. In some embodiments, the semiconductor layers 404 and 406 are epitaxially grown over (on) the substrate 302 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer deposition (ALD), ultrahigh vacuum CVD (UHVCVD), reduced pressure CVD (RPCVD), a combination thereof, or the like, may also be utilized. The semiconductor layers 404 and the semiconductor layers 406 are deposited alternatingly, one-after-another, to form the stack 402.

Figure 8A:
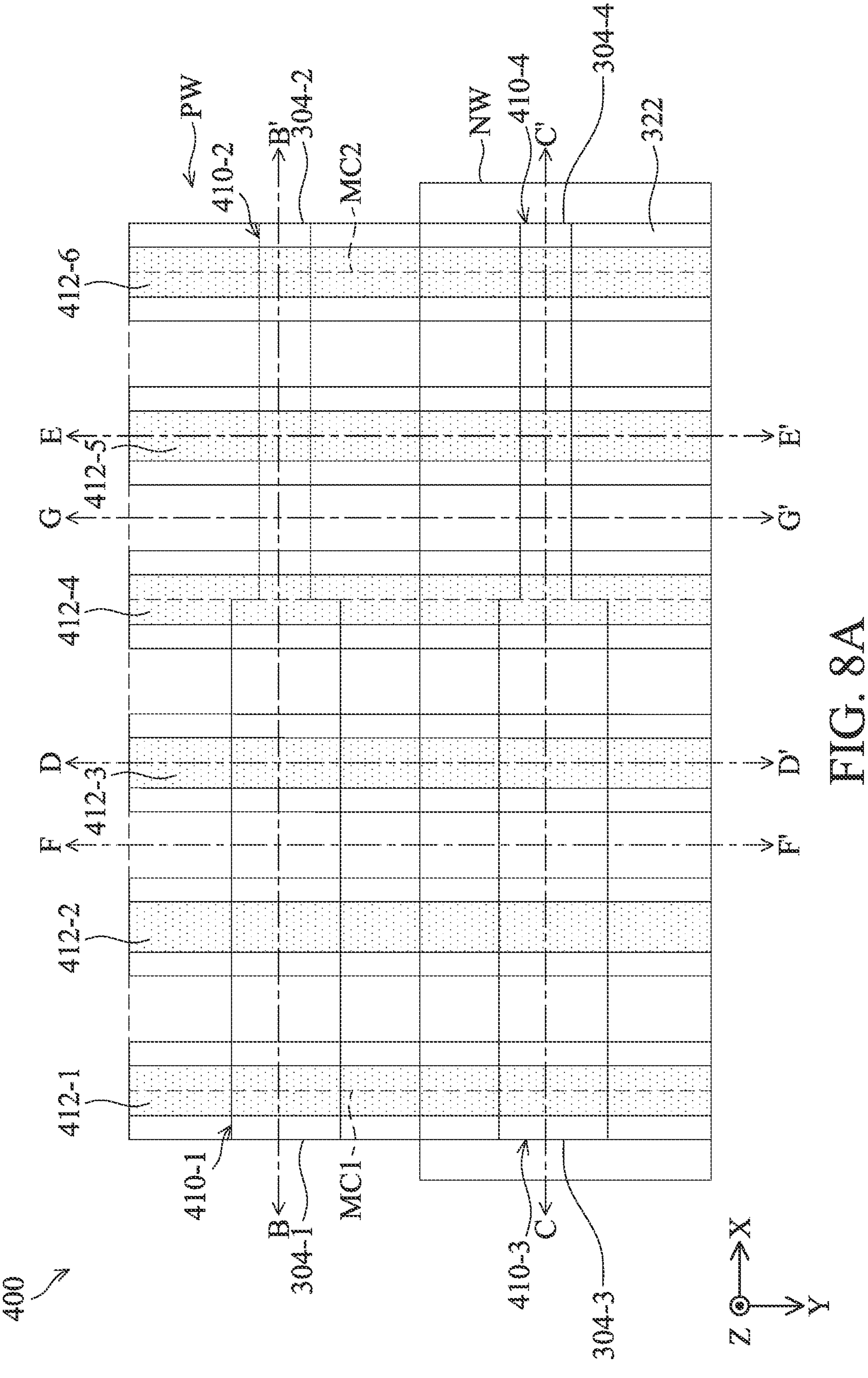
Figure 8B:
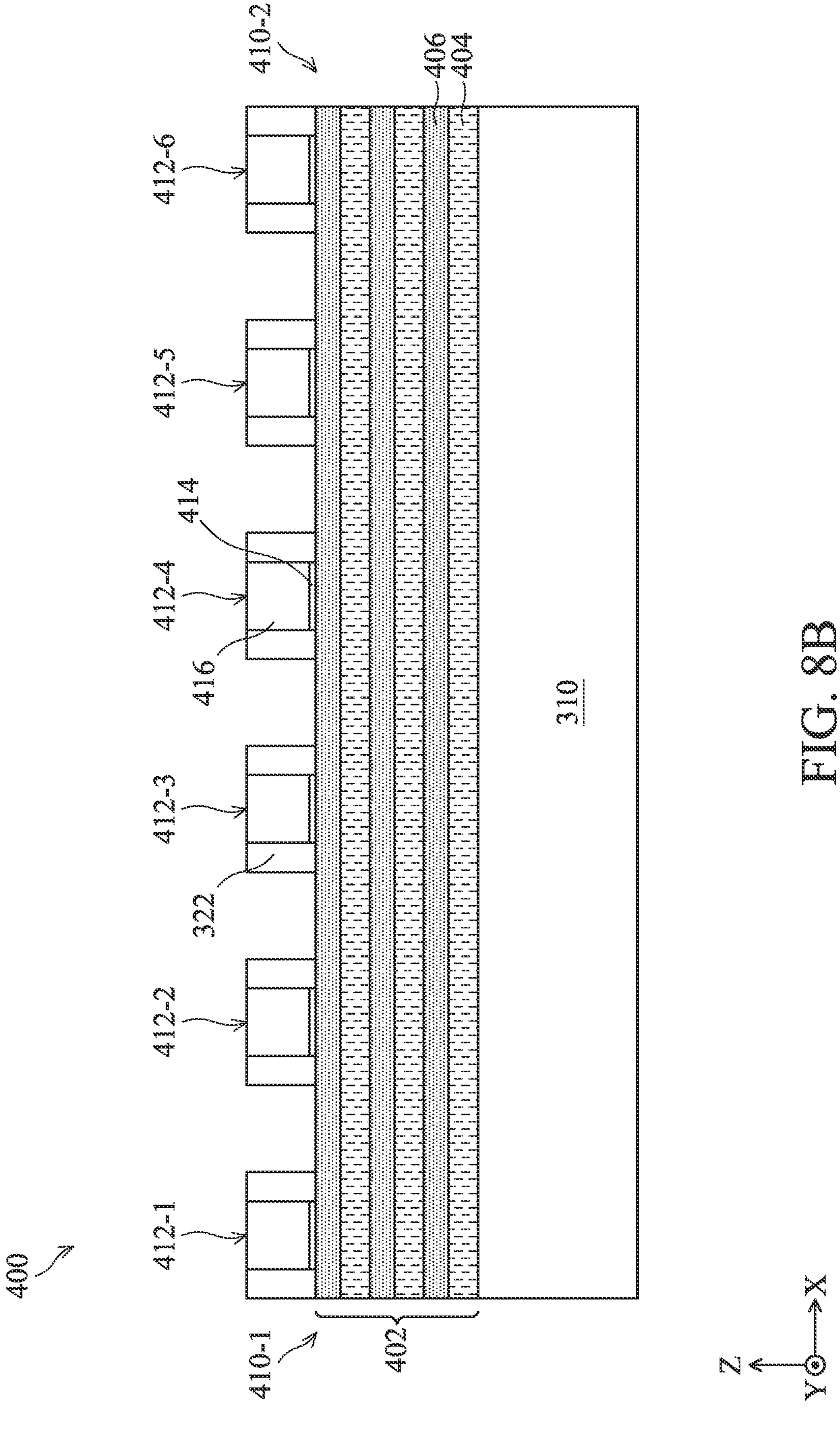
Figure 8C:
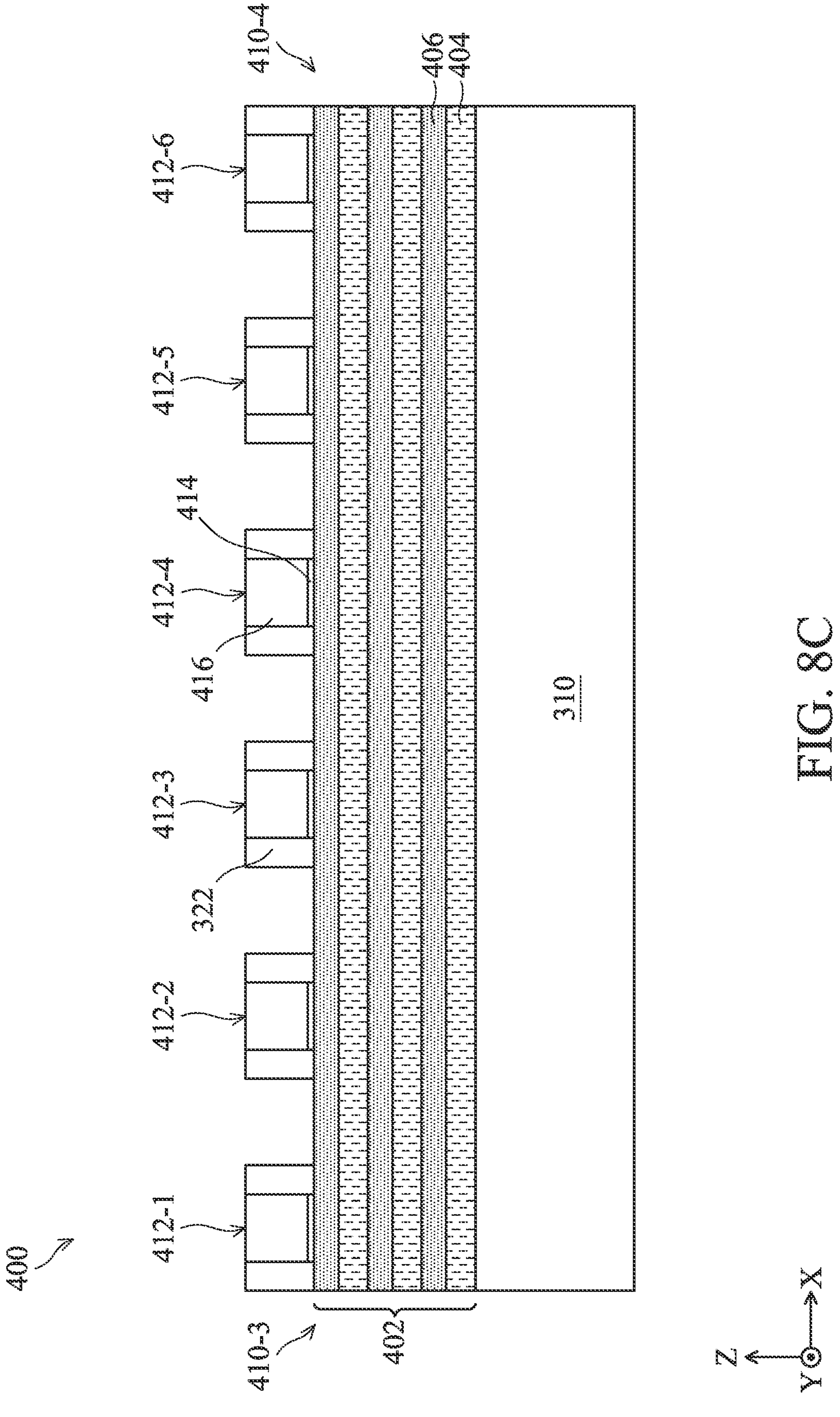

It should be noted that three (3) layers of the semiconductor layers 404 and three (3) layers of the semiconductor layers 406 are alternately and vertically arranged (or stacked) as shown in FIG. 8A, which are for illustrative purposes only and not intended to be limiting beyond what is specifically recited in the claims. The number of layers depends on the desired number of channels members for the semiconductor device. In some embodiments, there may be from 2 to 10 semiconductor layers 404 alternating with 2 to 10 semiconductor layers 406 in the stack 402.

For patterning purposes, the workpiece 400 may also include a hard mask layer 408 over the stack 402. The hard mask layer 408 may be a single layer or a multi-layer. In some embodiments, the hard mask layer 408 is a single layer and includes a silicon germanium layer. In some embodiments, the hard mask layer 408 is a multi-layer and includes a silicon nitride layer and a silicon oxide layer over the silicon nitride layer. In some other embodiments, the hard mask layer 408 is a multi-layer and includes a silicon germanium layer and a silicon layer over the silicon germanium layer.

Figure 7A:
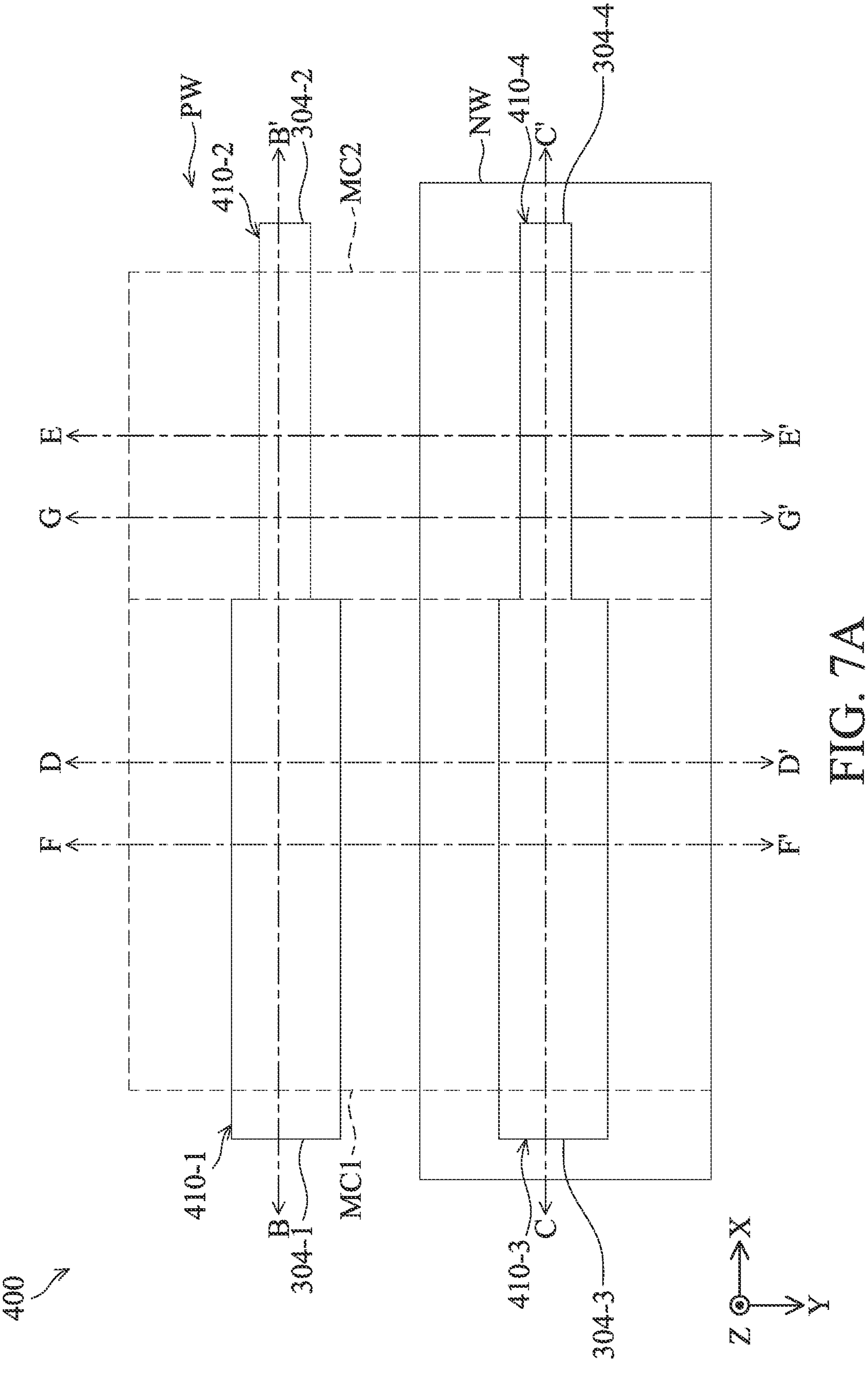
FIGS. 7A, 8A, 9A, 10A, 11A, 12A, 13A, and 14A illustrate top views (or layouts) of the workpiece at various fabrication stages for the array of the circuit cells, in accordance with some embodiments of the present disclosure.
Figure 7B:
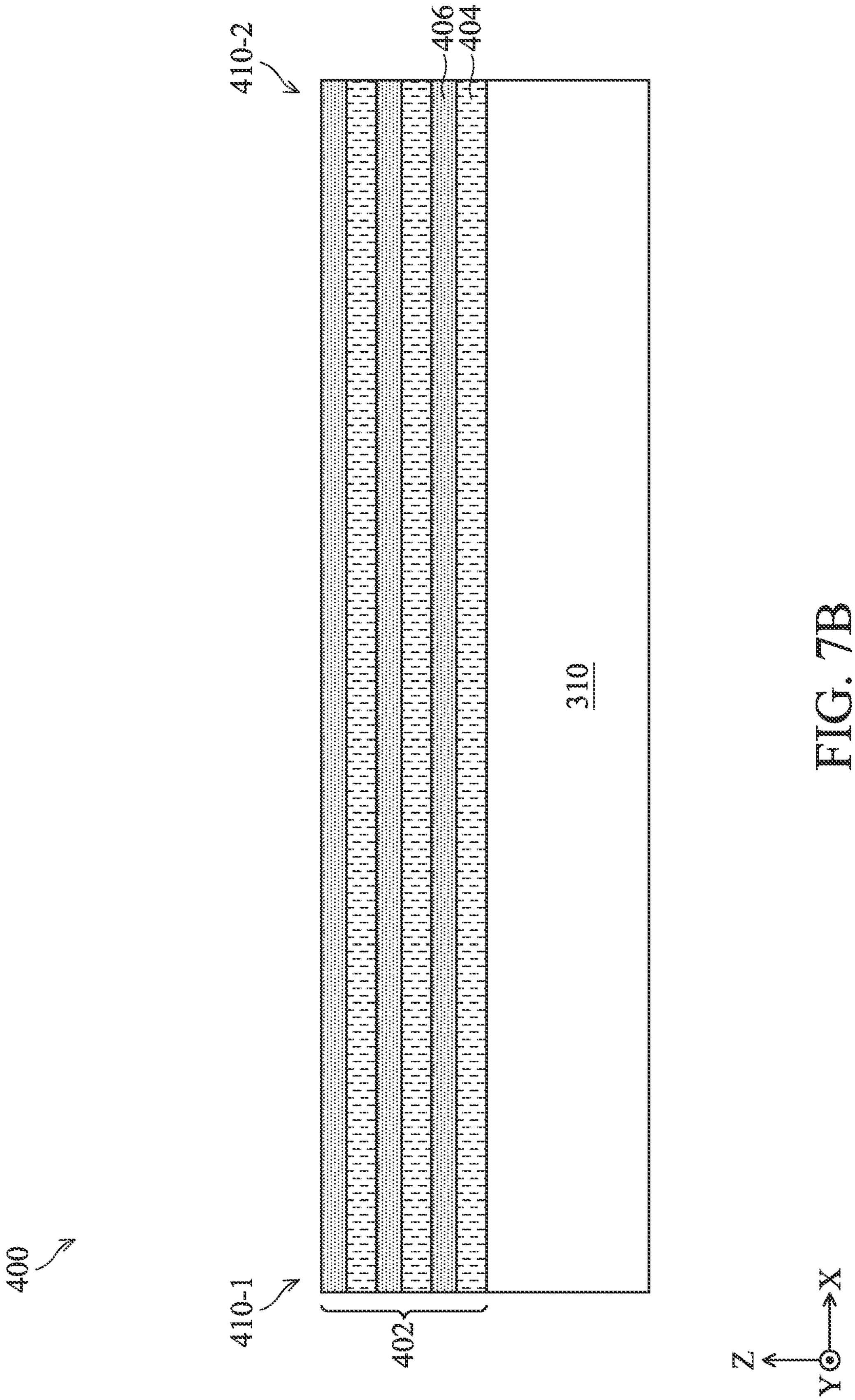
FIGS. 7B, 8B, 9B, 10B, 11B, 12B, 13B, and 14B illustrate X-Z cross-sectional views of the workpiece at various fabrication stage along lines B-B' of FIGS. 7A to 14A, respectively, in accordance with some embodiments of the present disclosure.
Figure 7C:
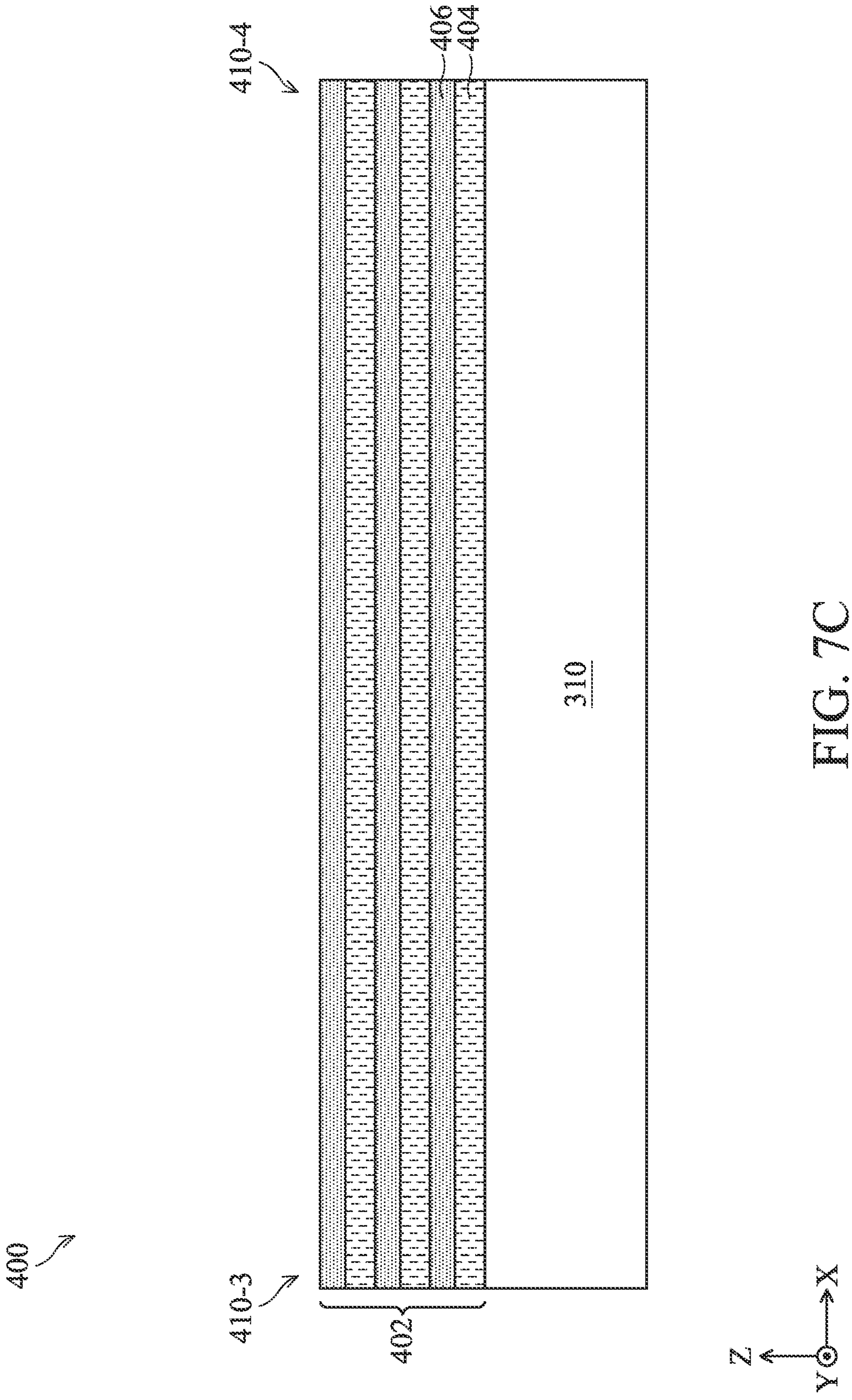
FIGS. 7C, 8C, 9C, 10C, 11C, 12C, 13C, and 14C illustrate X-Z cross-sectional views of the workpiece at various fabrication stage along lines C-C' of FIGS. 7A to 14A, respectively, in accordance with some embodiments of the present disclosure.
Figure 7E:
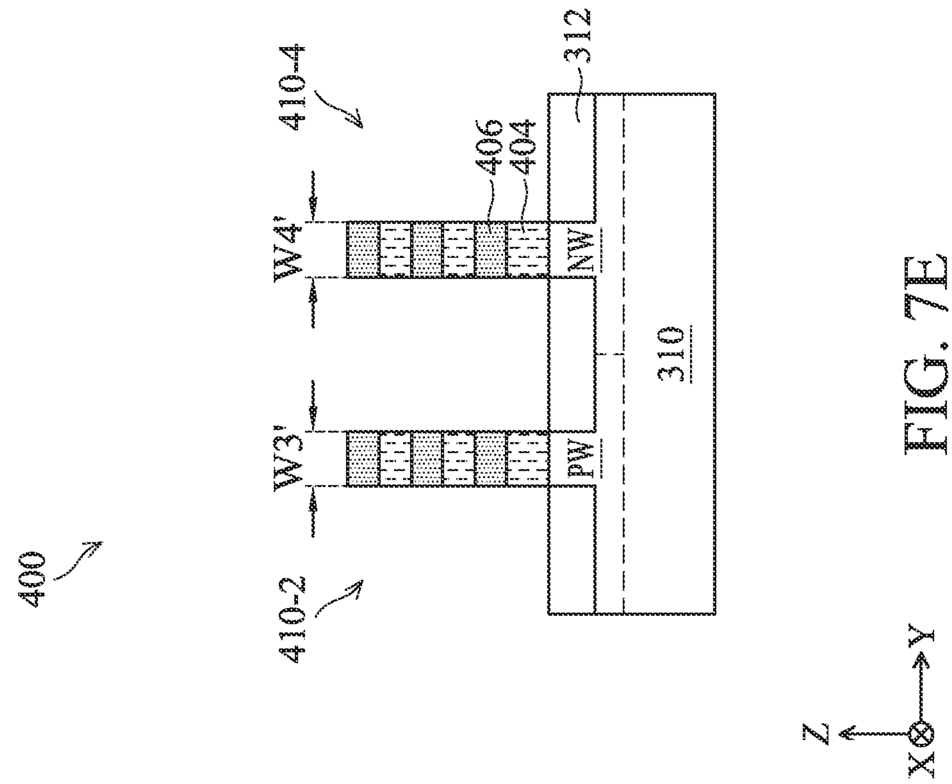
FIGS. 7E, 8E, 9E, 10E, 11E, 12E, 13E, and 14E illustrate Y-Z cross-sectional views of the workpiece at various fabrication stage along lines E-E' of FIGS. 7A to 14A, respectively, in accordance with some embodiments of the present disclosure.
Figure 7D:
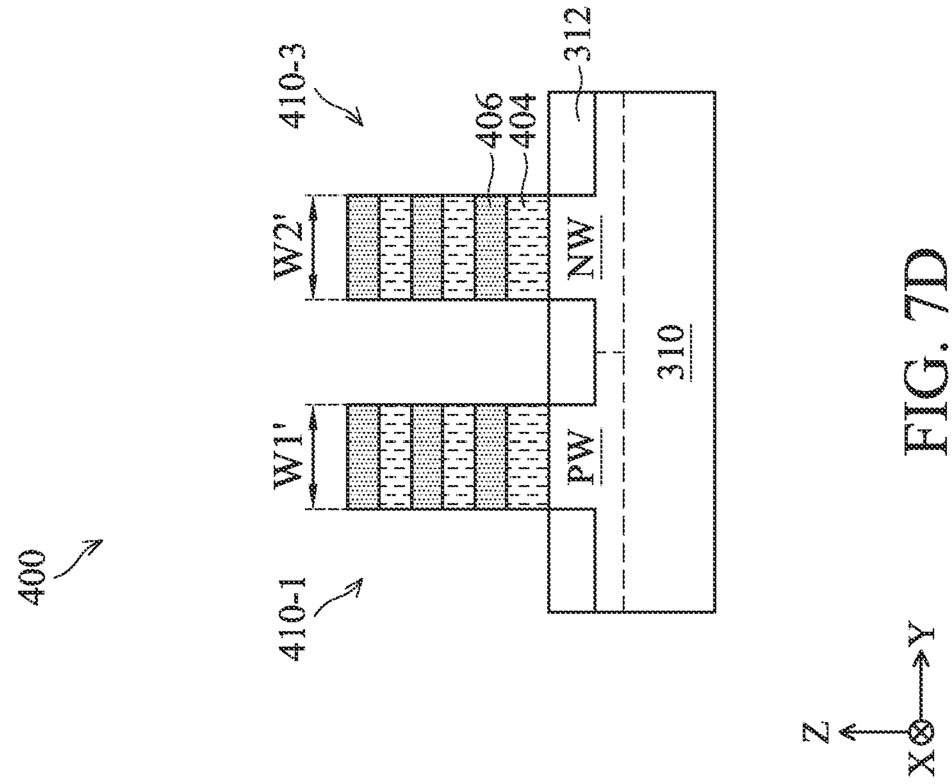
FIGS. 7D, 8D, 9D, 10D, 11D, 12D, 13D, and 14D illustrate Y-Z cross-sectional views of the workpiece at various fabrication stage along lines D-D' of FIGS. 7A to 14A, respectively, in accordance with some embodiments of the present disclosure.
Figure 7G:
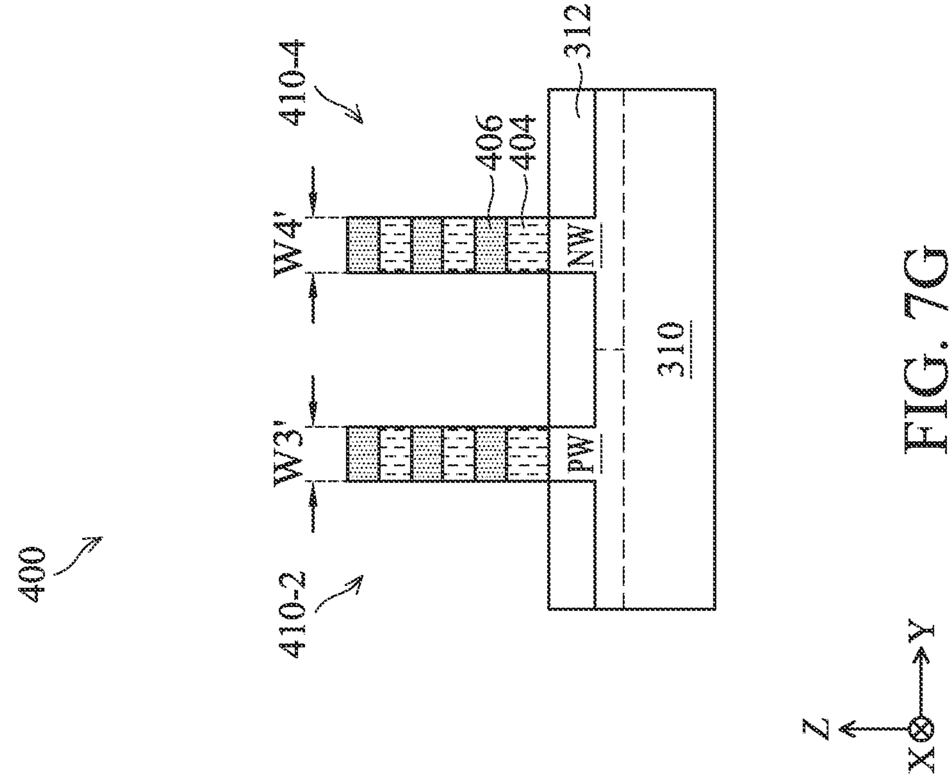
FIGS. 7G, 8G, 9G, 10G, 11G, 12G, 13G, and 14G illustrate Y-Z cross-sectional views of the workpiece at various fabrication stage along lines G-G' of FIGS. 7A to 14A, respectively, in accordance with some embodiments of the present disclosure.
Figure 7F:
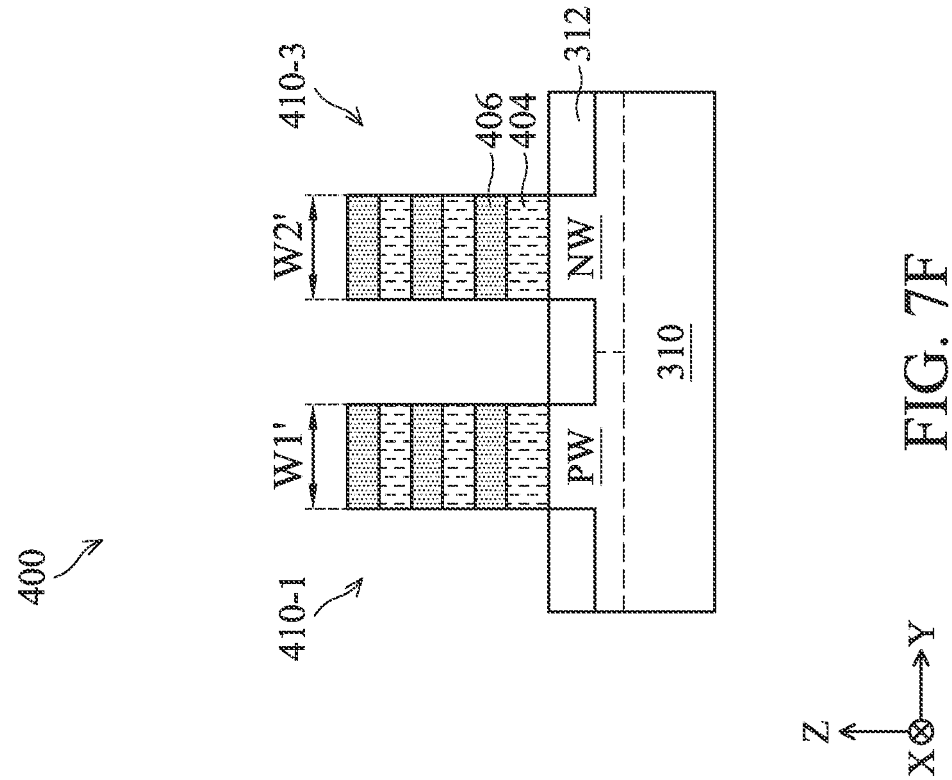
FIGS. 7F, 8F, 9F, 10F, 11F, 12F, 13F, and 14F illustrate Y-Z cross-sectional views of the workpiece at various fabrication stage along lines F-F' of FIGS. 7A to 14A, respectively, in accordance with some embodiments of the present disclosure.

Referring to FIGS. 7A to 7G, after the formation of the stack 402, the active areas 304-1 to 304-4 are defined on the workpiece 400 for patterning the stack 402 to form fins 410-1 to 410-4 (may be collectively referred to as the fins 410) over the substrate 310. In some embodiments, after the formation of the fins 410, the hard mask layer 408 is removed. The cell boundaries MC1 and MC2 discussed above are also defined on the workpiece 400 to define the areas for circuit cells 302-1 and 302-2. As shown in FIGS. 7A to 7C, the fins 410-1 and 410-2 extend in the X-direction and abut each other in the X-direction, and the fins 410-3 and 410-4 extend in the X-direction and abut each other in the X-direction. Each of the fins 410-1 to 410-4 includes semiconductor layers 404 and 406 alternating stacked in the Z-direction. Furthermore, the fins 410-1, 410-3, 410-2, and 410-4 respectively have widths W1', W2', W3', and W4' in the Y-direction. The width W1' of the fin 410-1 is greater than the width W3' of the fin 410-2, and the width W2' of the fin 410-3 is greater than the width W4' of the fin 410-4. In some embodiments, the widths W1', W2', W3', and W4' are respectively the same as the widths W1, W2, W3, and W4 discussed above.

Still referring to FIGS. 7A to 7G, after the definition of the active areas 304 and the formation of the fins 410, the isolation feature 312 discussed above is formed over the substrate 310. The isolation feature 312 is formed between the active areas 304. In some embodiments, a dielectric material for the isolation feature 312 is first deposited over the substrate 310. Specifically, the dielectric material is deposited and formed over the fins 410 and the substrate 310 to cover the fins 410 and the substrate 310. In some aspects, the dielectric material is formed to wrap around the fins 410. The deposited dielectric material is then thinned and planarized, for example by a chemical mechanical polishing (CMP) process. The planarized dielectric material is further recessed by a dry etching process, a wet etching process, and/or a combination thereof to form the isolation feature 312. As shown in FIG. 1C, fins 410 rise above the isolation features 312. In some embodiments, before the formation of the isolation feature 312, a liner layer may be conformally deposited over the substrate 310 using ALD or CVD.

Figure 8E:
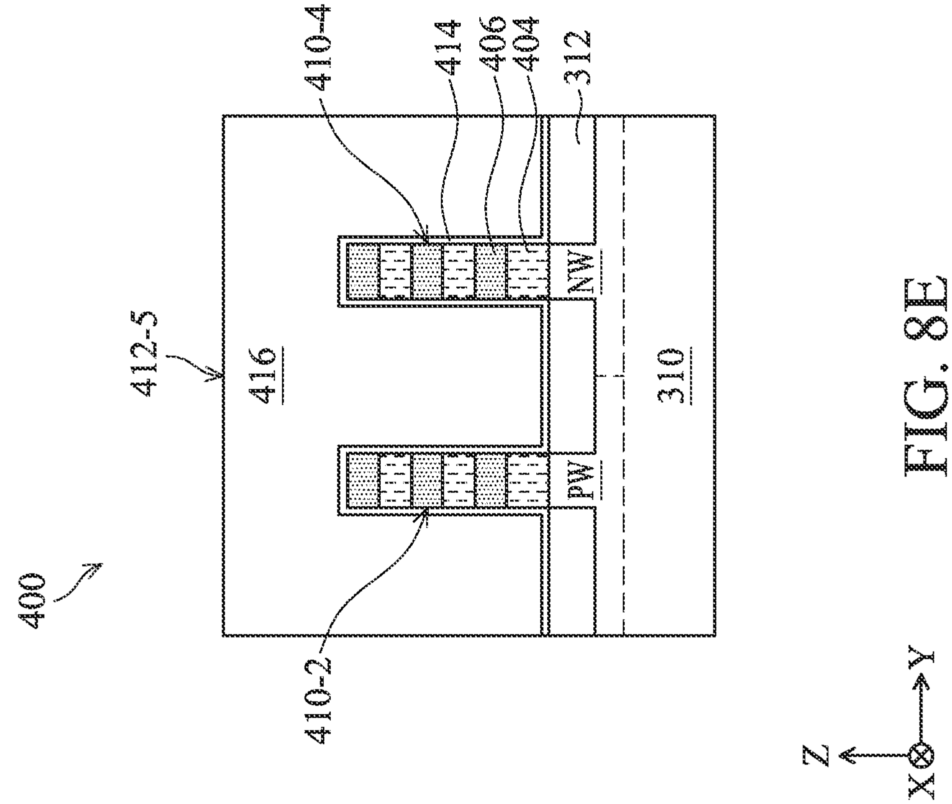
Figure 8D:
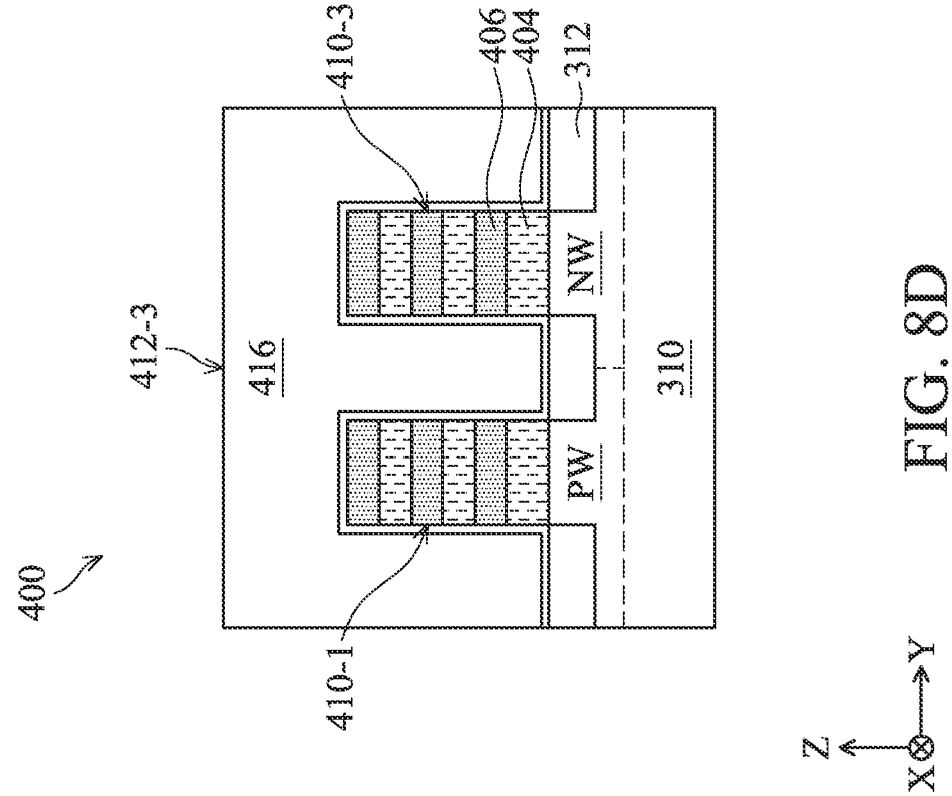
Figure 8G:
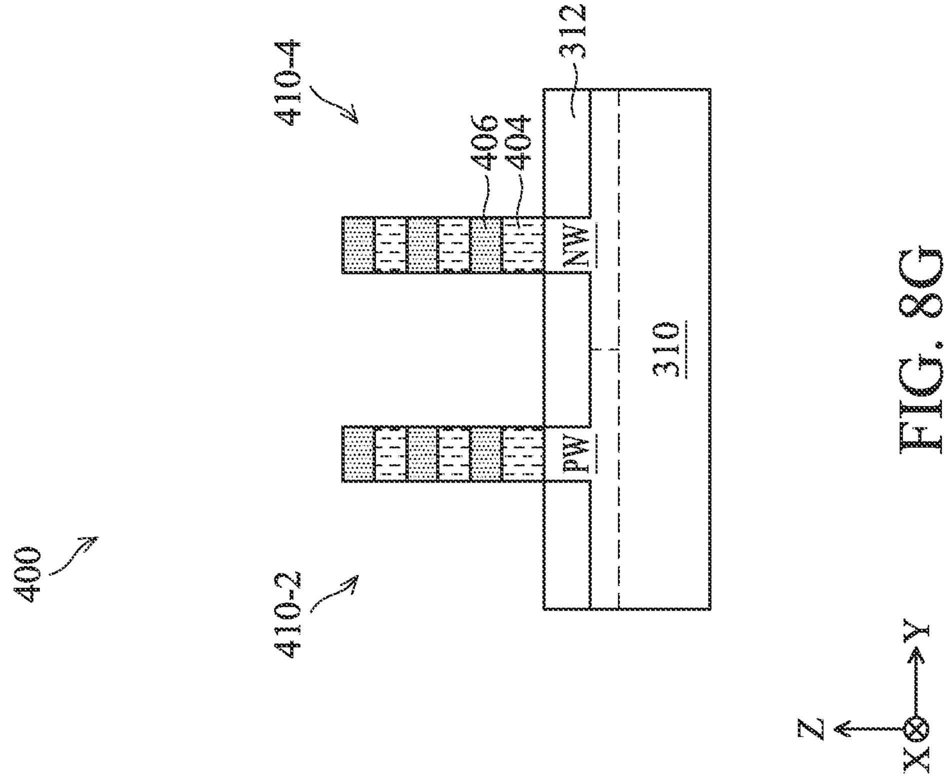

Referring to FIGS. 8A to 8G, dummy gate structures 412-1 to 412-6 (may be collectively referred to as the dummy gate structures 412) are formed over the fins 410. The dummy gate structures 412 extend in the Y-direction, as shown in FIGS. 8A, 8D, and 8E. In some embodiments, to form the dummy gate structures 412, a dummy interfacial material for dummy interfacial layers 414 is first formed over fins 410. In some embodiments, the dummy interfacial layer 414 may include, for example, a dielectric material such as a nitride (e.g., silicon nitride, silicon oxynitride), a carbide (e.g., silicon carbide), an oxide (e.g., silicon oxide), or some other suitable material. Then, in some embodiments, a dummy gate material for dummy gate electrodes 416 is formed over the dummy interfacial material. The dummy gate material may include a conductive material selected from a group comprising of polysilicon, W, Al, Cu, AlCu, Ti, TiAlN, TaC, TaCN, TaSiN, Mn, Zr, TiN, Ta, TaN, Co, Ni, and/or a combination thereof. The dummy gate material and/or the dummy interfacial material may be formed by way of a thermal oxidation process and/or a deposition process (e.g., physical vapor deposition (PVD), CVD, PECVD, and ALD).

After the formation of the dummy interfacial material and the dummy gate material, one or more etching processes may be performed to pattern the dummy gate material for the dummy gate electrodes 416 and the dummy interfacial material for the dummy interfacial layers 414, thereby forming the dummy gate structures 412 each having the dummy interfacial layer 414 and the dummy gate electrode 416. The dummy interfacial layers 414 may also be referred to as dummy gate dielectrics. The dummy gate structures 412 may undergo a gate replacement process through subsequent processing to form metal gates, such as a high-k metal gate, as discussed in greater detail below.

Still referring to FIGS. 8A to 8G, after the formation of the dummy gate structures 412, gate spacers 322 are formed on sidewalls of the dummy gate structures 412 and over the top surfaces of the fins 410. More specifically, the gate spacers 322 are formed on opposite sidewalls of the dummy gate structures 412. In some embodiments, the gate spacers 322 may be formed by conformally depositing a spacer layer (containing the dielectric material) over the fins 410 and dummy gate structures 412, followed by an anisotropic etching process to remove top portions of the spacer layer from the top surfaces of the fins 410 and dummy gate structures 412. After the etching process, portions of the spacer layer on the sidewall surfaces of the fins 410 and the dummy gate structures 412 substantially remain and become the gate spacers 322. In some embodiments, the anisotropic etching process is a dry (e.g., plasma) etching process. Additionally or alternatively, the formation of the gate spacers 322 may also involve chemical oxidation, thermal oxidation, ALD, CVD, and/or other suitable methods. The gate spacers 322 may also be interchangeably referred to as top spacers.

Referring to FIGS. 9A to 9G, the fins 410 are recessed to form source/drain trenches 418 in the fins 410 (or passing through the semiconductor layers 404 and 406). More specifically, the source/drain trenches 418 are formed on opposite sides of the dummy gate structures 412 and in the fins 410. The source/drain trenches 418 may be formed by performing one or more etching processes to remove portions of the semiconductor layers 404, the semiconductor layers 406 that do not vertically overlap or be covered by the dummy gate structures 412 and the gate spacers 322. In some embodiments, a single etchant may be used to remove the semiconductor layers 404 and the semiconductor layers 406, whereas in other embodiments, multiple etchants may be used to perform the etching process.

Still referring to FIGS. 9A to 9G, after the formation of the source/drain trenches 418, side portions of the semiconductor layers 404 are removed via a selective etching process. Specifically, the selective etching process is performed that selectively etches the side portions of the semiconductor layers 404 below the gate spacers 322 through the source/drain trenches 418, with minimal (or no) etching of semiconductor layers 406, such that gaps 420 are formed between the semiconductor layers 406 as well as between the semiconductor layers 406 and the substrate 310, below the gate spacers 322. The etching process is configured to laterally etch (e.g., along the X-direction) the semiconductor layers 404 below the gate spacers 322. The selective etching process is a dry etching process, a wet etching process, other suitable etching process, or a combination thereof.

Figure 10A:
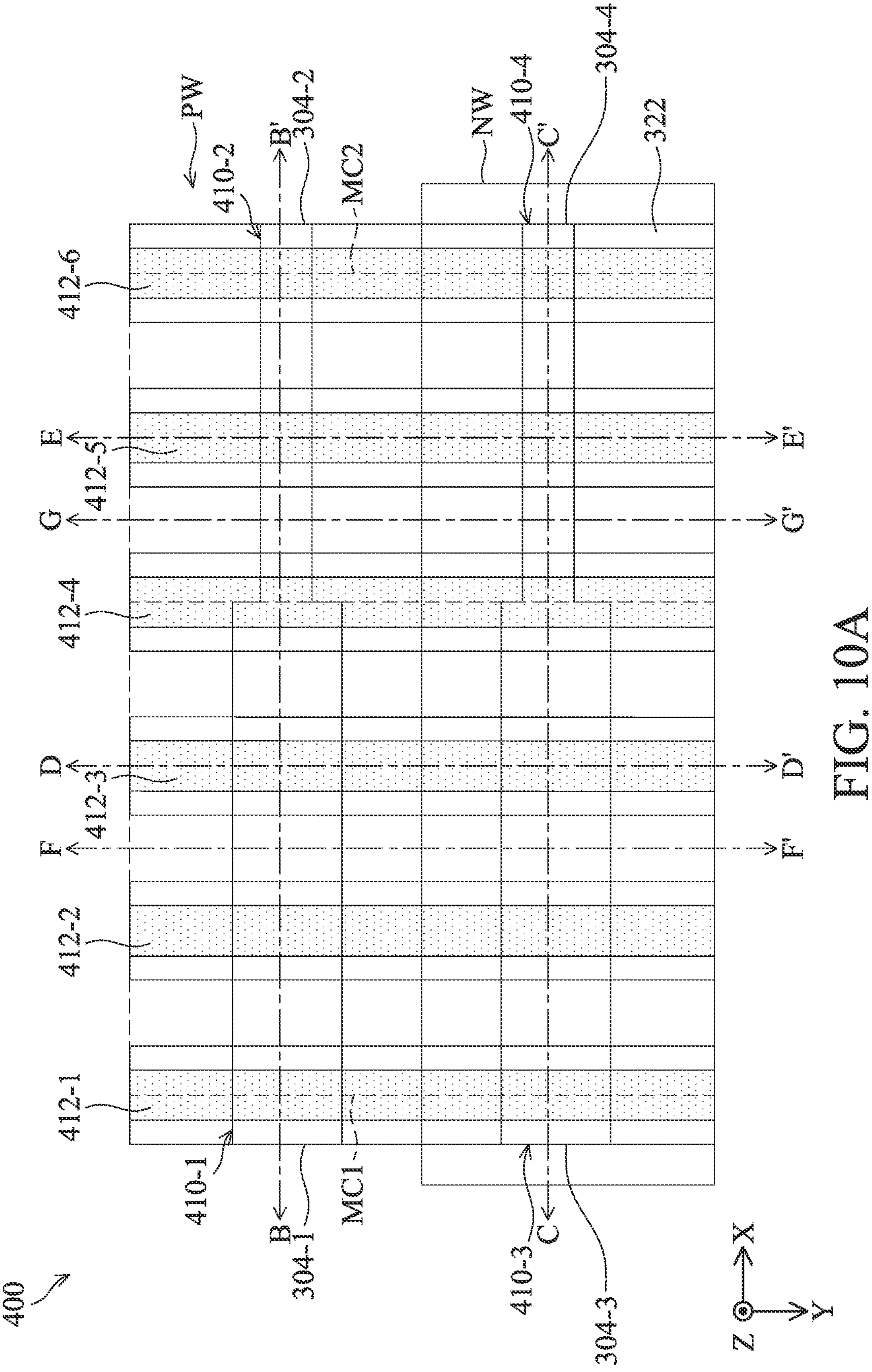
Figure 10B:
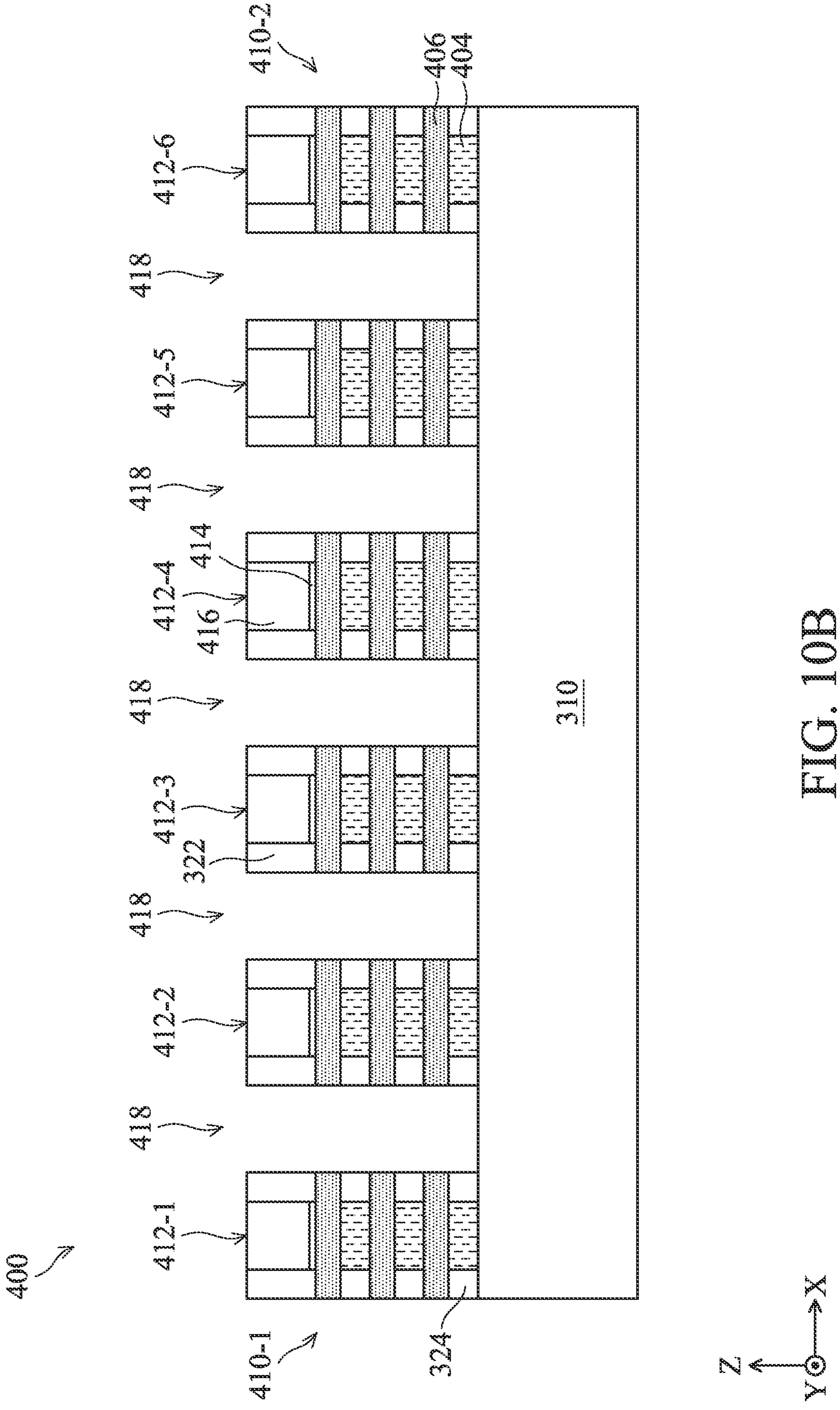
Figure 10C:
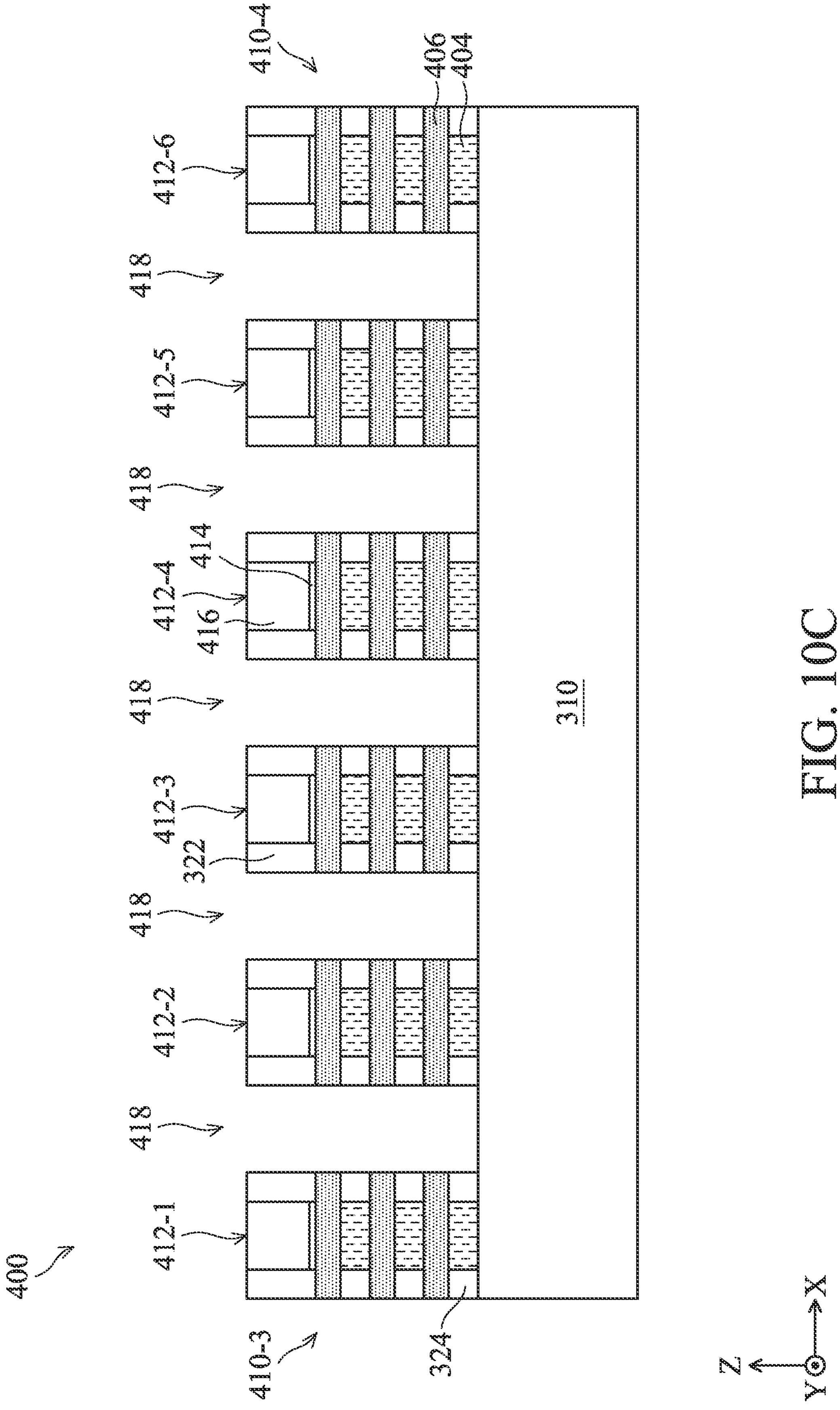
Figure 10E:
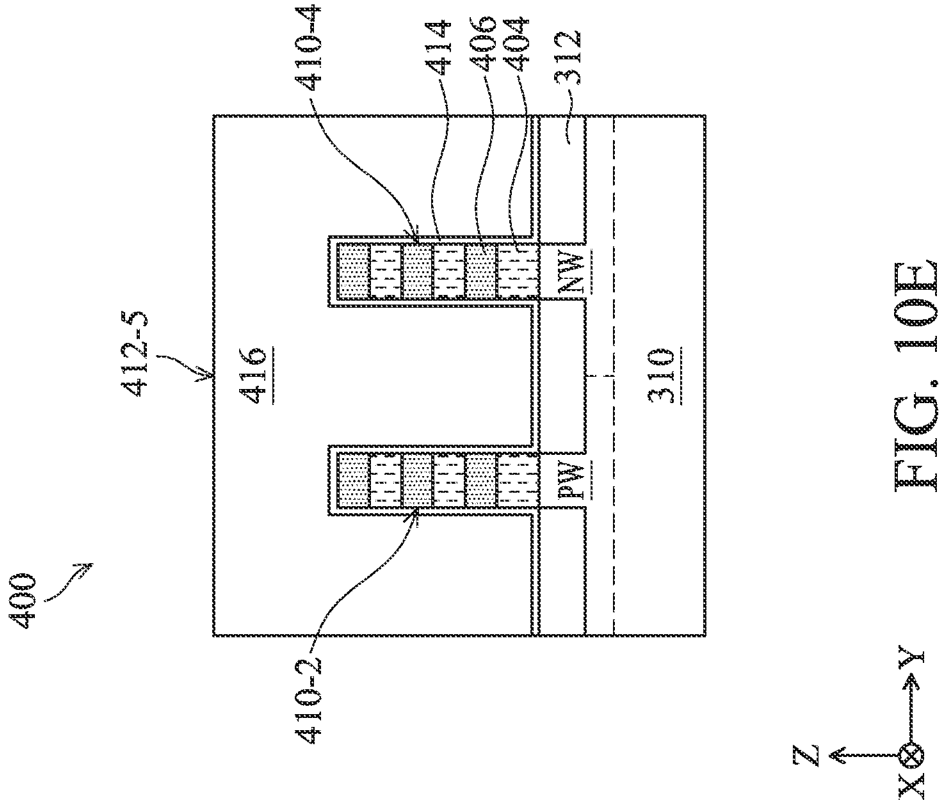
Figure 10D:
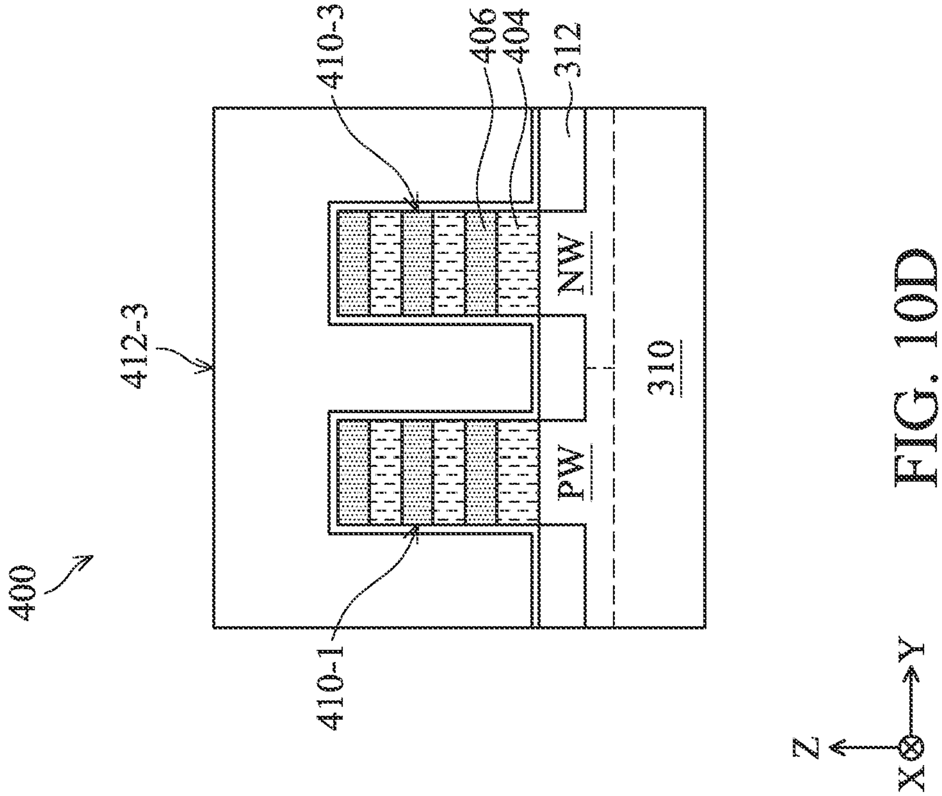
Figure 10F:
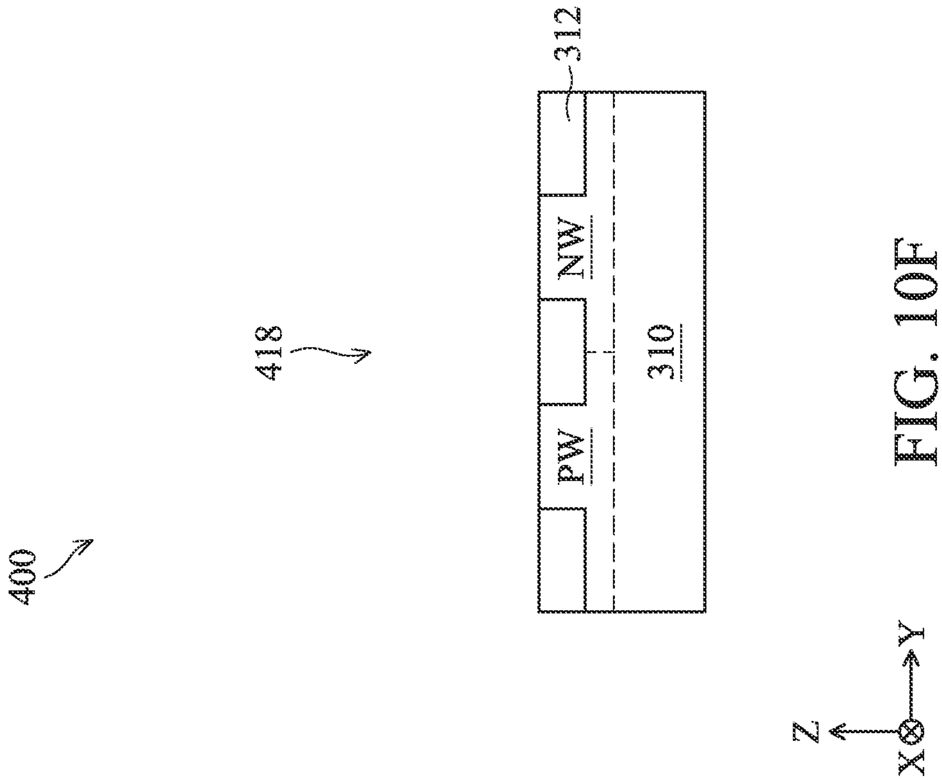
Figure 10G:
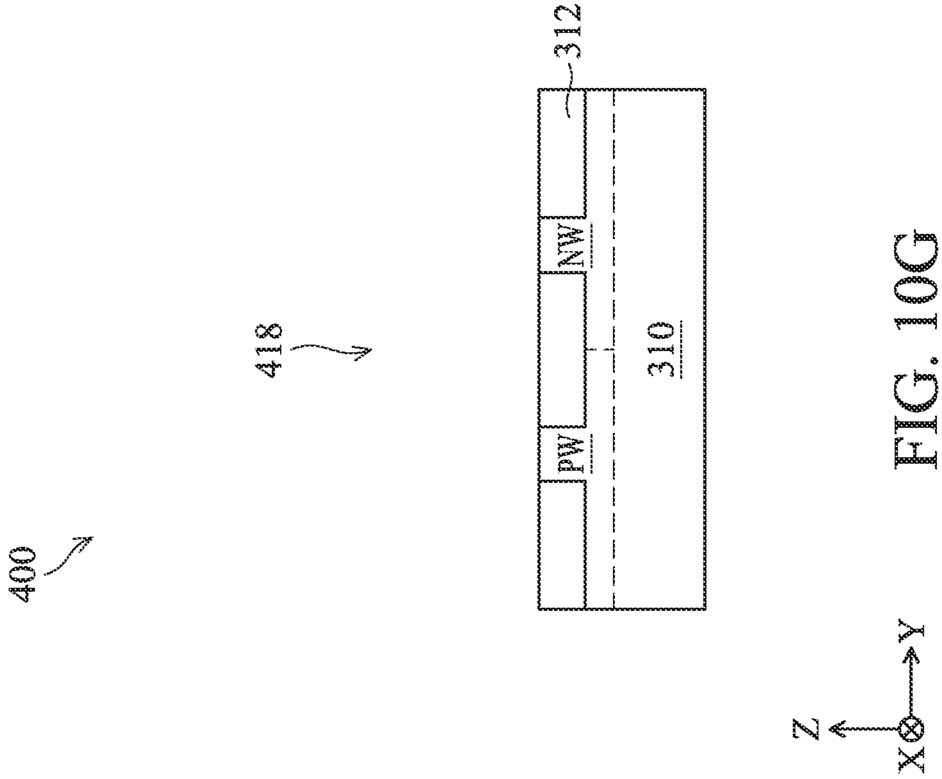

Still referring to FIGS. 10A to 10G, the inner spacers 324 are formed to fill the gaps 420. The inner spacers 324 are under the gate spacers 322 and between the semiconductor layers 406 as well as between the semiconductor layers 406 and the substrate 310. In some embodiments, sidewalls of the inner spacers 324 are aligned to sidewalls of the gate spacers 322 and the semiconductor layers 406, as shown in FIGS. 10B and 10C. In order to form the inner spacers 324, a deposition process forms a spacer layer into the source/drain trenches 418 and the gaps 420, such as CVD, PVD, ALD, HDPCVD, MOCVD, RPCVD, PECVD, LPCVD, ALCVD, APCVD, other suitable methods, or a combination thereof. The spacer layer partially (and, in some embodiments, completely) fills the source/drain trenches 418. The deposition process is configured to ensure that the spacer layer fills the gaps 420 between the semiconductor layers 406 as well as between the semiconductor layer 406 and the substrate 310 under the gate spacers 322. An etching process is then performed that selectively etches the spacer layer to form inner spacers 324 (as shown in FIGS. 10B and 10C) with minimal (to no) etching of the semiconductor layer 406, the substrate 310, the dummy gate structures 412, and the gate spacers 322.

Figure 9A:
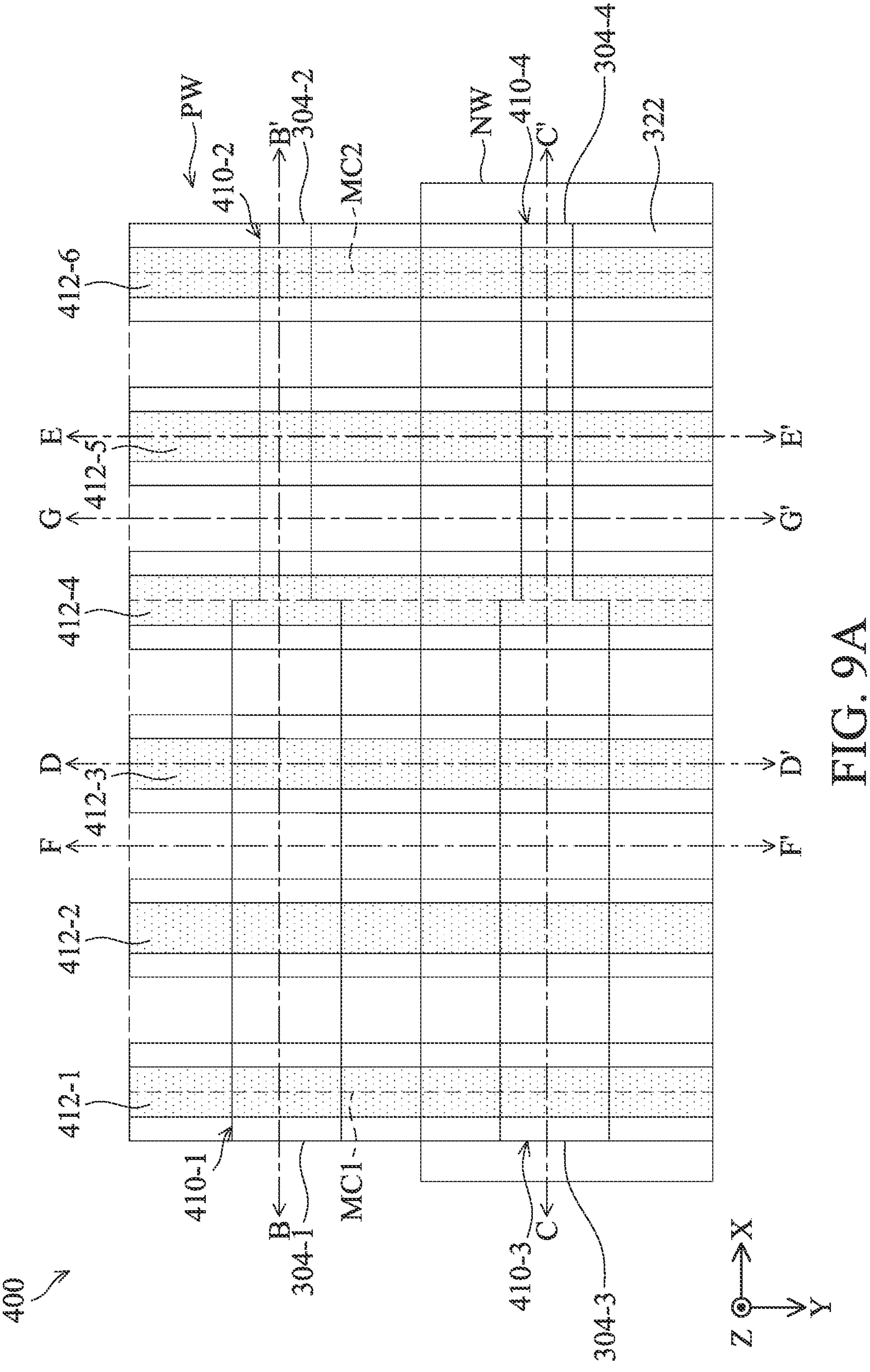
Figure 9B:
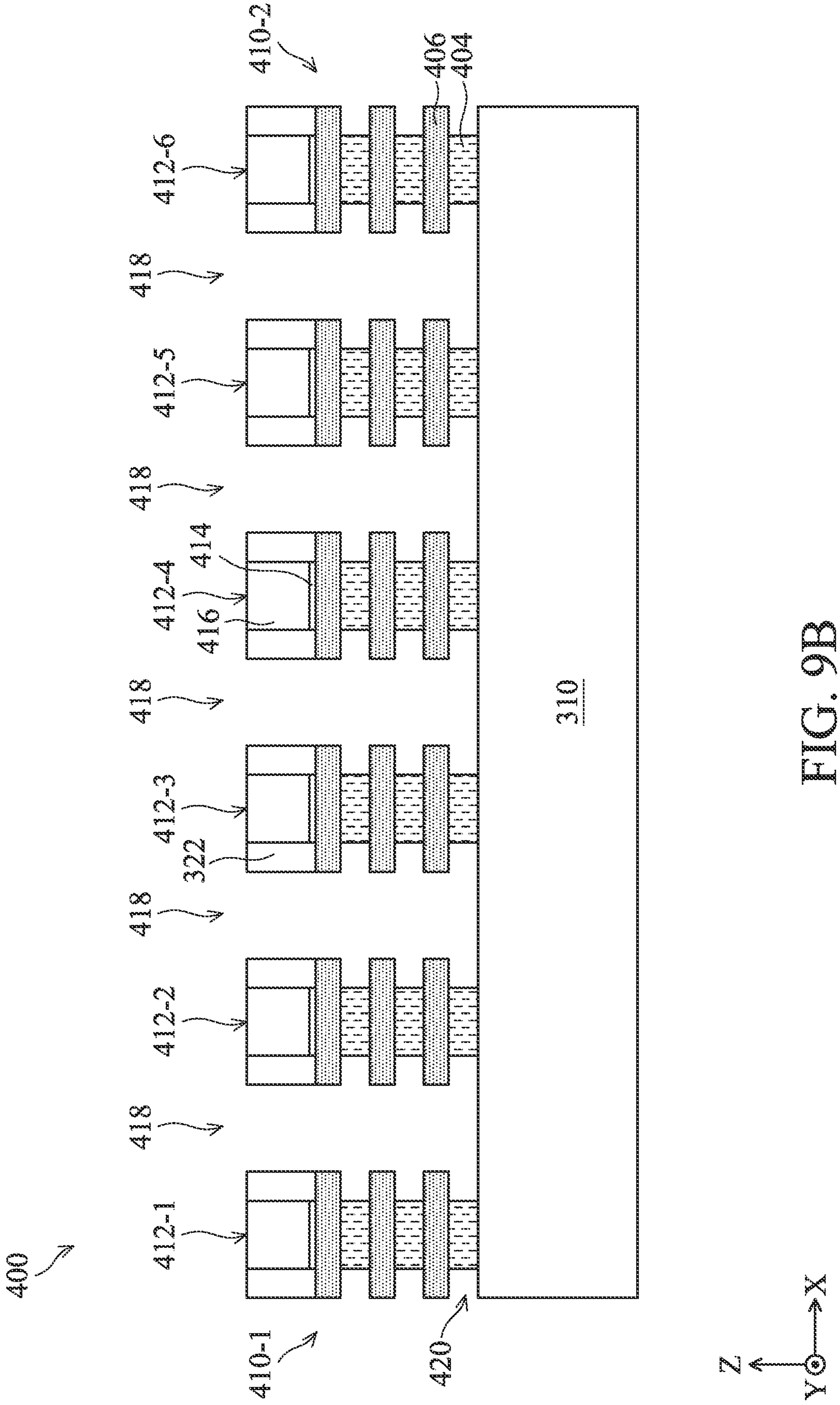
Figure 9C:
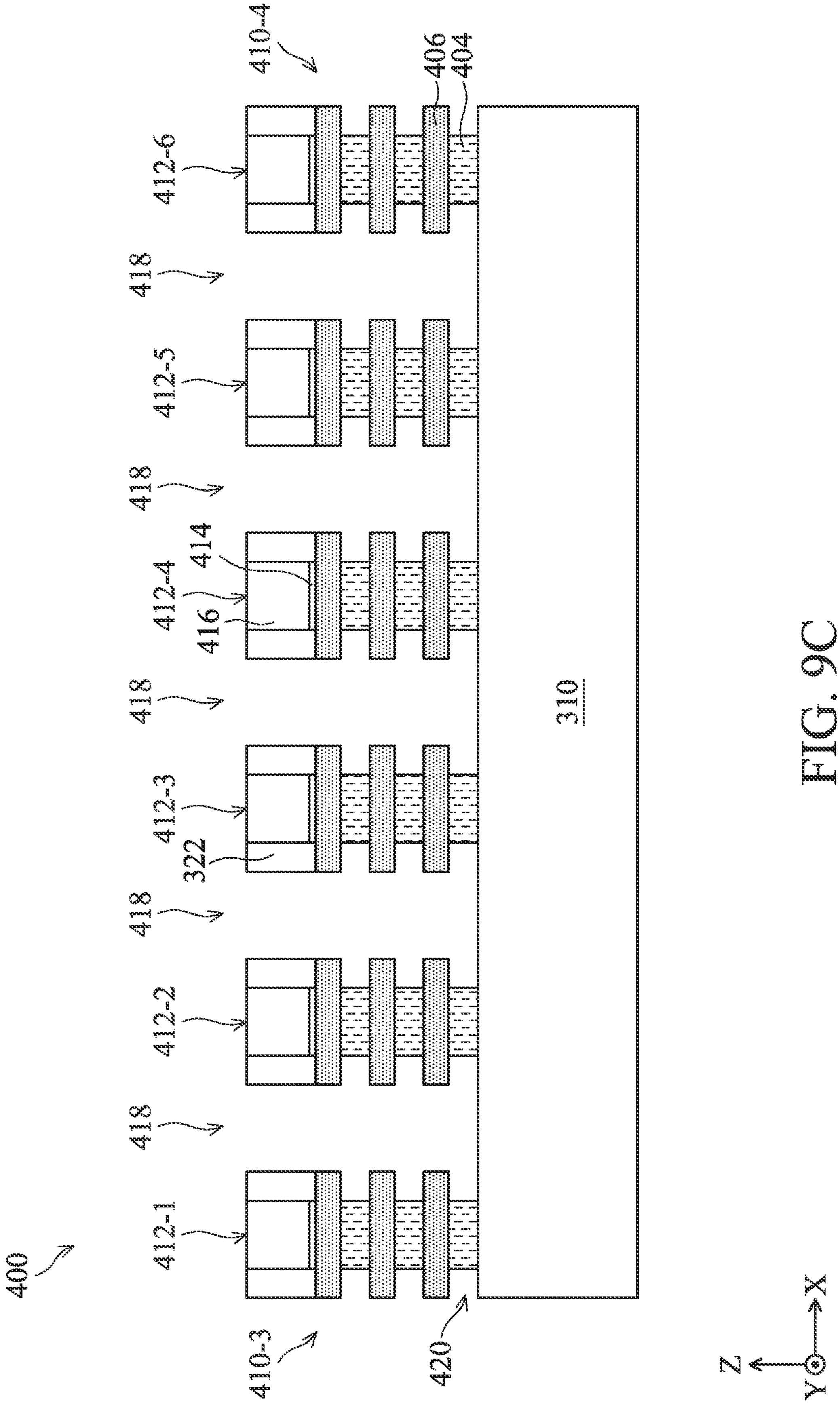
Figure 9E:
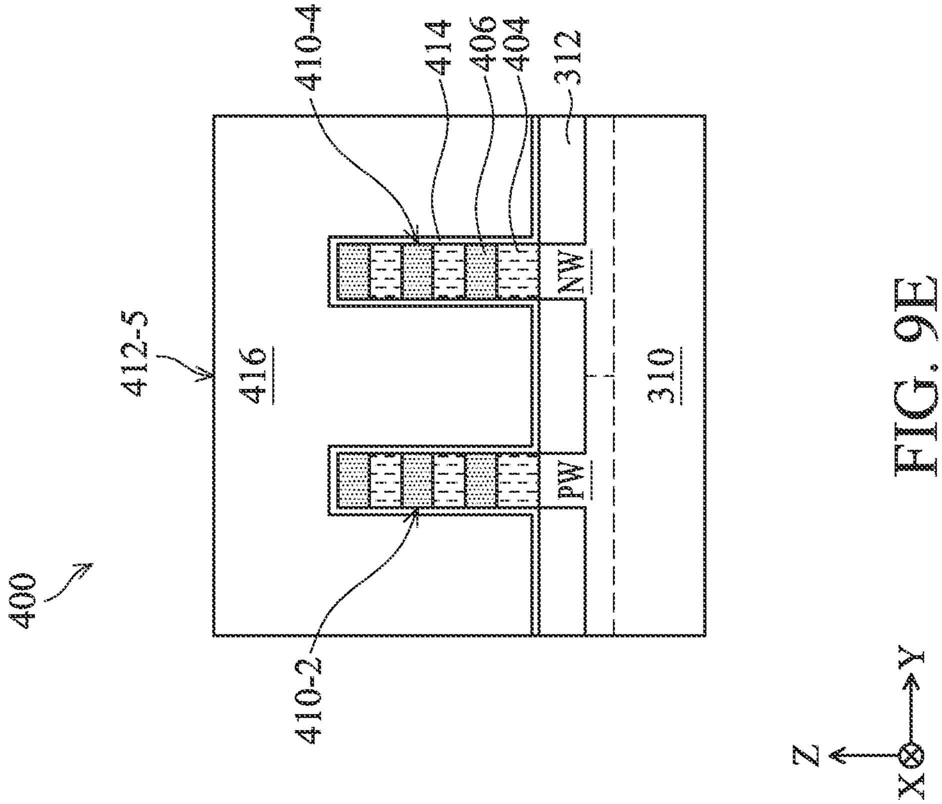
Figure 9D:
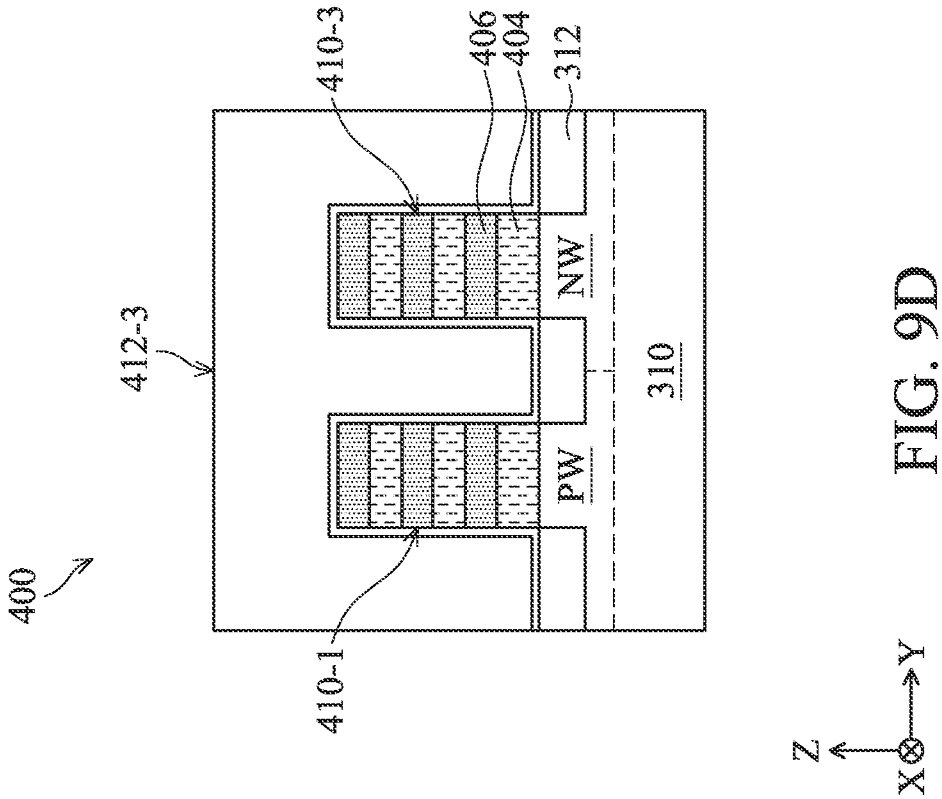
Figure 9G:
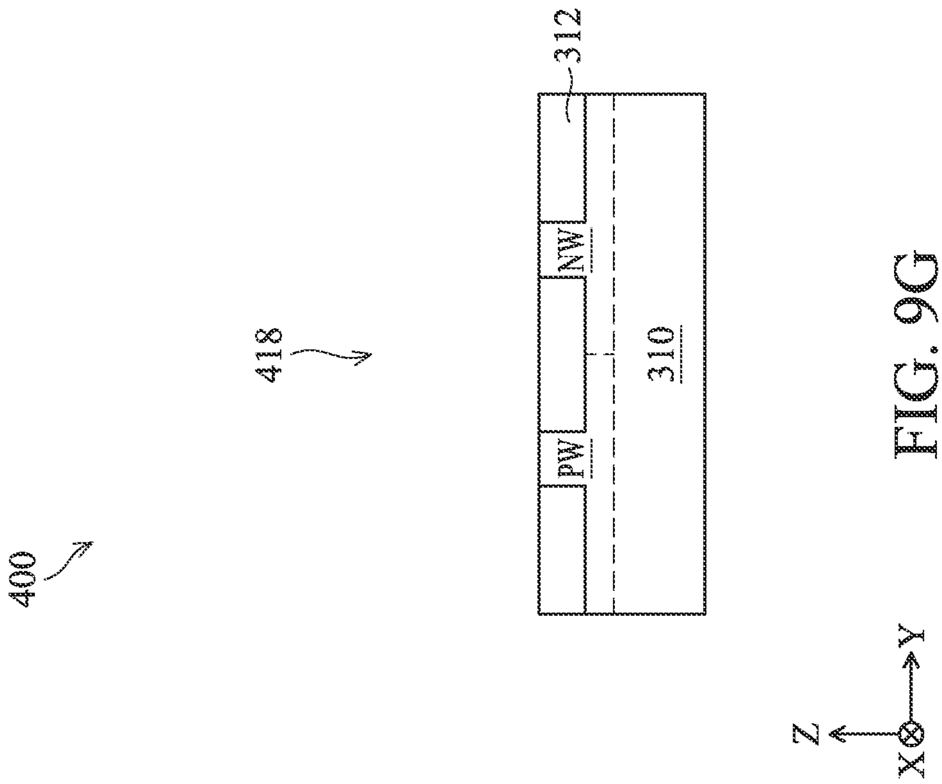
Figure 9F:
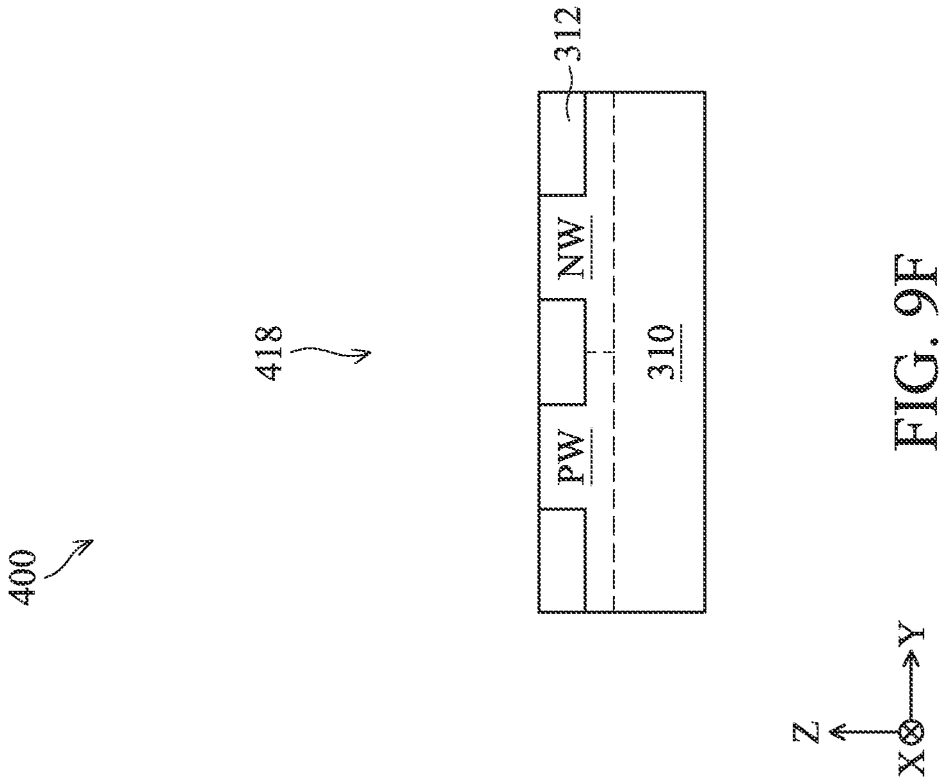

Referring to FIGS. 11A to 11G, the dielectric gate structure 308 are formed to replace portions of the dummy gate structures 412 and the semiconductor layers 404 and 406. More specifically, the dummy gate structures 412-1, 412-4, and 412-6 and the semiconductor layers 404 and 406 below the dummy gate structures 408-1, 412-4, and 412-6 are replaced with dielectric gate structures 308, as shown in FIGS. 5A to 5C. In order to form the dielectric gate structures 308, one or more lithography and etching processes may be performed to remove the portions of the dummy gate structures 412 (the dummy gate structures 412-1, 412-4, and 412-6) and the semiconductor layers 404 and 406 in regions to be formed the dielectric gate structures 308, and then the dielectric material for the dielectric gate structures 308 discussed above are formed in the regions to form the dielectric gate structures 308. The dielectric gate structures 308 separate the fin 410-1 from the fin 410-2 and separate the fin 410-3 from the fin 410-4, as shown in FIGS. 5A to 5C. As such, in the resultant device, the circuit cells 302-1 and 302-2 are separated from each other by the dielectric gate structures 308, as discussed above. As shown in FIG. 9C, portions of the substrate 310 and the isolation structure 312 in the regions to be formed the dielectric gate structures 308 are removed during the formation of the dielectric gate structures 308. Therefore, top surfaces of the isolation structure 312 and the substrate 310 in contact with the dielectric gate structures 308 are lower than other top surfaces of the isolation structure 312 and the substrate 310.

Figure 11A:
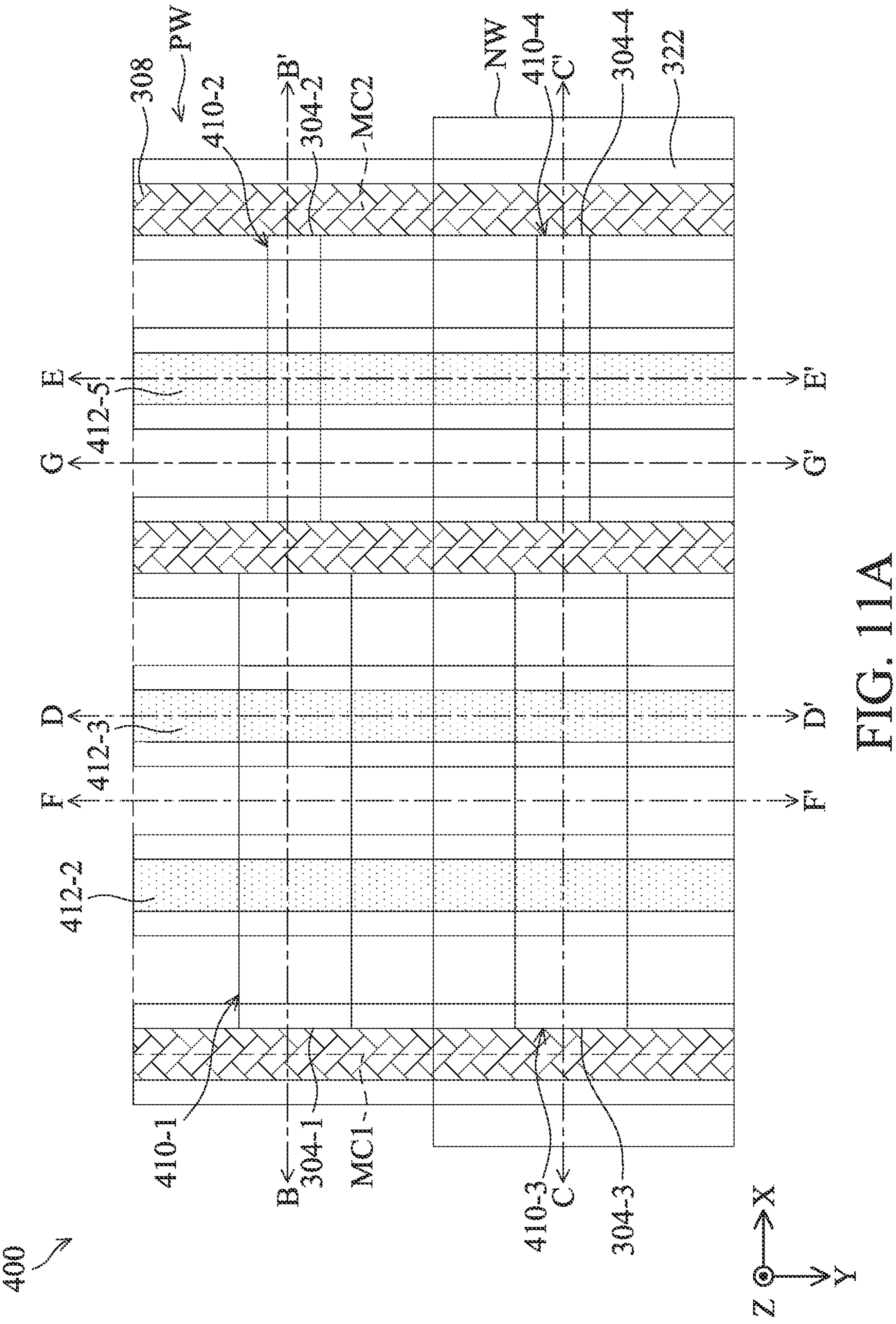
Figure 11B:
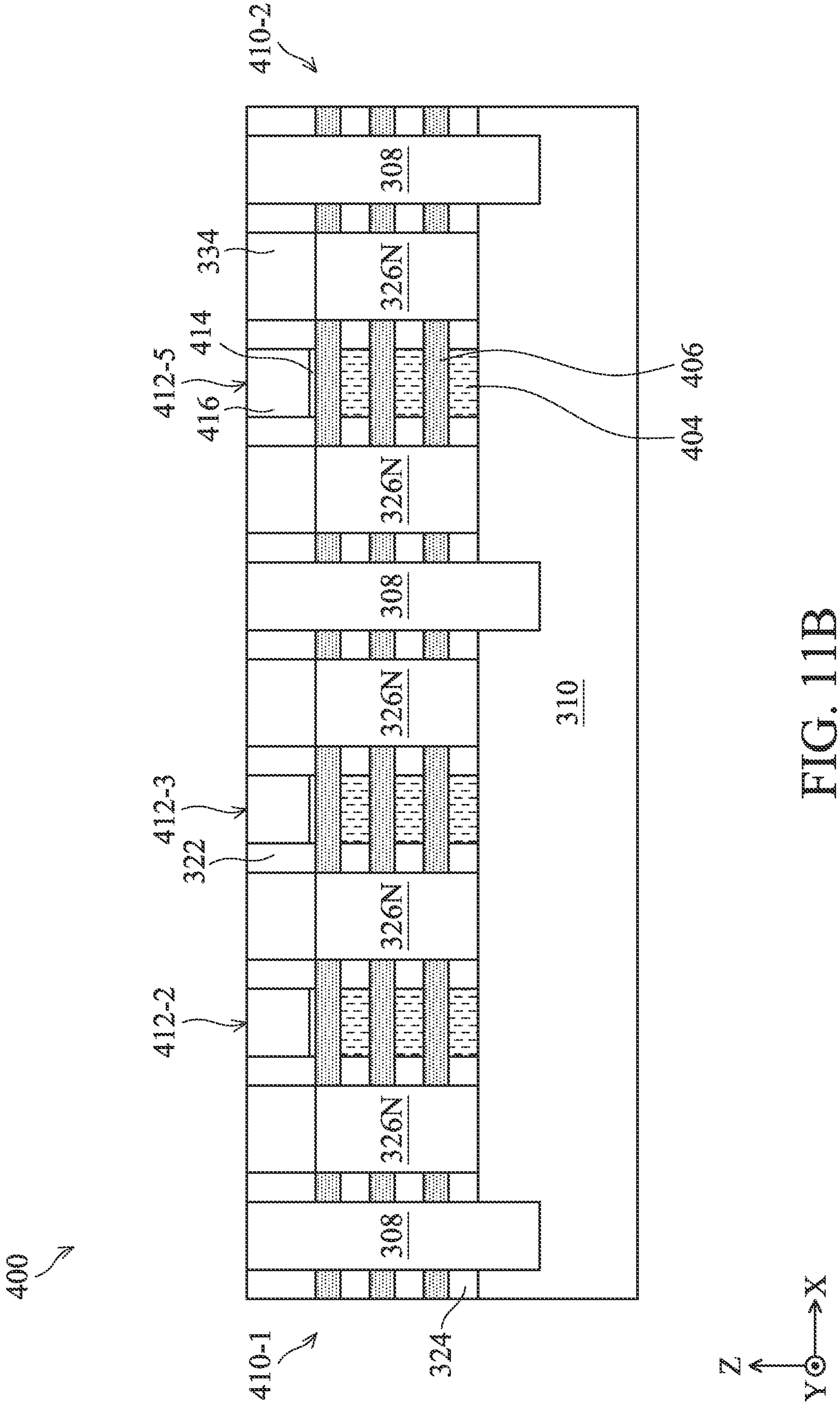
Figure 11C:
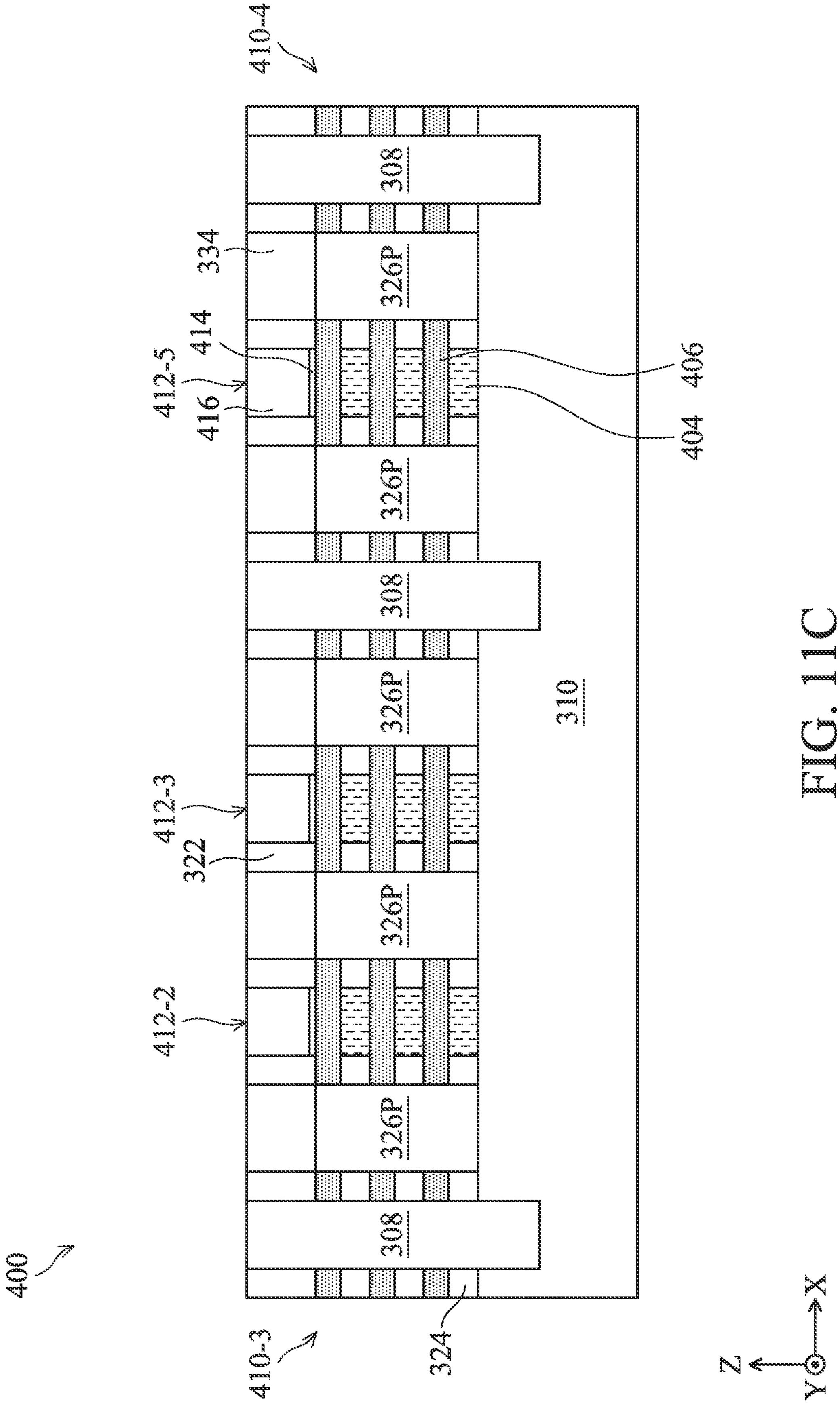
Figure 11E:
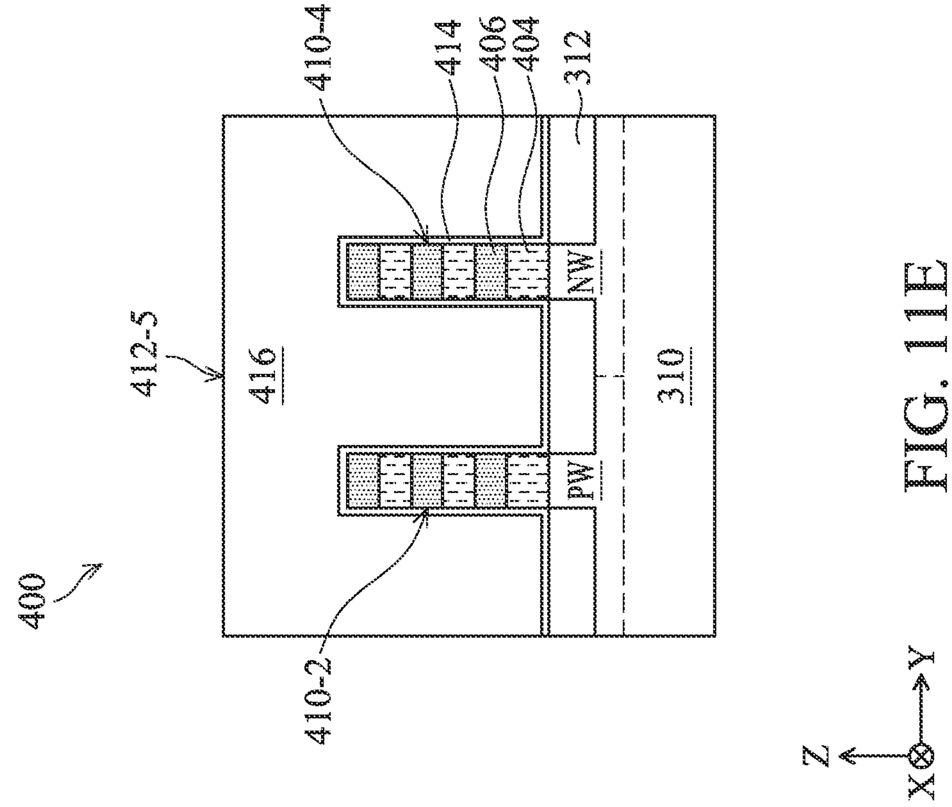
Figure 11D:
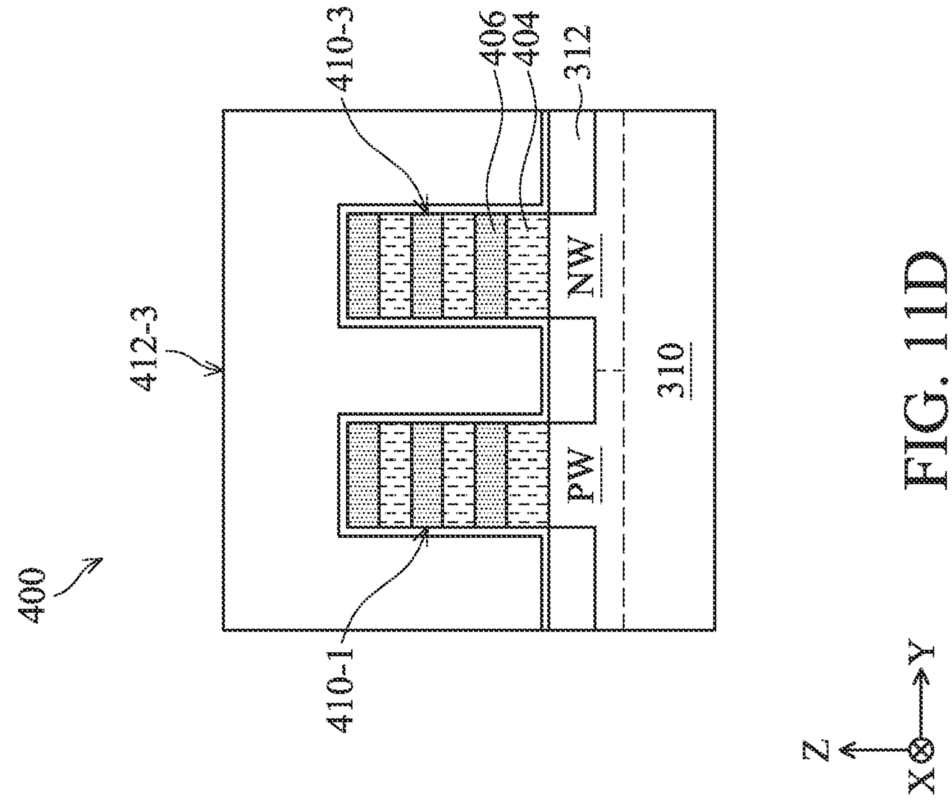
Figure 11F:
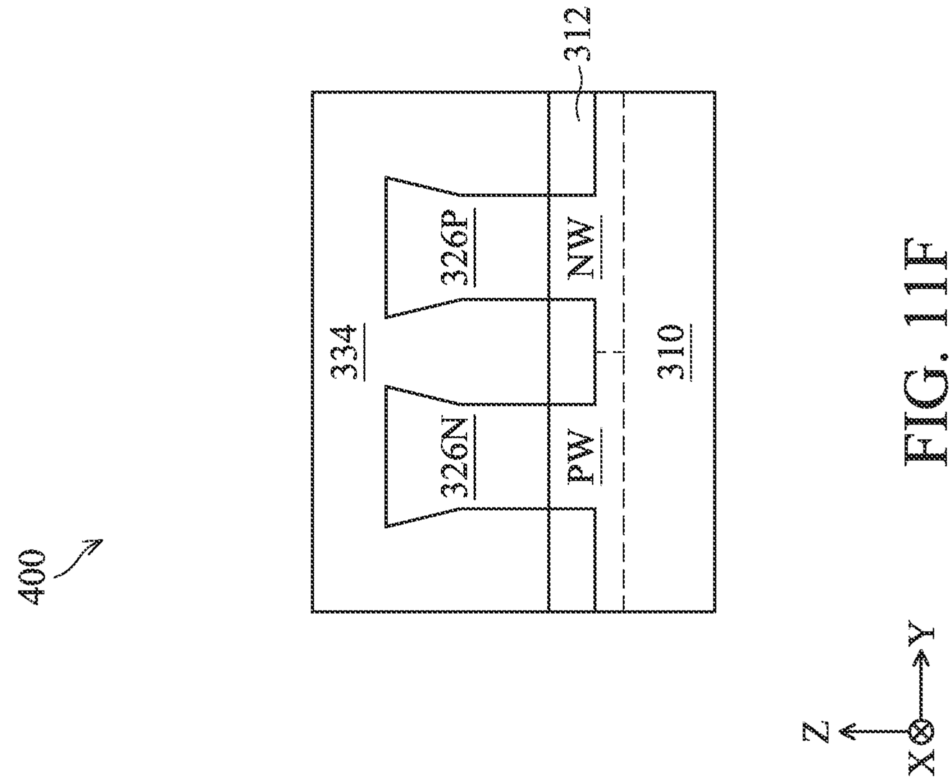
Figure 11G:
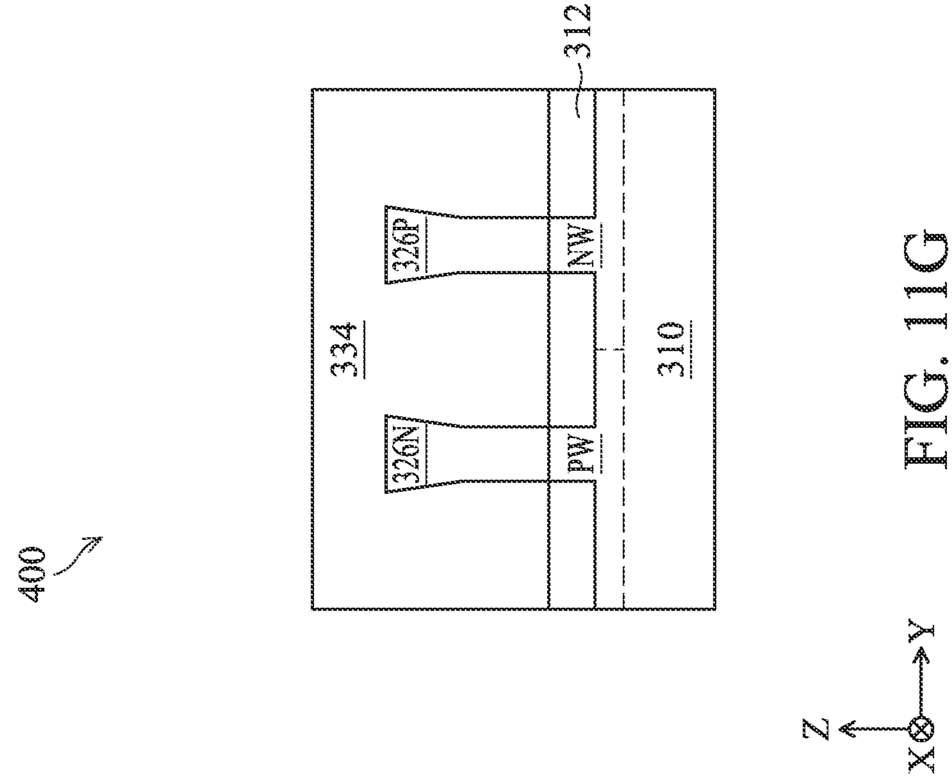
Figure 12A:
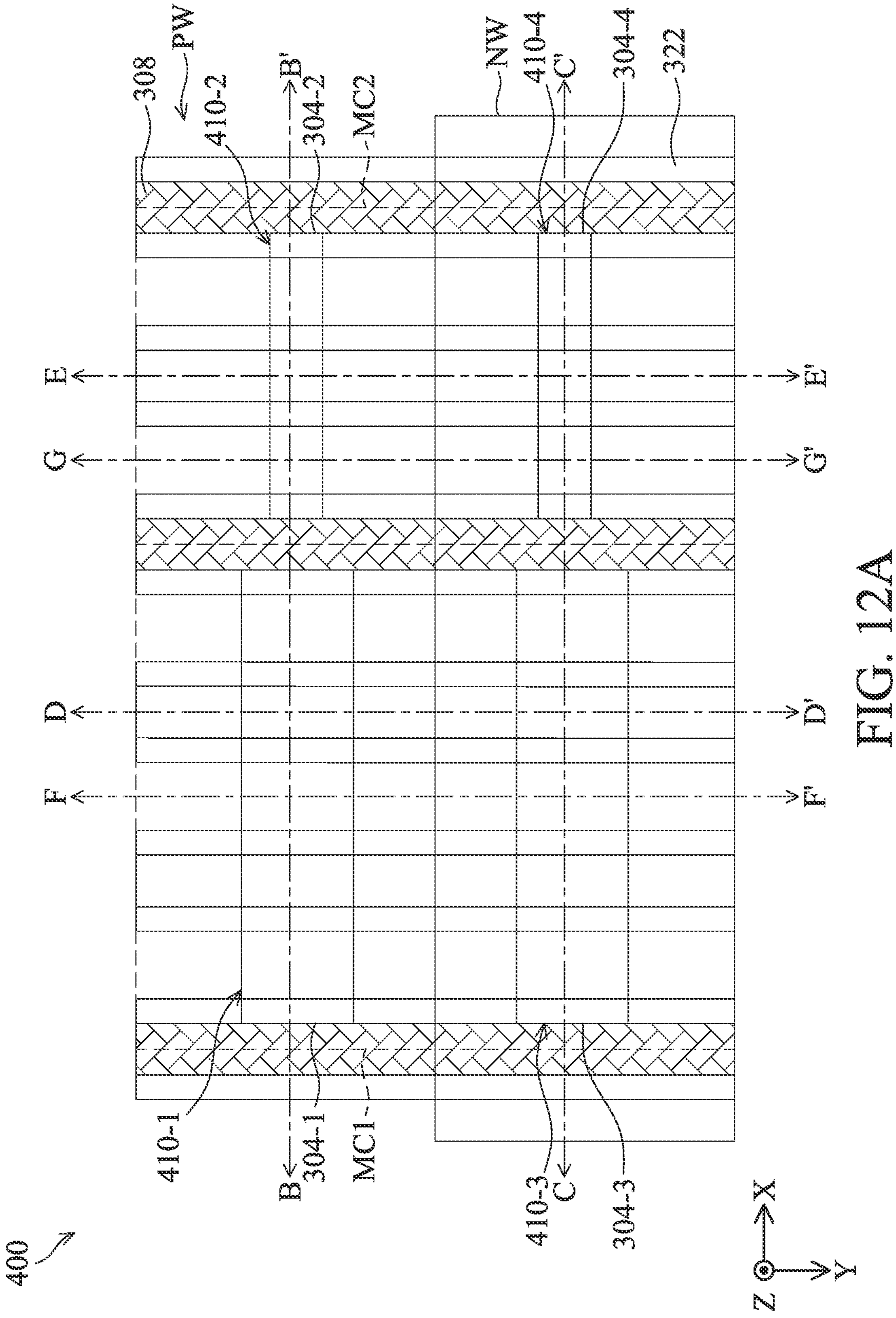
Figure 12B:
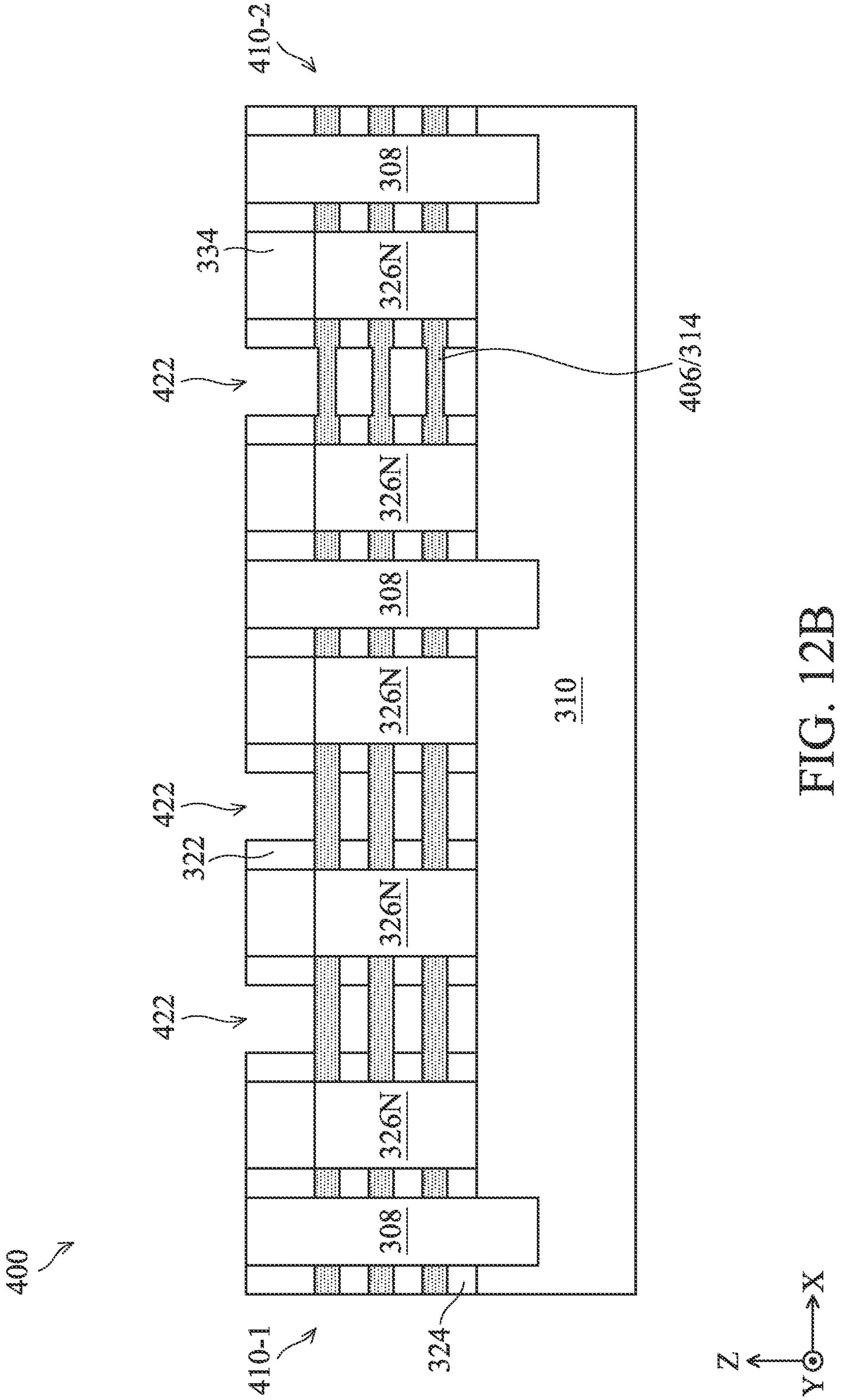
Figure 12C:
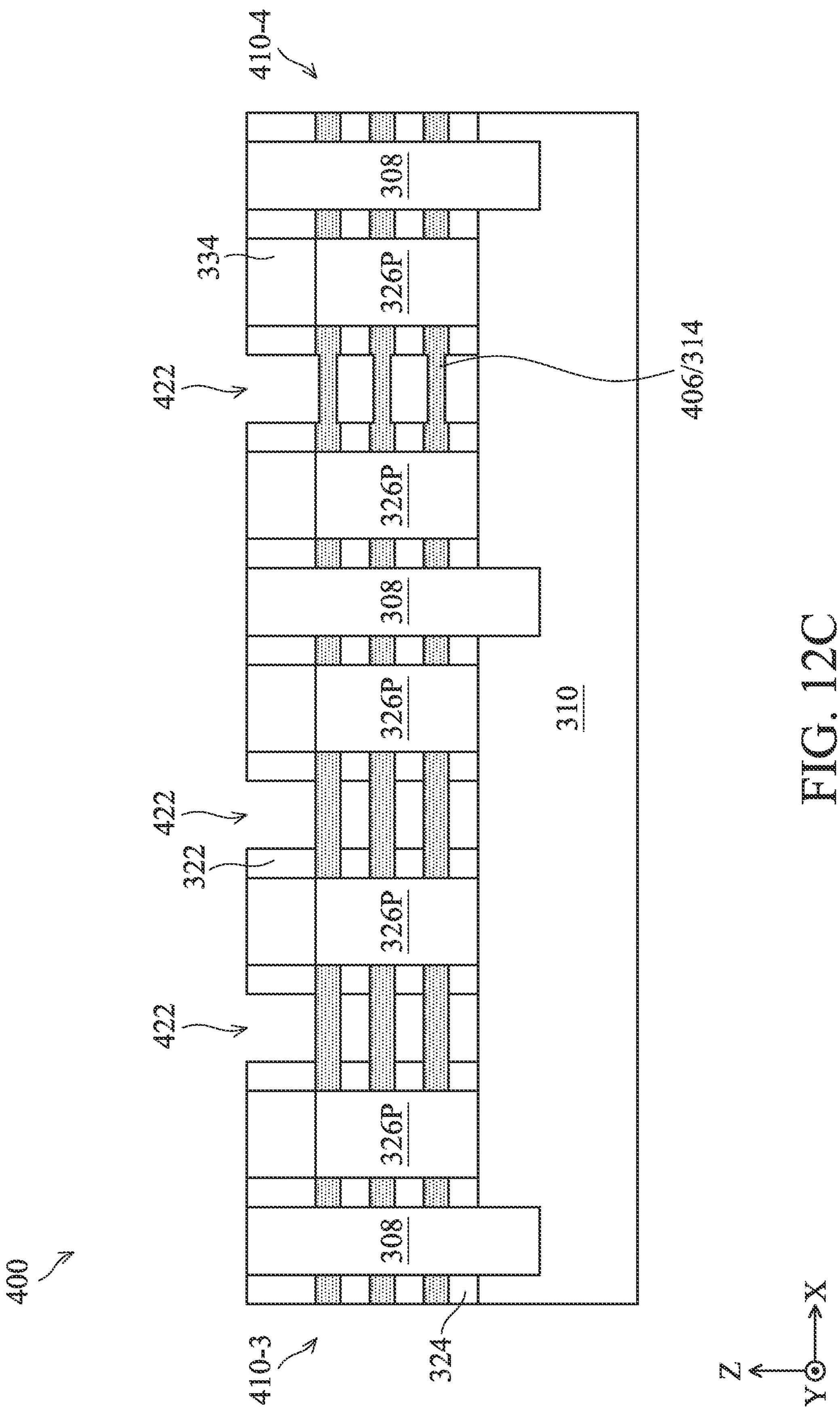
Figure 12E:
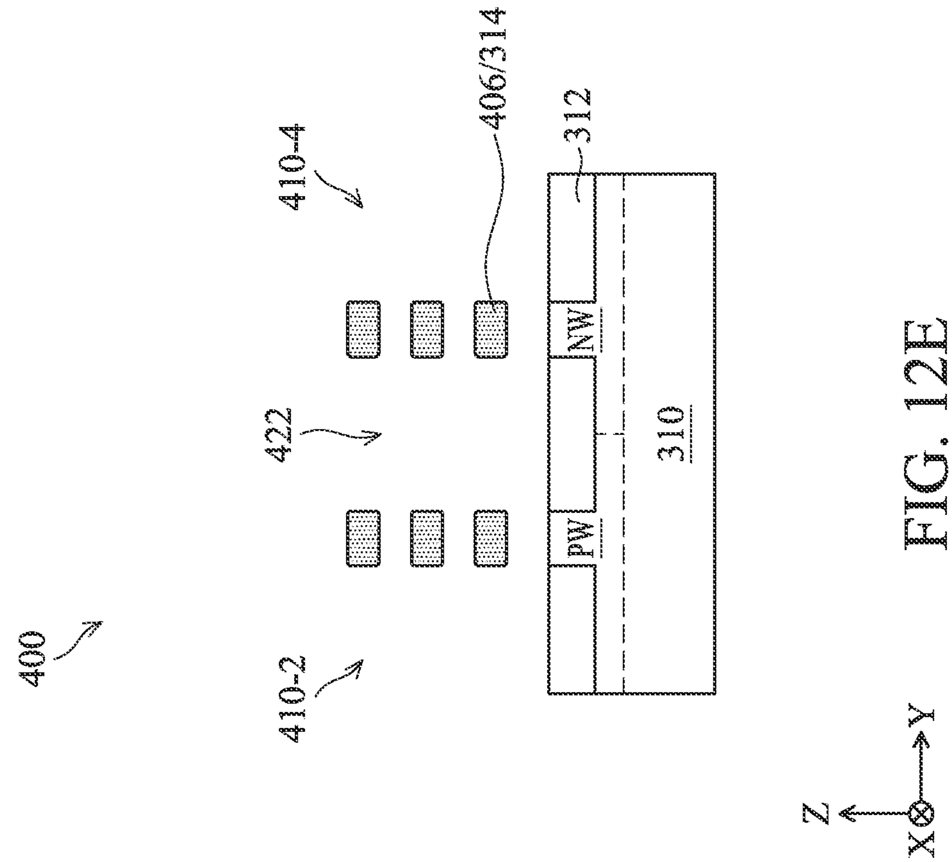
Figure 12D:
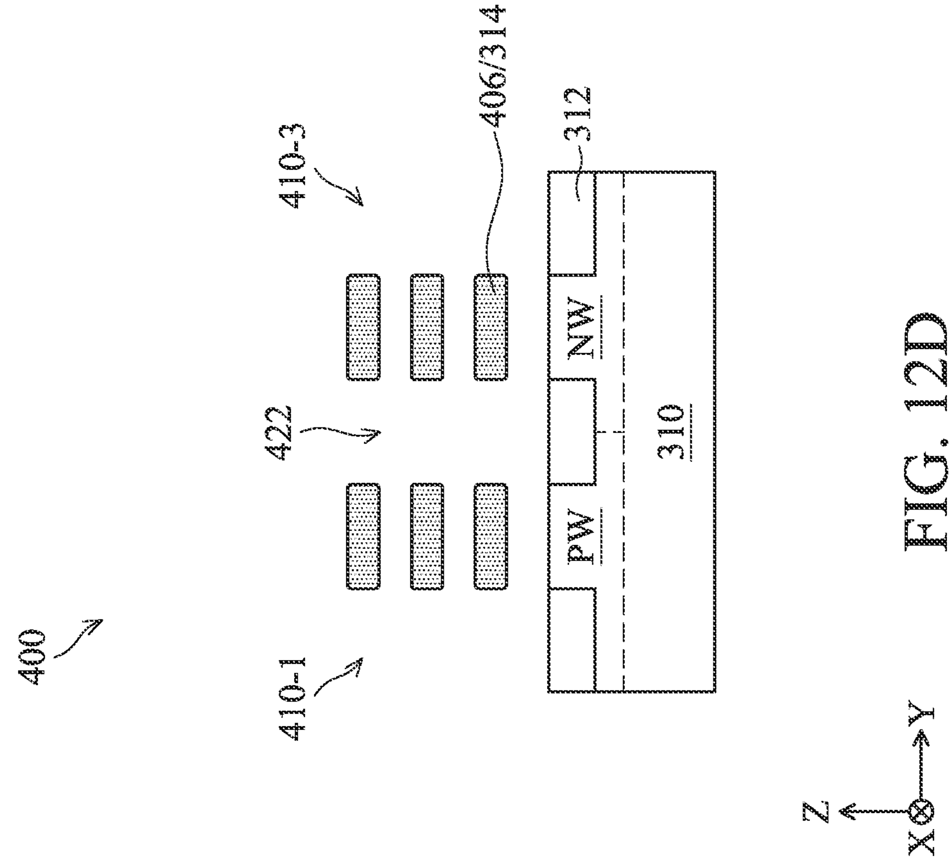
Figure 12G:
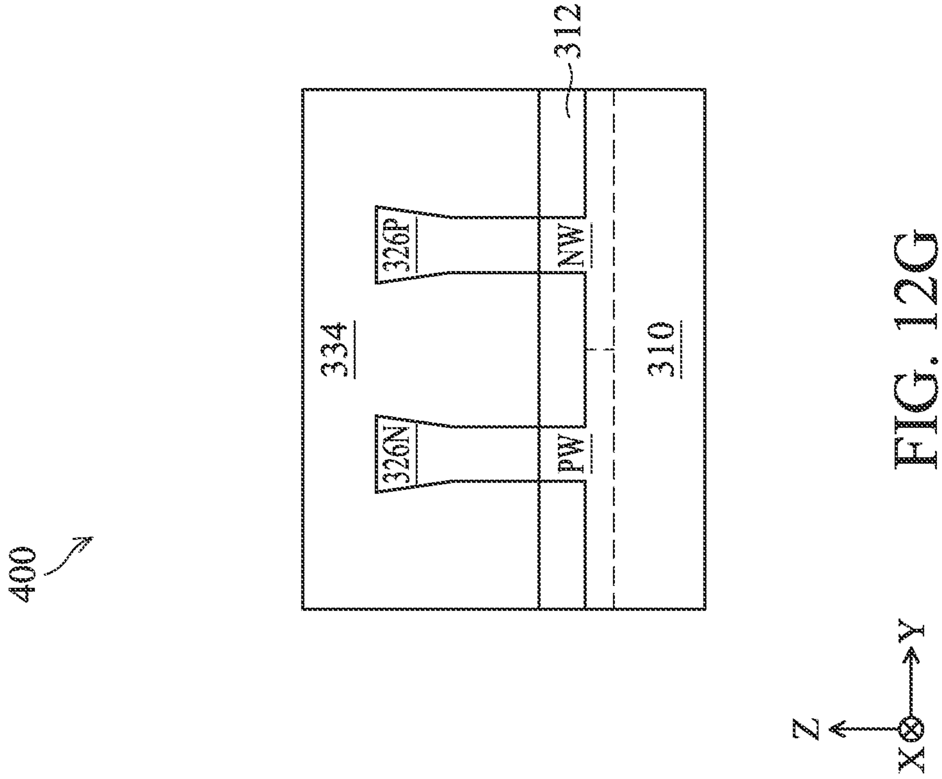
Figure 12F:
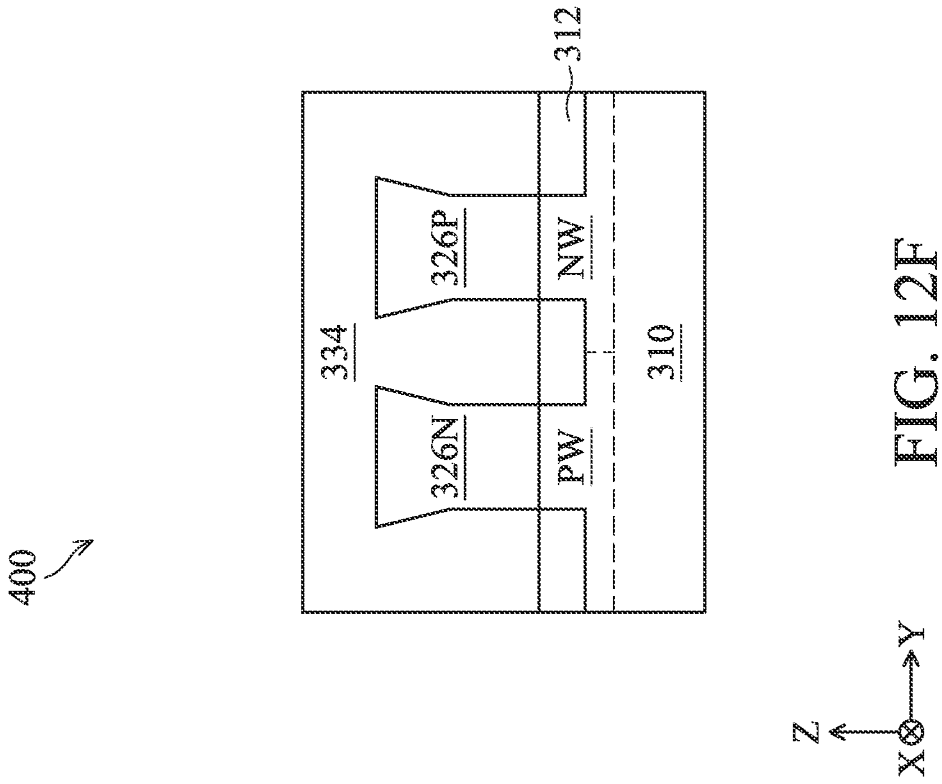

Still referring to FIGS. 11A to 11G, the source/drain features 326N/326P discussed above are formed in the source/drain trenches 418. The source/drain features 326N/326P are also formed on opposite sides of the dummy gate structures 412 in the X-direction, as shown in FIGS. 11A to 11C. One or more epitaxy processes may be employed to grow the source/drain features 326N/326P. Epitaxy processes can implement CVD deposition techniques (for example, vapor-phase epitaxy (VPE), UHVCVD, LPCVD, and/or PECVD), molecular beam epitaxy, other suitable SEG processes, or a combination thereof. One or more annealing processes may be performed to activate the dopants in the source/drain features 326N/326P. The annealing processes may include rapid thermal annealing (RTA) and/or laser annealing processes.

Still referring to FIGS. 11A to 11G, after the formation of the source/drain features 326N/326P, the ILD layer 334 discussed above is formed to fill the space between the gate spacers 322. The ILD layer 334 may be formed by PECVD (plasma enhanced CVD), FCVD (flowable CVD), or other suitable methods. Subsequent to the formation of the ILD layer 334, a CMP process and/or other planarization process is performed on the ILD layer 334 until the top surfaces of the dummy gate structures 412 are exposed.

In some embodiments, before the formation of the ILD layer 334, a contact etch stop layer (CESL) may be conformally formed on the sidewalls of the gate spacers 322 and over the top surfaces of the source/drain features 326N/326P. The ILD layer 334 is then formed over and between the CESL to fill the space between the CESL. The CESL includes a material that is different than the ILD layer 334. The CESL may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods.

Referring to FIGS. 12A to 12G, remaining portions of the dummy gate structures 412 (the dummy gate structures 412-2, 412-3, and 412-5) are selectively removed through any suitable lithography and etching processes. In some embodiments, the lithography process may include forming a photoresist layer (resist), exposing the resist to a pattern, performing a post-exposure bake process, and developing the resist to form a masking element, which exposes a region including the dummy gate structures 412. Then, the dummy gate structures 412 are selectively etched through the masking element. Etch selectivity may be achieved by selecting the appropriate etching chemicals, and the dummy gate structures 412 may be removed without substantially affecting the gate spacers 322, the inner spacers 324, and the substrate 310. The removal of the dummy gate structures 412 creates gate trenches 422. The gate trenches 422 expose the top surfaces of the topmost semiconductor layers 406 underlies the dummy gate structures 412.

Figure 8F:
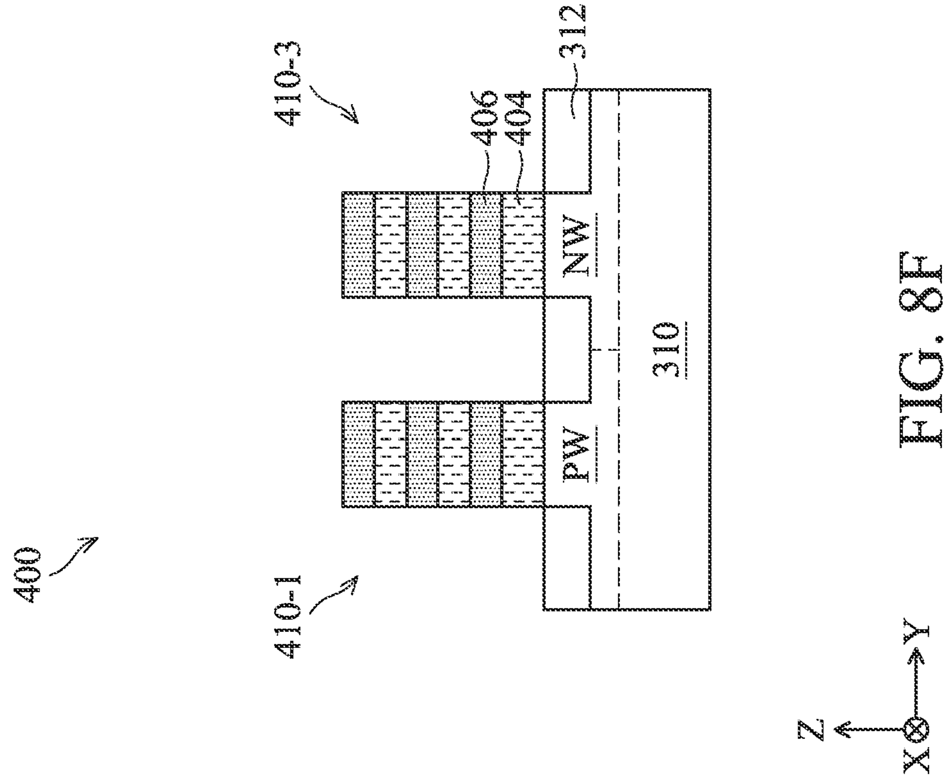

Still referring to FIG. 8F, the semiconductor layers 404 in the fins 410 are selectively removed through the gate trenches 422, using a wet or dry etching process for example, so that the semiconductor layers 406 in the fins 410 are exposed in the gate trenches 422 to form the nanostructures 314 discussed above. Such a process may also be referred to as a wire release process, a nanowire release process, a nanosheet release process, a nanowire formation process, a nanosheet formation process, or a wire formation process. In some embodiments, the removal of the semiconductor layers 404 causes the exposed semiconductor layers 406 (the nanostructures 314) to be spaced apart from each other in the vertical direction (e.g., in the Z-direction). The exposed semiconductor layers 406 extend longitudinally in the horizontal direction (e.g., in the X-direction), and each connects one source/drain feature 326N/326P to another source/drain feature 326N/326P.

As discussed above, the nanostructures 314 in the circuit cell 302-2 has thinner thickness. The semiconductor layers 406 exposed by the gate trenches 422 in the fins 410-2 and 410-4 are partially removed to achieve the thinner thickness. In some embodiments, after the removal of the semiconductor layers 404, one or more lithography and etching processes may be performed to partially removing the semiconductor layers 406 exposed by the gate trenches 422 in the fins 410-2 and 410-4. In this embodiments, the semiconductor layers 406 exposed by the gate trenches 422 in the fins 410-1 and 410-3 are covered (by hard mask or photoresist) to prevent from being etched.

In other embodiments, the semiconductor layers 406 exposed by the gate trenches 422 in the fins 410-2 and 410-4 are partially removed during the removal of the semiconductor layers 404. In other words, the partially removing of the semiconductor layers 406 exposed by the gate trenches 422 in the fins 410-2 and 410-4 and the removal of the dummy gate structures 412 and the semiconductor layers 404 in the fins 410-1 to 410-4 are performed in the same process. Because the fins 410-2 and 410-4 have narrower width W3' and W4', the semiconductor layers 404 in the fins 410-2 and 410-4 will be etched faster than the semiconductor layers 404 in the fins 410-1 and 410-3. Therefore, the semiconductor layers 406 exposed by the gate trenches 422 in the fins 410-2 and 410-4 will continue to be partially etched while the semiconductor layers 404 exposed by the gate trenches 422 in the fins 410-1 and 410-3 are etched. This causes the semiconductor layers 406 exposed by the gate trenches 422 in the fins 410-2 and 410-4 has thinner thickness to achieve the thinner thickness nanostructures 314 discussed above.

Referring to FIGS. 13A to 13G, the gate structures 306 discussed above are formed in the gate trenches 422 to wrap around the semiconductor layers 406 (the nanostructures 314). The gate structures 306 each includes the gate dielectric layer 316 and the gate electrode 318 over the gate dielectric layer 316, as discussed above. In some embodiments, the gate dielectric layers 316 are formed to wrap around each of the semiconductor layers 406 (the nanostructures 314). Additionally, the gate dielectric layers 316 are also formed on sidewalls of the inner spacers 324 and the gate spacers 322.

The gate electrodes 318 are then formed to fill the remaining spaces of the gate trenches 422, and over the gate dielectric layers 316 in such a way that the gate electrodes 318 each wraps around the semiconductor layers 406 (the nanostructures 314), the gate dielectric layer 316, and the interfacial layers (if present). The gate electrodes 318, the gate dielectric layers 316, and the interfacial layers (if present) may be collectively called as the gate structures 306 wrapping around the semiconductor layers 406 (the nanostructures 314), as discussed above. As result, after the formation of the gate structures 306, the N-type transistors NT1 to NT3 and the P-type transistors PT1 to PT3 for the circuit cells 302-1 and 302-2 discussed above are completed.

Figure 13A:
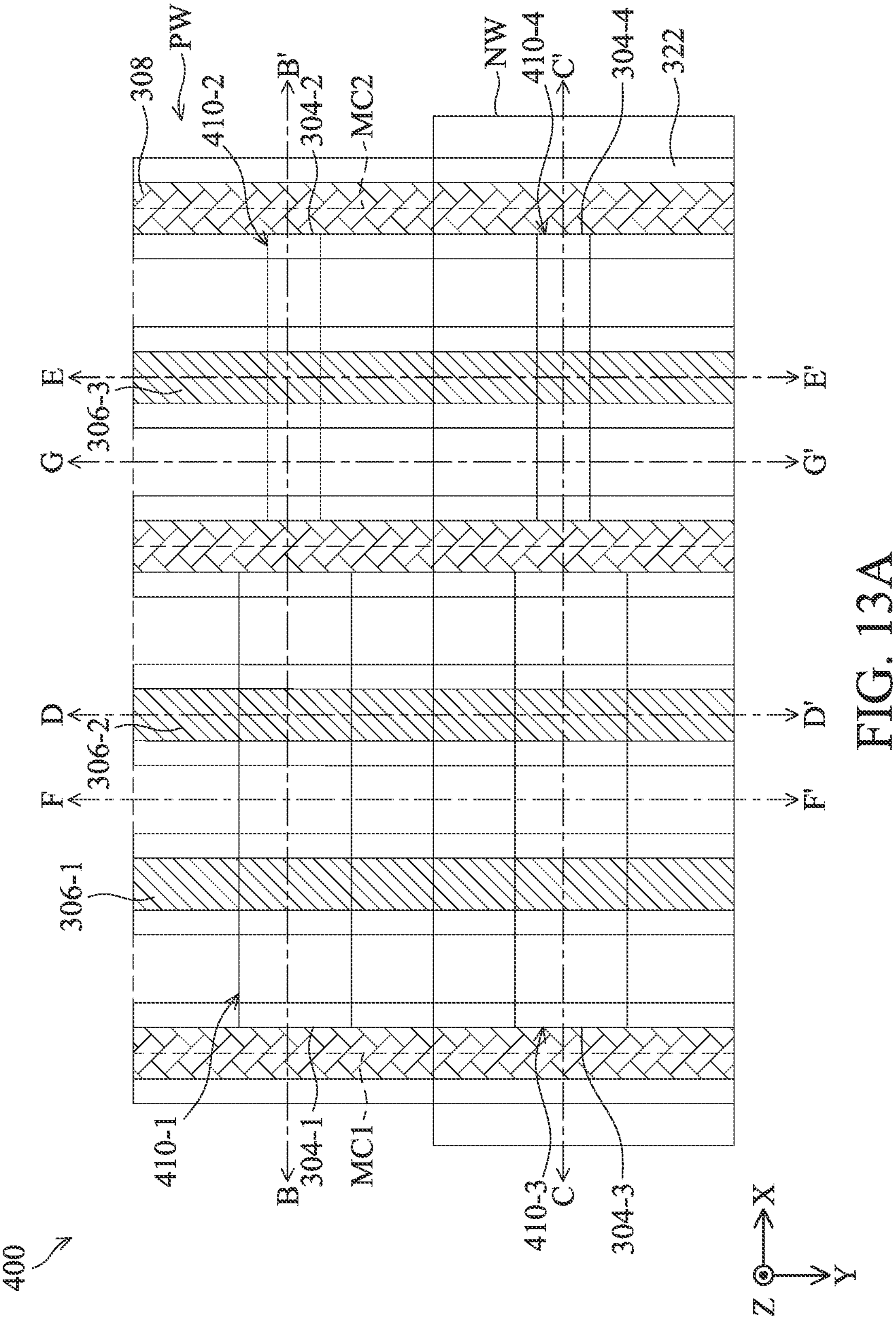
Figure 13B:
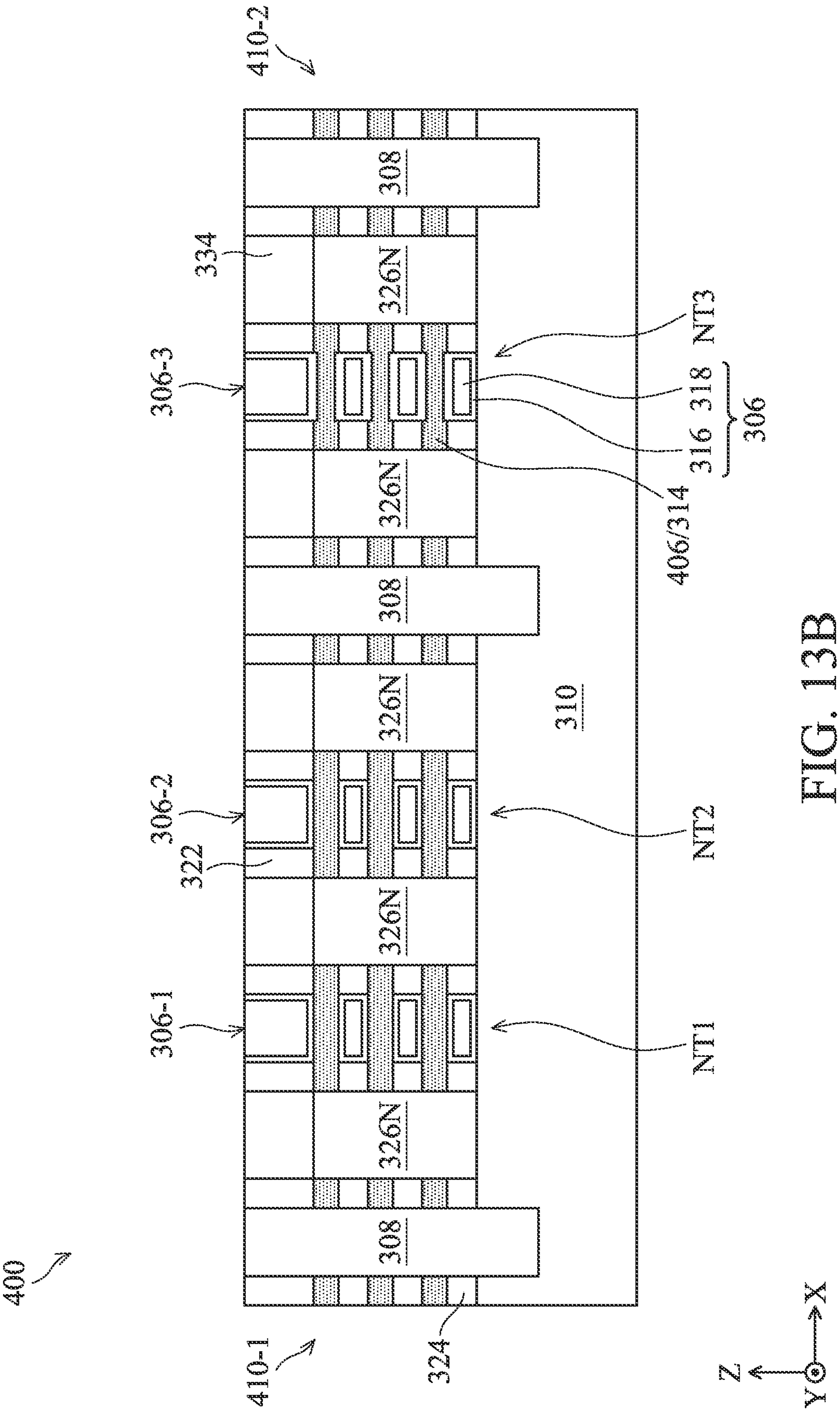
Figure 13C:
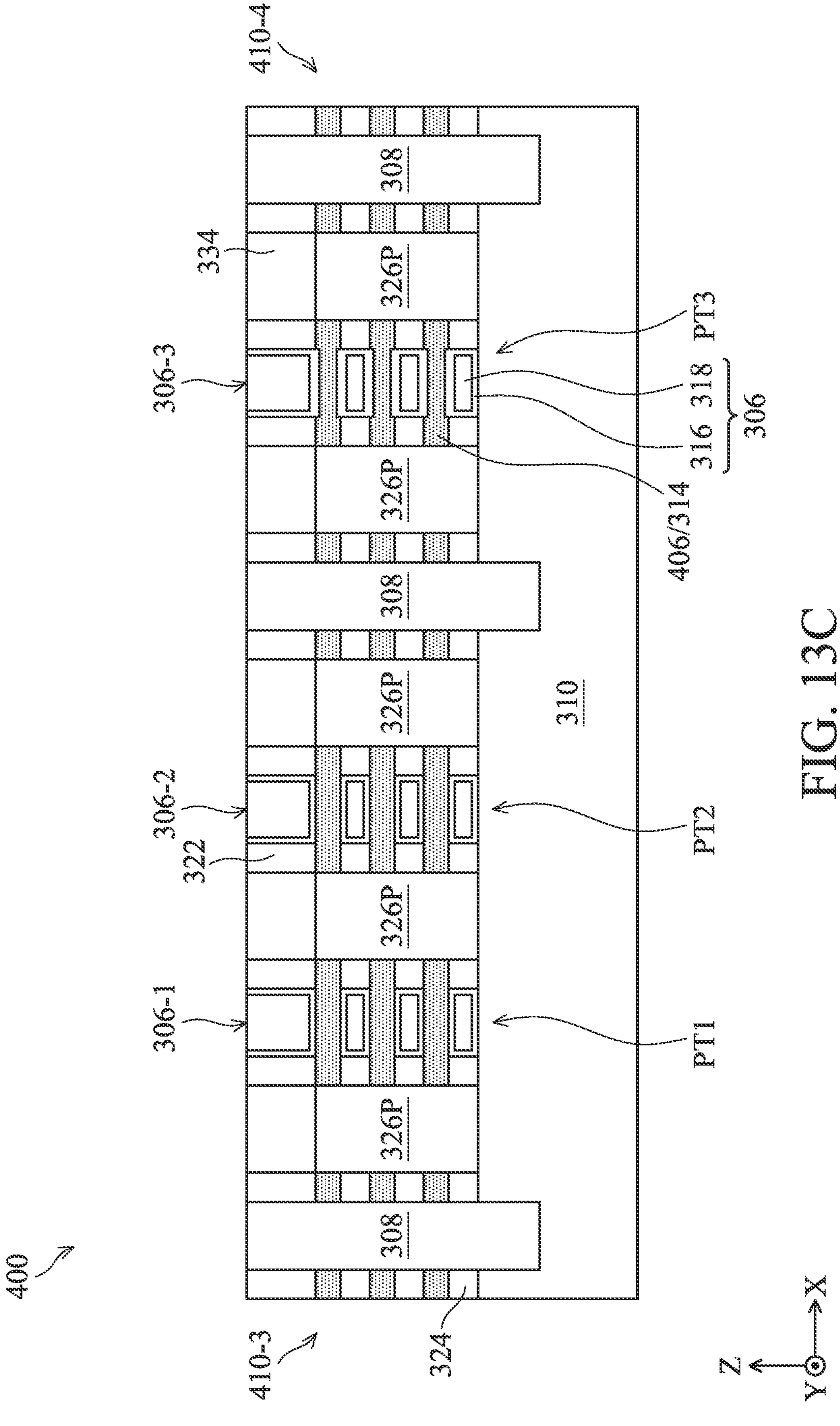
Figure 13E:
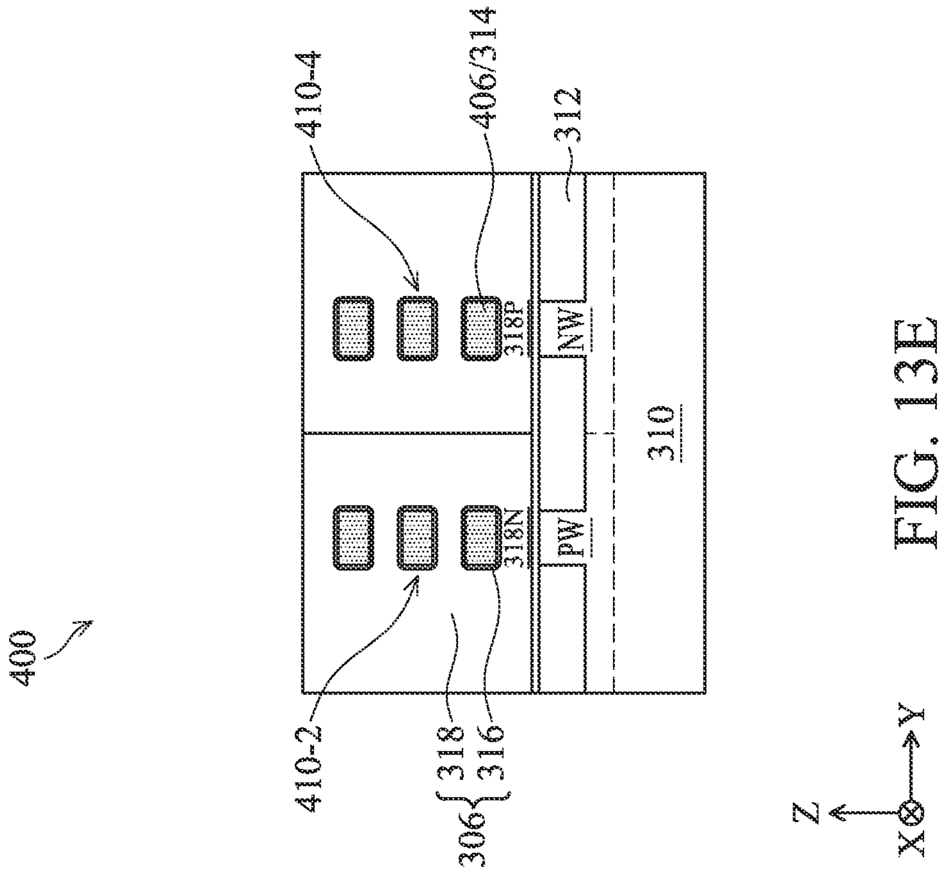
Figure 13D:
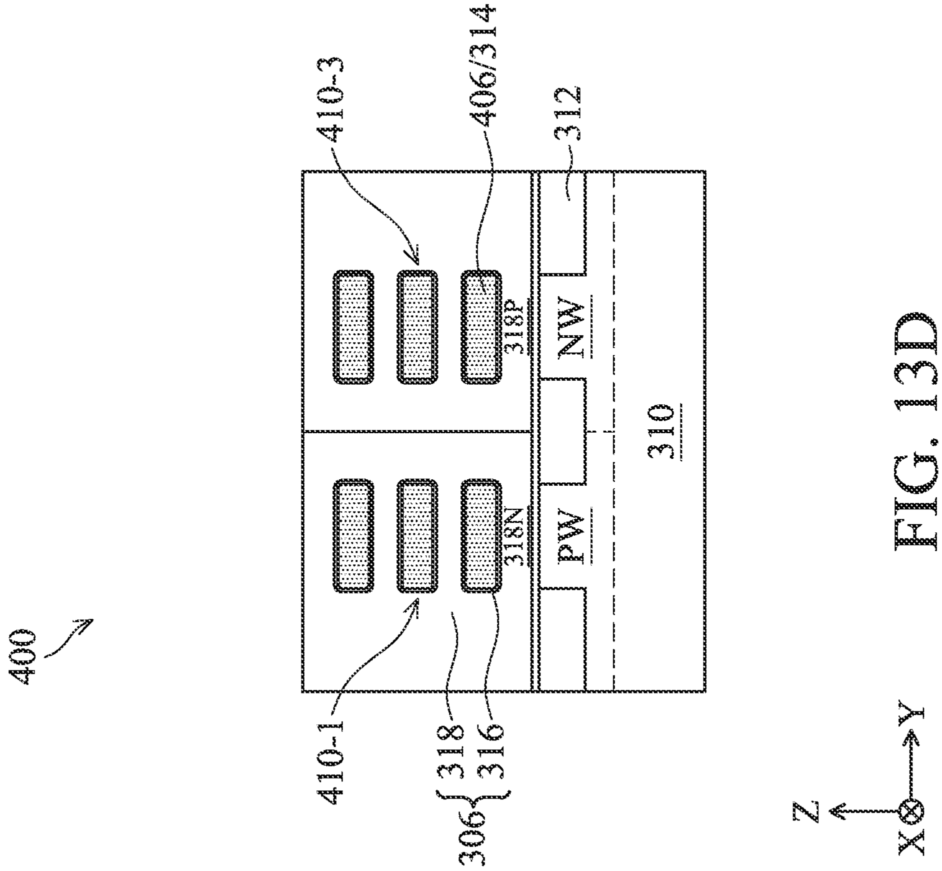
Figure 13G:
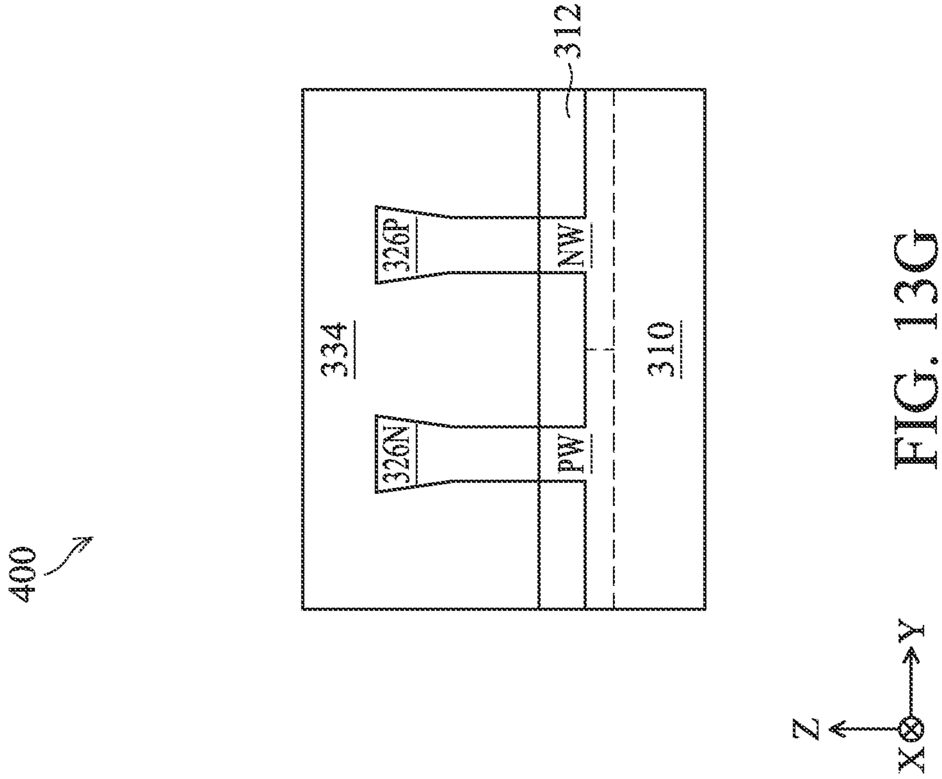
Figure 13F:
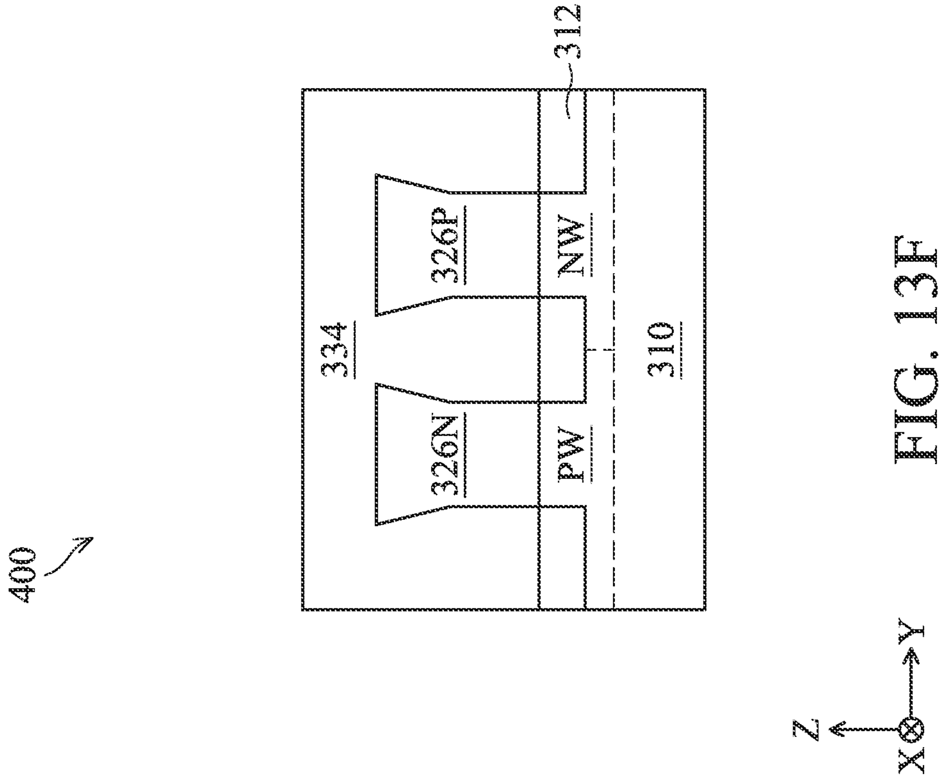
Figure 14A:
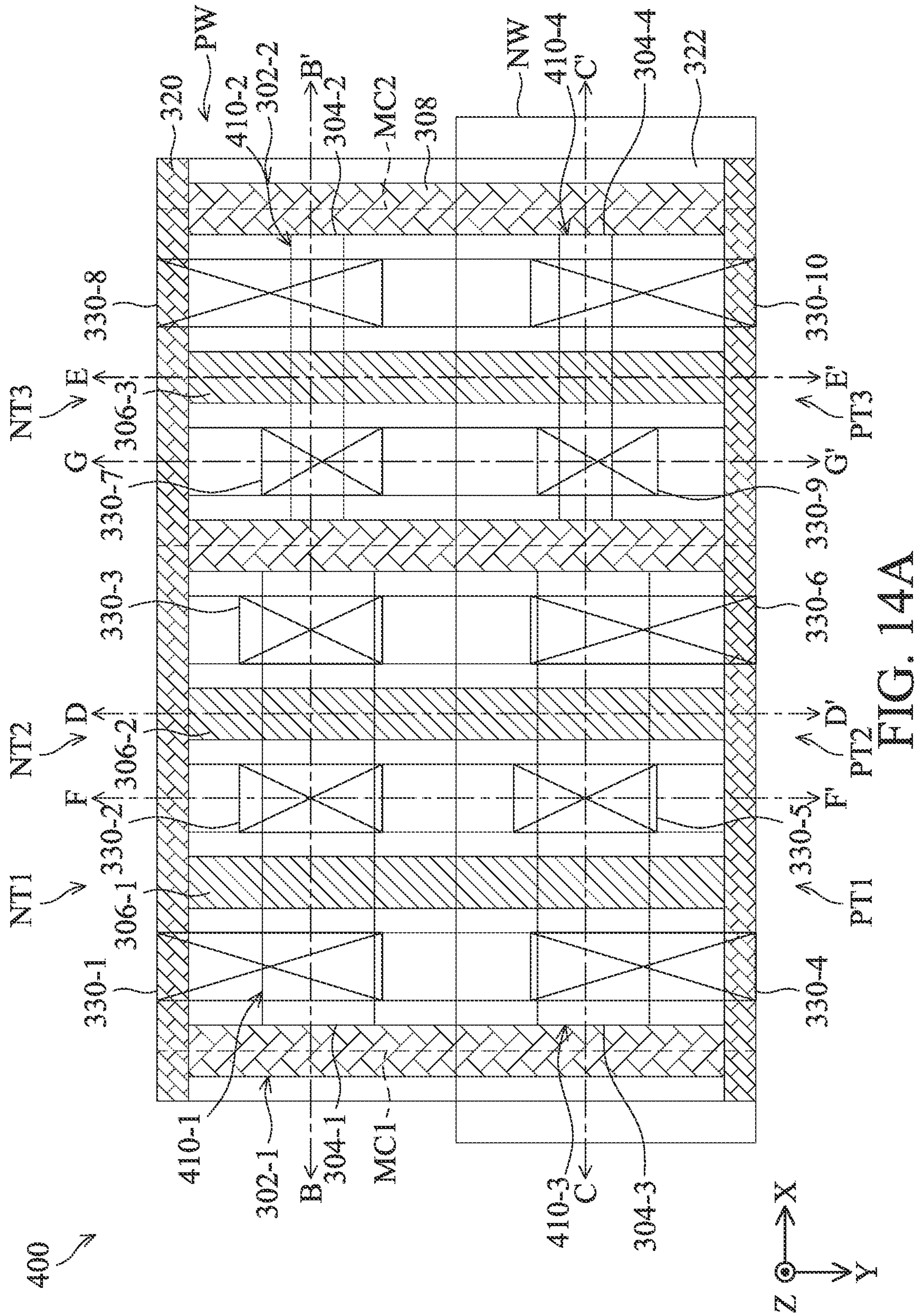
Figure 14B:
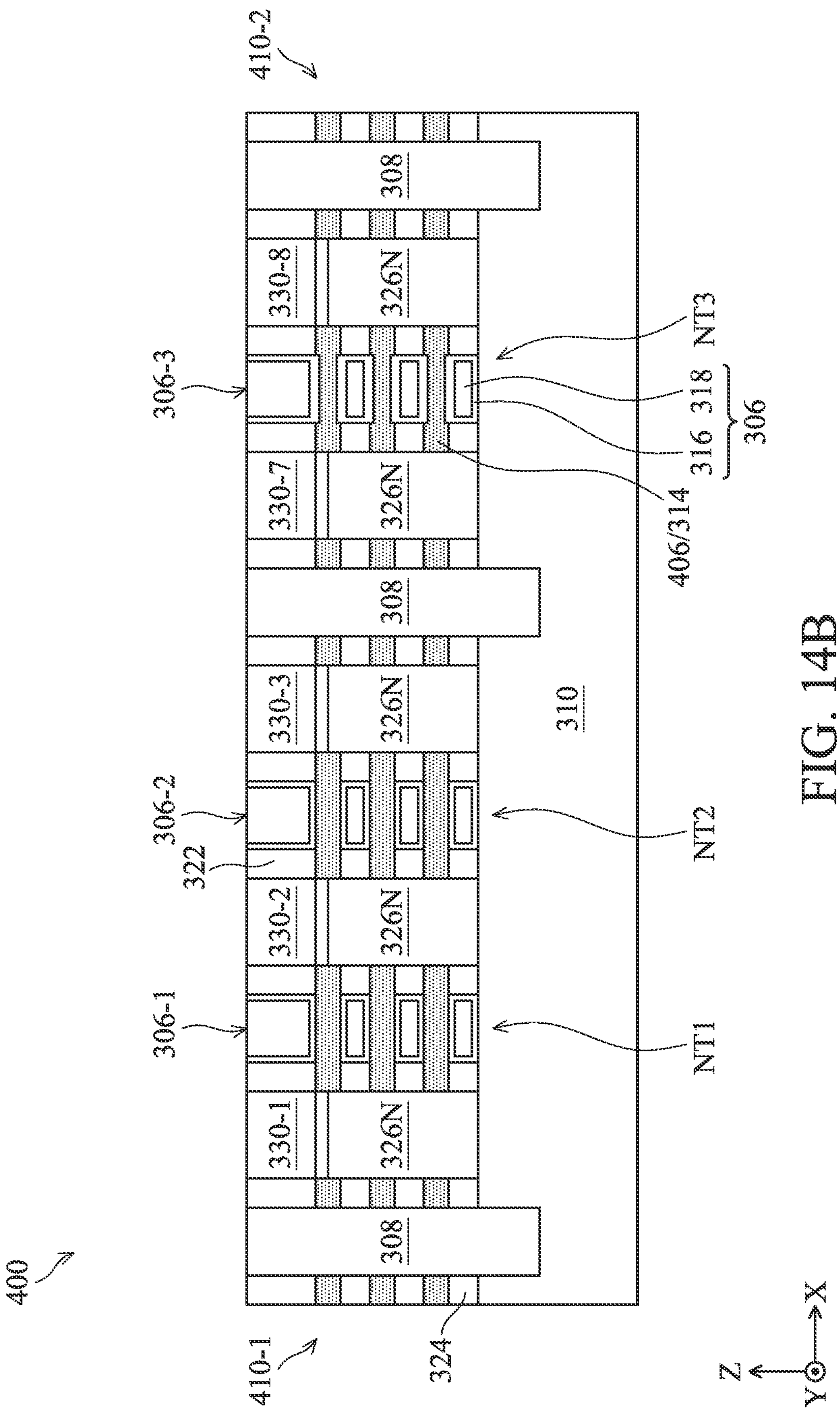
Figure 14C:
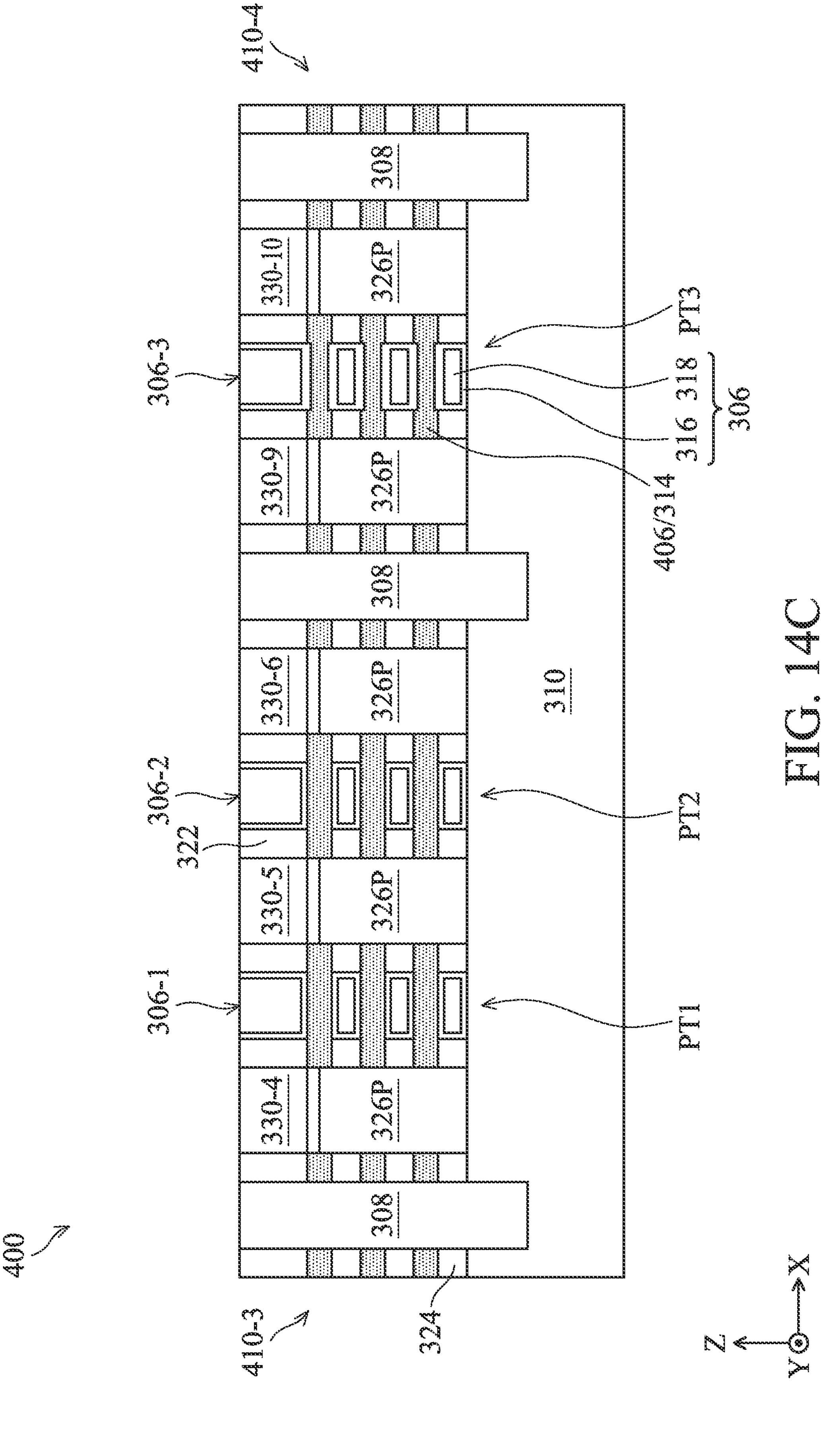
Figure 14E:
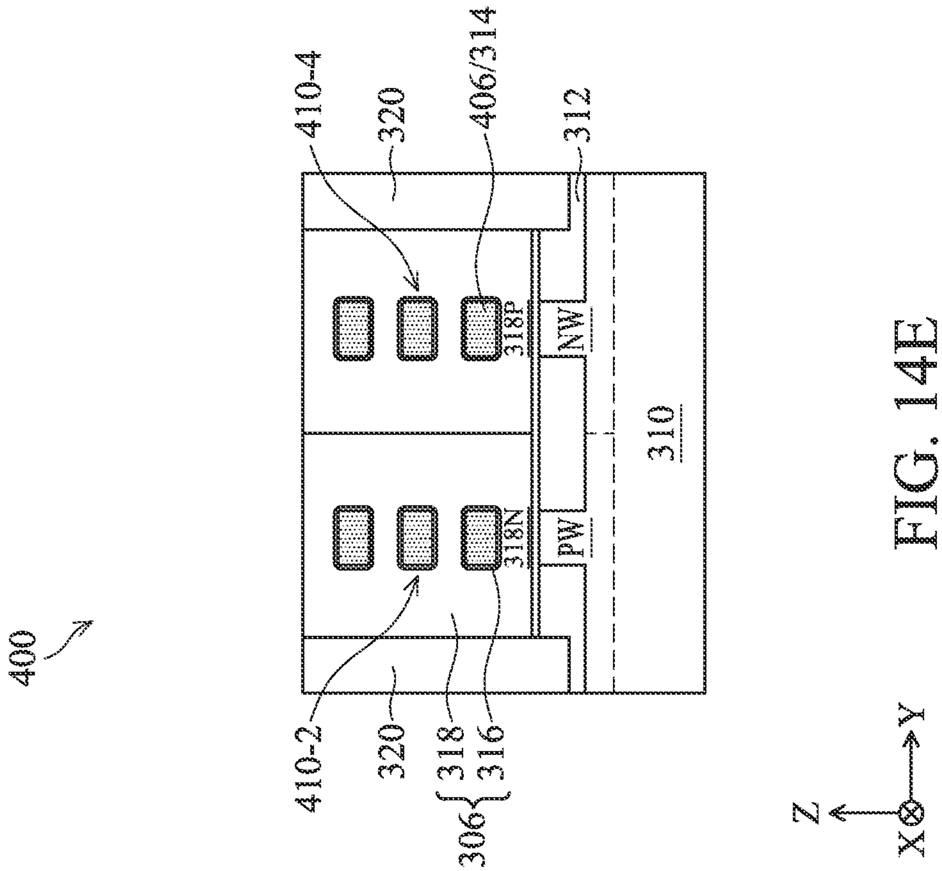
Figure 14D:
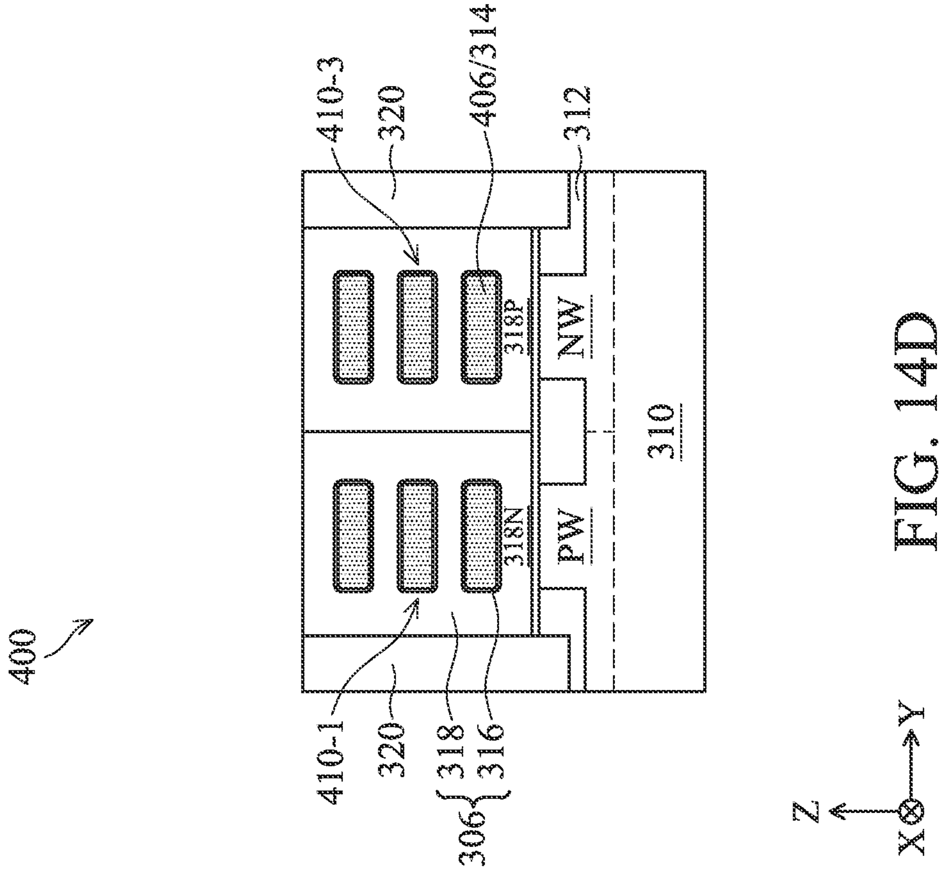
Figure 14G:
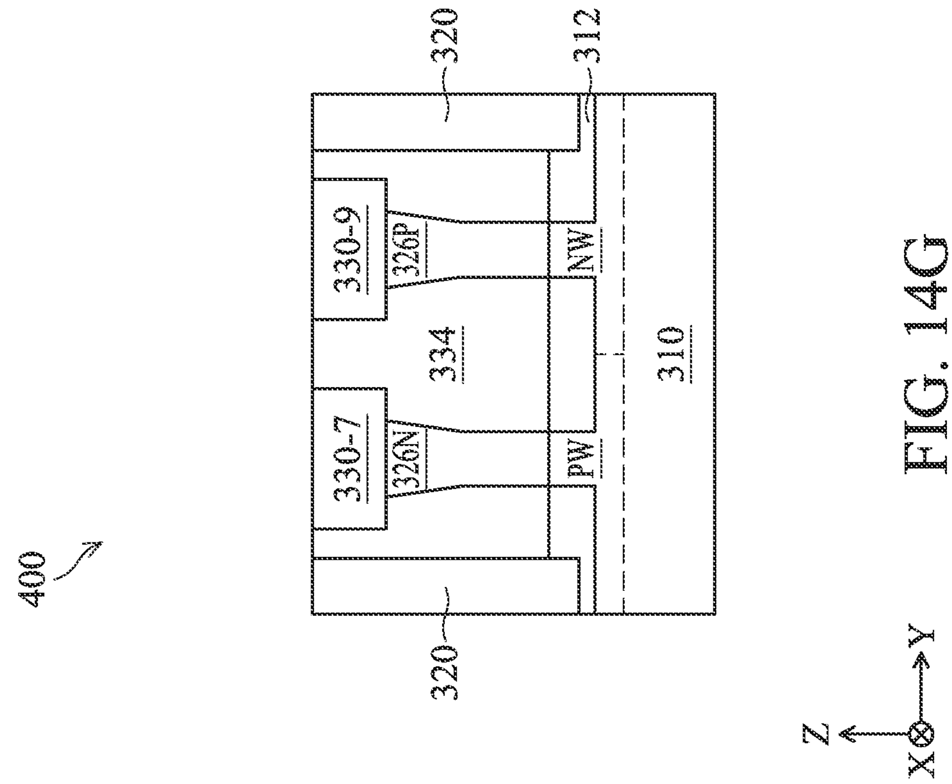
Figure 14F:
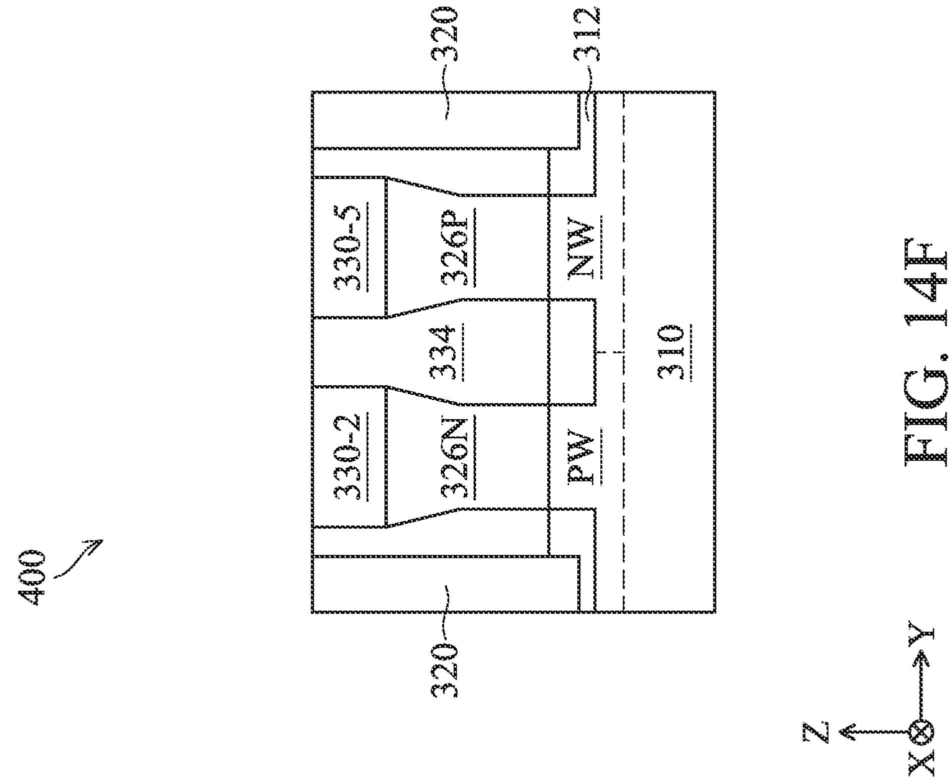

Furthermore, as discussed above, since the semiconductor layers 406 of the fins 410-2 and 410-4 has thinner thickness than the semiconductor layers 406 of the fins 410-1 and 410-3, a distance between the semiconductor layers 406 of the fins 410-2 and 410-4 (i.e., the distances S3 and S4) in the Z-direction is greater than a distance between the semiconductor layers 406 of the fins 410-2 and 410-4 (i.e., the distances S1 and S2) in the Z-direction. Therefore, a thickness of first portions of the gate structures 306 between the semiconductor layers 406 of the fins 410-2 and 410-4 in the Z-direction is greater than a thickness of second portions of the gate structures 306 between the semiconductor layers 406 of the fins 410-1 and 410-3 in the Z-direction, as shown in FIGS. 13D and 13E.

Referring to FIGS. 14A to 14G, the gate end dielectric structures 320 discussed above are formed. The gate end dielectric structures 320 are formed on opposite sides of the gate structures 306 and the dielectric gate structures 308 in the Y-direction to separate the gate structures 306 and/or the dielectric gate structures 308 from gate structures and/or dielectric gate structures of other circuit cells (not shown) in other rows. Still referring to FIGS. 14A to 14G, the silicide features 328 and source/drain contacts 330 discussed above are formed over the source/drain features 326N/326P. The silicide features 328 and source/drain contacts 330 are also formed in the ILD layer 334. The ILD 336, the IMD layer 338, the vias VD, and the gate vias VG are formed after the formation of the silicide features 328 and source/drain contacts 330, as shown in FIGS. 5A to 5G. As such, the array 300 of the circuit cells 302-1 and 302-2 discussed above is completed.

Figure 15A:
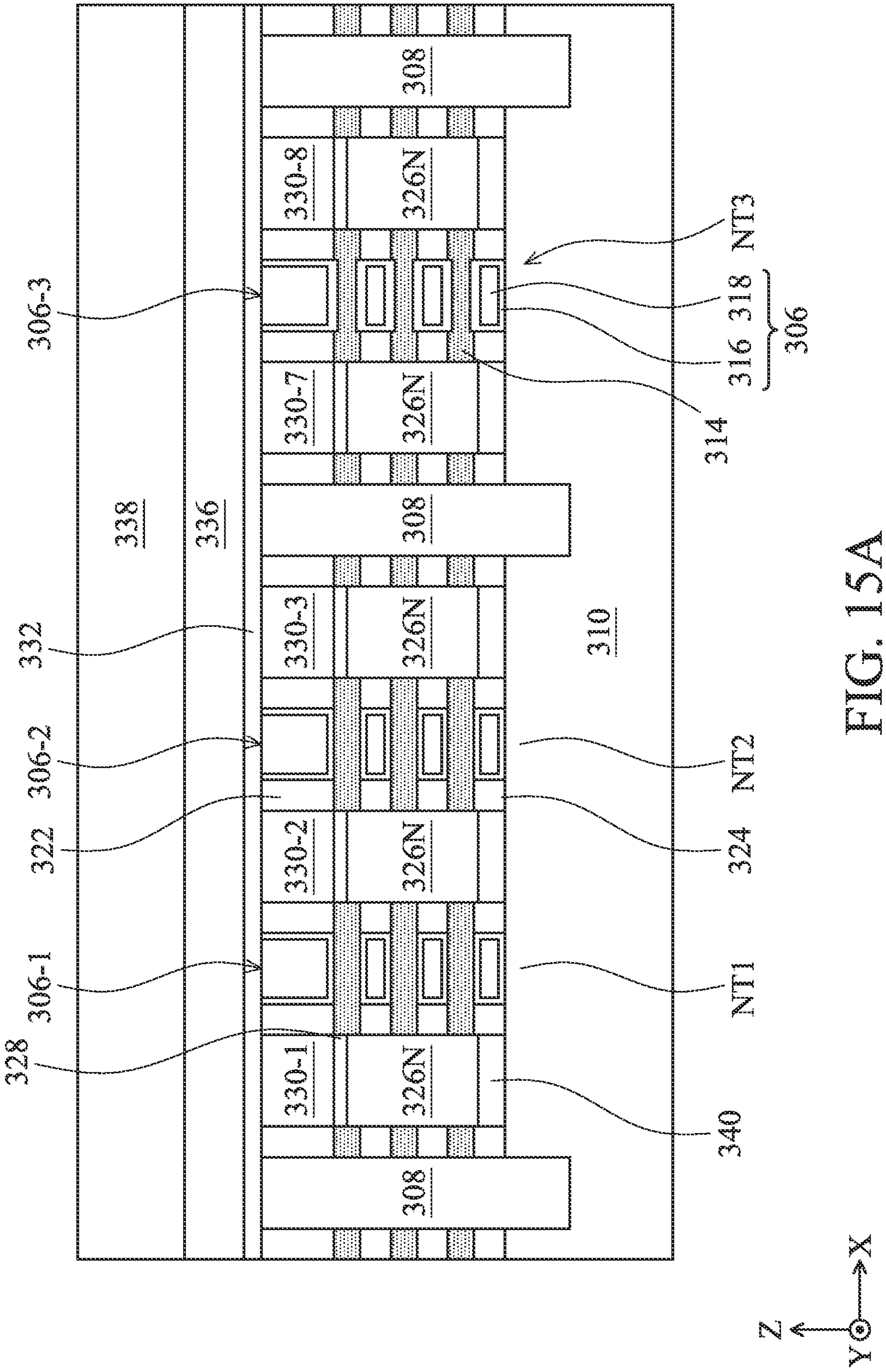
FIGS. 15A and 15B illustrate X-Z cross-sectional views of the array of the circuit cells along the lines B-B' and C-C' of FIG. 5A, respectively, in accordance with some alternative embodiments of the present disclosure.
Figure 15B:
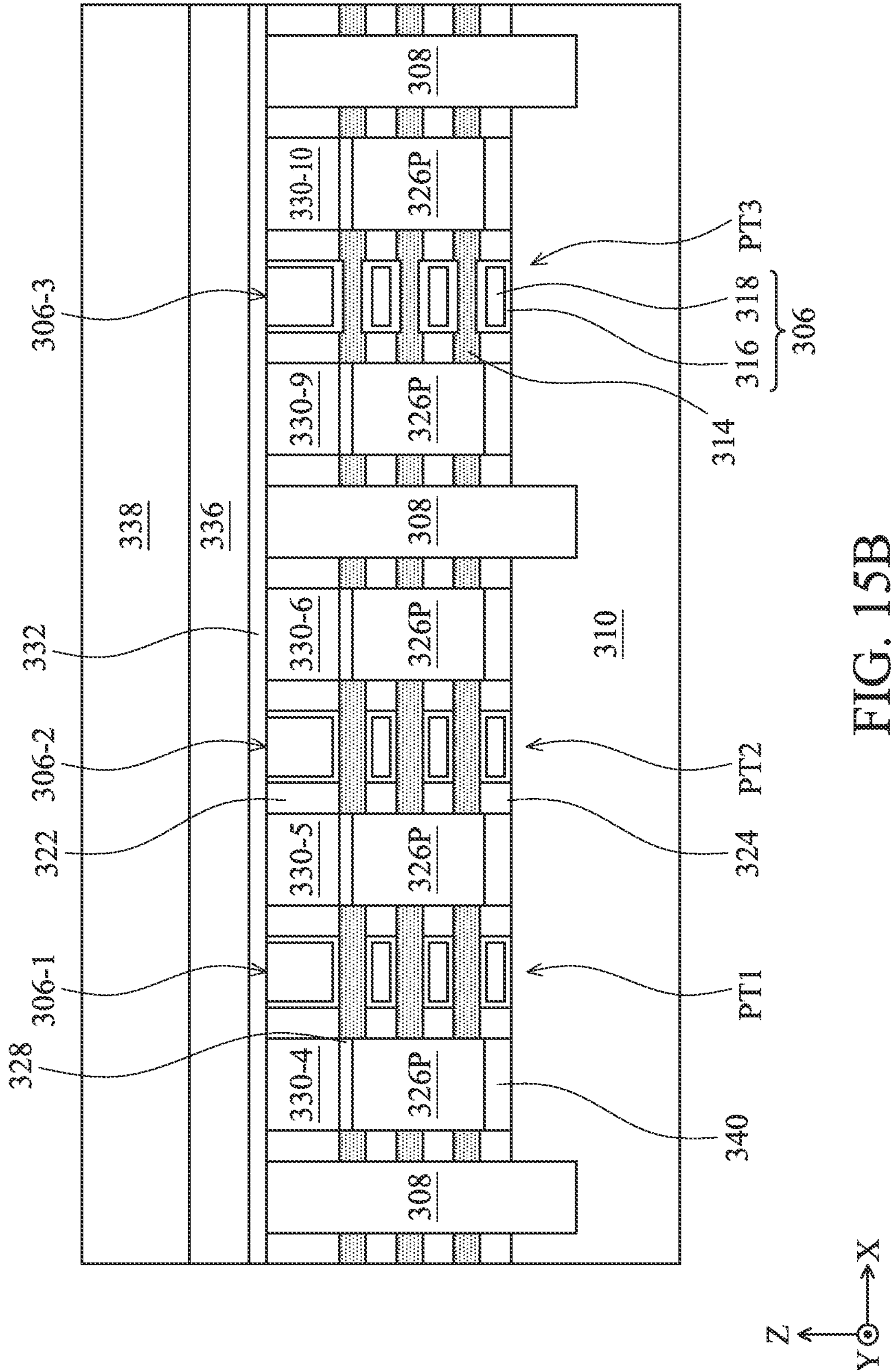

FIGS. 15A and 15B illustrate X-Z cross-sectional views of the array 300 of the circuit cells 302-1 and 302-2 along the lines B-B' and C-C' of FIG. 5A, respectively, in accordance with some alternative embodiments of the present disclosure. Referring back to FIGS. 5B and 5C, the source/drain features 326N and 326P are formed over and in contact with the substrate 310. In some embodiments, the array 300 further includes bottom dielectric layers 340 under the source/drain features 326N and 326P and over the substrate 310. In some embodiment, the bottom dielectric layer 340 is in contact with the sidewalls of the inner spacers 324, in the X-Z cross-sectional view, as shown in FIGS. 15A and 15B. In some aspect, the bottom dielectric layer 340 is in contact with and between the inner spacers 324, in the X-Z cross-sectional view. The bottom dielectric layers 340 are formed before the formation of the source/drain features 326N and 326P. More specifically, after the formation of the inner spacers 324 shown in FIGS. 10B and 10C, the bottom dielectric layers 340 are formed in the source/drain trenches 418 and over the substrate 310, and the source/drain features 326N and 326P are then formed in the source/drain trenches 418 and over the bottom dielectric layers 340.

In some embodiments, the dielectric material of the bottom dielectric layer 340 may include silicon nitride ($Si_3N_4$), silicon oxide ($SiO_2$), silicon carbide (SiC), silicon oxycarbide (SiOC), silicon oxynitride (SiON), silicon carbon nitride (SiCN), silicon oxycarbon nitride (SiOCN), other suitable material(s), or a combination thereof, and may be deposited by CVD, PVD, ALD, HDPCVD, MOCVD, RPCVD, PECVD, LPCVD, ALCVD, APCVD, other suitable methods, or a combination thereof.

It should be noted that the source/drain features 326N and 326P are separated from the substrate 310 by the bottom dielectric layers 340. As such, it prevents the leakage current of the resultant transistors from one source/drain feature 326N/326P to another source/drain feature 326N/326P through the substrate 310, thereby improving performances of the resultant transistors.

Figure 16B:
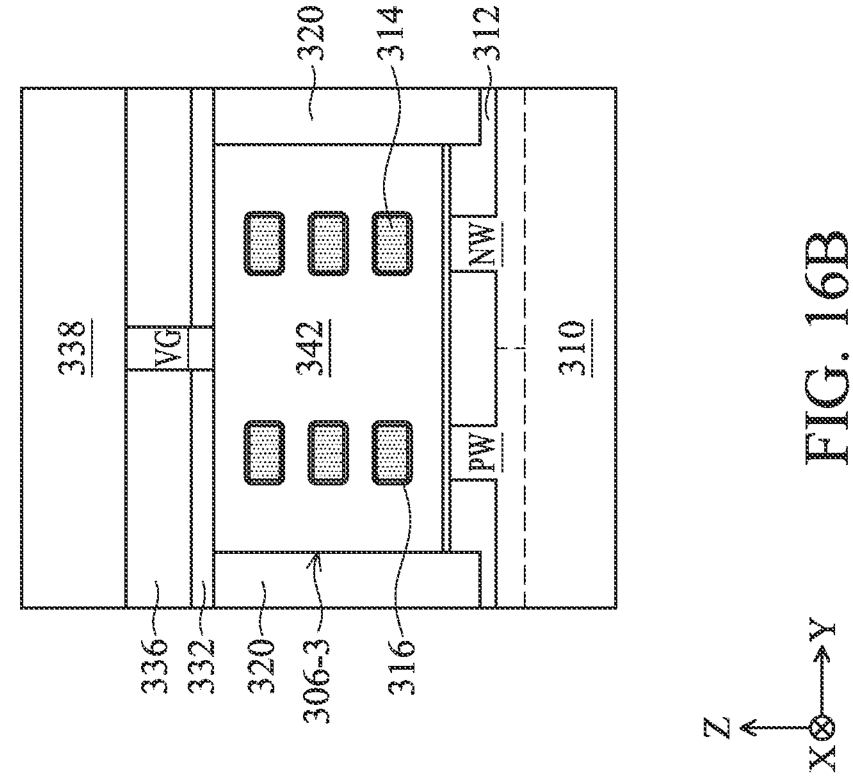
FIGS. 16A and 16B illustrate Y-Z cross-sectional views of the array of the circuit cells along the lines D-D' and E-E' of FIG. 5A, respectively, in accordance with some alternative embodiments of the present disclosure.
Figure 16A:
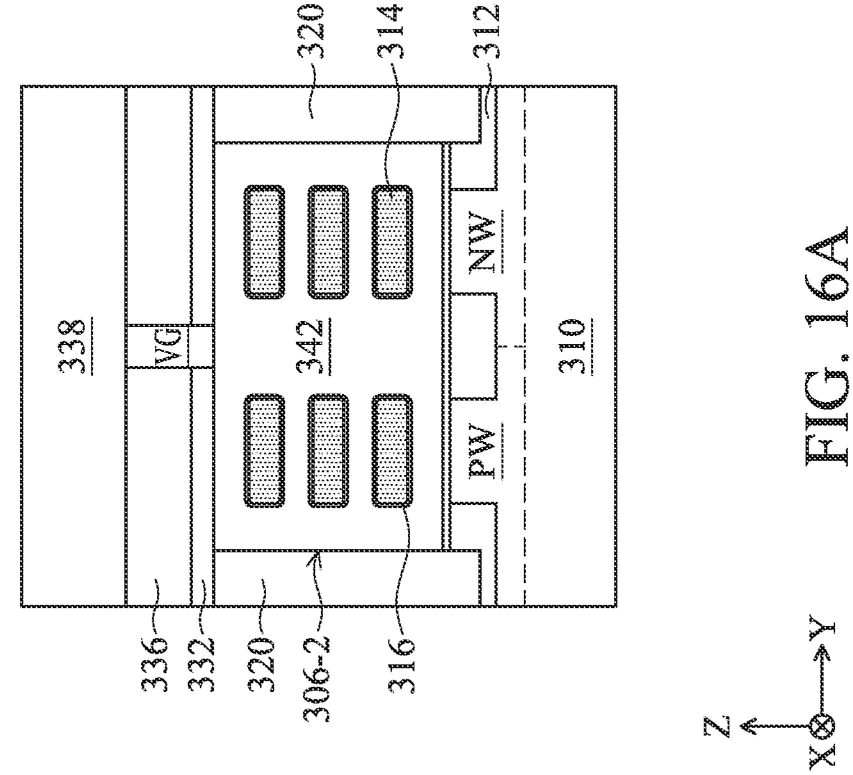

FIGS. 16A and 16B illustrate Y-Z cross-sectional views of the array of the circuit cells along the lines D-D' and E-E' of FIG. 5A, respectively, in accordance with some alternative embodiments of the present disclosure. Referring back to FIGS. 5D and 5E, each of the gate electrodes 318 of the gate structures 306 includes the N-type work function metal layer 318N and the P-type work function metal layer 318P wrapping around the nanostructures 314. In such embodiment, the materials of the N-type work function metal layer 318N and P-type work function metal layer 318P are different. In some embodiments, the materials of the N-type work function metal layer 318N and P-type work function metal layer 318P are the same. More specifically, as shown in FIGS. 16A and 16B, each of the gate electrodes 318 of the gate structures 306 includes a single work function metal layer 342 wrapping around the nanostructures 314 of one N-type transistor and one P-type transistor. The material of the work function metal layer 342 is selected from the materials of the N-type work function metal layer 318N and the P-type work function metal layer 318P discussed above.

The embodiments disclosed herein relate to semiconductor devices, and more particularly to semiconductor devices including an array of circuit cells with transistors having different channel widths and channel thicknesses for different application, such that the device benefits are maximized. Furthermore, the present embodiments provide one or more of the following advantages. The circuit cells with transistors having narrower width and thinner thickness nanostructures may have stronger gate control to nanostructures, such that the drain induced barrier lowering (DIBL) effect and swing effect are reduced. As such, the circuit cells with transistors having narrower width and thinner thickness nanostructures are used for low power application. Furthermore, the circuit cells with transistors having wider width and thicker thickness nanostructures may have larger electron transport speed. Therefore, the circuit cells with transistors having wider width and thicker thickness nanostructures are used for high speed application. The circuit cells for different applications can be designed in a single array to provide a design flexibility on speed/power optimization.

Thus, one of the embodiments of the present disclosure describes a semiconductor device that includes a first circuit cell having first transistors and a second circuit cell having second transistors and arranged with the first circuit cell in an X-direction. Each of the first transistors includes first nanostructures vertically stacked from each other in a Z-direction. Each of the second transistors includes second nanostructures vertically stacked from each other in the Z-direction. A first thickness of the first nanostructures in the Z-direction is greater than a second thickness of the second nanostructures in the Z-direction. A first width of the first nanostructures in a Y-direction is greater than a second width of the second nanostructures in the Y-direction.

In some embodiments, each of the second nanostructures has a middle portion and side portions on opposite sides of the middle portion in the X-direction, wherein the middle portions have the second thickness and the side portions have the first thickness.

In some embodiments, semiconductor device further includes source/drain features on opposite sides of the first nanostructures and opposite sides of the second nanostructures, and bottom dielectric layers under the source/drain features.

In some embodiments, a length of the source/drain features in the first circuit cell in the Y-direction is greater than a length of the source/drain features in the second circuit cell in the Y-direction.

In some embodiments, the semiconductor device further includes dielectric structures extending in the Y-direction. The dielectric structures are arranged with the first circuit cell and the second circuit cell in the X-direction to electrically isolate the first circuit cell and the second circuit cell from each other.

In some embodiments, a cell pitch of the first circuit cell and a cell pitch of the second circuit cell in the Y-direction are the same.

In some embodiments, a first pitch of the first nanostructures in the Z-direction and a second pitch of the second nanostructures in the Z-direction are the same.

In some embodiments, wherein the second width is in a range from about 5 nm to about 30 nm.

In some embodiments, the second thickness is in a range from about 3 nm to about 7 nm.

In another of the embodiments, discussed is semiconductor device including a first circuit cell having a first cell pitch in a Y-direction and a second circuit cell having a second cell pitch in the Y-direction. The first circuit cell includes a first N-type transistor having first nanostructures vertically stacked from each other in a Z-direction, a first P-type transistor having second nanostructures vertically stacked from each other in the Z-direction, and a first gate structure extending in the Y-direction and wrapping around the first nanostructures and the second nanostructures. Each of the first nanostructures has a first thickness in the Z-direction and a first width in the Y-direction. Each of the second nanostructures has a second thickness in the Z-direction and a second width in the Y-direction. The second circuit cell includes a second N-type transistor having third nanostructures vertically stacked from each other in the Z-direction, a second P-type transistor having fourth nanostructures vertically stacked from each other in the Z-direction, and a second gate structure extending in the Y-direction and wrapping around the third nanostructures and the fourth nanostructures. Each of the third nanostructures has a third thickness in the Z-direction and a third width in the Y-direction. Each of the fourth nanostructures has a fourth thickness in the Z-direction and a fourth width in the Y-direction. The first width and the second width are respectively greater than the third width and the fourth width. The first thickness and the second thickness are respectively greater than the third thickness and the fourth thickness.

In some embodiments, each of the third nanostructures and the fourth nanostructures has a dumbbell-shape in an X-Z cross-sectional view.

In some embodiments, the first gate structure includes a first work function metal layer wrapping around the first nanostructures and a second work function metal layer wrapping around the first nanostructures. The second gate structure includes the first work function metal layer wrapping around the third nanostructures and the second work function metal layer wrapping around the fourth nanostructures. A material of the second work function metal layer is different from a material of the first work function metal layer.

In some embodiments, the first gate structure comprises a single work function metal layer wrapping around the first nanostructures and the second nanostructures, and the second gate structure comprises the single work function metal layer wrapping around the third nanostructures and the fourth nanostructures.

In some embodiments, the semiconductor device further includes a dielectric structure extending in the Y-direction. The dielectric structure is between the first circuit cell and the second circuit cell in an X-direction to electrically isolate the first circuit cell from the second circuit cell.

In some embodiments, the first cell pitch and the second cell pitch are the same.

In some embodiments, the second thickness and the fourth thickness are respectively greater than the first thickness and the third thickness.

In yet another of the embodiments, discussed is a method for forming a semiconductor device including forming a first fin and a second fin over a substrate, wherein the first fin and the second fin extend in an X-direction and abut each other in the X-direction. A width of the first fin in a Y-direction is greater than a width of the second fin in the Y-direction. Each of the first fin and the second fin includes first semiconductor layers and second semiconductor layers alternating stacked in a Z-direction. The method further includes forming dummy gate structures extending in the Y-direction and over the first fin and the second fin, forming source/drain features on opposite sides of the dummy gate structures in the X-direction, removing first portions of the dummy gate structures and the first semiconductor layers in the first fin and the second fin to form gate trenches, partially removing the second semiconductor layers exposed by the gate trenches in the second fin, and forming gate structures wrapping around the second semiconductor layers in the gate trenches after the partially removing of the second semiconductor layers exposed by the gate trenches in the second fin. A first thickness of first portions of the gate structures between the second semiconductor layers of the second fin in the Z-direction is greater than a second thickness of second portions of the gate structures between the second semiconductor layers of the first fin in the Z-direction.

In some embodiments, the method further includes forming source/drain trenches on opposite sides of the dummy gate structures in the X-direction, forming bottom dielectric layers in the source/drain trenches and over the substrate, and forming the source/drain features in the source/drain trenches and over the bottom dielectric layers.

In some embodiments, the method further includes forming dielectric structures to replace second portions of the dummy gate structures and the first semiconductor layers and the second semiconductor layers in the first fin and the second fin.

In some embodiments, the partially removing of the second semiconductor layers exposed by the gate trenches in the second fin and the removing of the dummy gate structures and the first semiconductor layers in the first fin and the second fin are performed in the same process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:

forming a first fin and a second fin over a substrate, wherein the first fin and the second fin extend in a first direction and abut each other in the first direction, wherein a width of the first fin in a second direction different from the first direction is greater than a width of the second fin in the second direction, wherein each of the first fin and the second fin comprises first semiconductor layers and second semiconductor layers alternating stacked;

forming dummy gate structures extending in the second direction and over the first fin and the second fin;

forming source/drain features on opposite sides of the dummy gate structures in the first direction;

removing first portions of the dummy gate structures and the first semiconductor layers in the first fin and the second fin to form gate trenches;

partially removing the second semiconductor layers exposed by the gate trenches in the second fin; and forming gate structures wrapping around the second semiconductor layers in the gate trenches after the partially removing of the second semiconductor layers exposed by the gate trenches in the second fin, wherein a first thickness of first portions of the gate structures between the second semiconductor layers of the second fin is greater than a second thickness of second portions of the gate structures between the second semiconductor layers of the first fin.

2. The method of claim 1, further comprising:

forming source/drain trenches on opposite sides of the dummy gate structures in the first direction;

forming bottom dielectric layers in the source/drain trenches and over the substrate; and forming the source/drain features in the source/drain trenches and over the bottom dielectric layers.

3. The method of claim 1, further comprising:

forming dielectric structures to replace second portions of the dummy gate structures and the first semiconductor layers and the second semiconductor layers in the first fin and the second fin.

4. The method of claim 1, wherein the partially removing of the second semiconductor layers exposed by the gate trenches in the second fin and the removing of the dummy gate structures and the first semiconductor layers in the first fin and the second fin are performed in the same process.

5. The method of claim 1, wherein the second semiconductor layers of the first fin have a first thickness and the second semiconductor layers of the second fin have a second thickness less than the first thickness.

6. The method of claim 5, wherein the second semiconductor layers of the second fin respectively have a middle portion and side portions on opposite sides of the middle portion in the first direction, wherein the middle portions have the second thickness and the side portions have the first thickness.

7. A method for forming a semiconductor device, comprising:

forming a first fin and a second fin extend in a first direction and abutted each other in the first direction;

forming a third fin and a fourth fin extend in the first direction and abutted each other in the first direction, wherein the first fin, the second fin, the third fin, the fourth fin have first semiconductor layers and second semiconductor layers alternating stacked;

forming a first dummy gate structure extending in a second direction different from the first direction and over the first fin and the third fin;

forming a second dummy gate structure extending in the second direction and over the second fin and the fourth fin;

forming first source/drain features attached to the second semiconductor layers of the first fin and the third fin in the first direction;

forming second source/drain features attached to the second semiconductor layers of the second fin and the fourth fin in the first direction;

removing the first dummy gate structure and the first semiconductor layers in the first fin and the third fin to form a first gate trench;

removing the second dummy gate structure and the first semiconductor layers in the second fin and the fourth fin to form a second gate trench;

removing portions of the second semiconductor layers exposed in the second gate trench, wherein a width of the second semiconductor layers exposed in the first gate trench in the second direction is greater than a width of the second semiconductor layers exposed in the second gate trench in the second direction, and a thickness of the second semiconductor layers exposed in the first gate trench is greater than a thickness of the second semiconductor layers exposed in the second gate trench; and forming a first gate structure in the first gate trench and a second gate structure in the second gate trench.

8. The method of claim 7, wherein a length of the first source/drain features in the second direction is greater than a length of the second source/drain features in the second direction.

9. The method of claim 7, further comprising:

forming dielectric structures extending in the second direction and between the first gate structure and the second gate structure in the first direction.

10. The method of claim 7, wherein a length of the first gate structure and a length of the second gate structure in the second direction are the same.

11. The method of claim 7, wherein a first pitch of the second semiconductor layers exposed in the first gate trench and a second pitch of the second semiconductor layers exposed in the second gate trench in a third direction different from the first direction and the second direction are the same.

12. The semiconductor device of claim 7, wherein the width of the second semiconductor layers exposed in the second gate trench in the second direction is in a range from about 5 nm to about 30 nm.

13. The semiconductor device of claim 7, wherein the thickness of the second semiconductor layers exposed in the second gate trench is in a range from about 3 nm to about 7 nm.

14. A method for forming a semiconductor device, comprising:

forming a first fin and a second fin interfacing each other in a first direction;

forming a third fin and a fourth fin interfacing each other in the first direction, wherein the first fin, the second fin, the third fin, the fourth have first semiconductor layers and second semiconductor layers alternating stacked;

forming an isolation feature between the first fin and the third fin;

forming first source/drain features, second source/drain features, third source/drain features, and fourth source/drain features electrically connected to the second semiconductor layers of the first fin, the second fin, the third fin, and the fourth fin in the first direction, respectively;

exposing the second semiconductor layers of the first fin, the second fin, the third fin, and the fourth fin in gate trenches to respectively form first channel layers, second channel layers, third channel layers, and fourth channel layers, wherein the first channel layers, the second channel layers, the third channel layers, and the fourth channel layers respectively have a first thickness, a second thickness, a third thickness, and a fourth thickness;

partially removing the second channel layers and the fourth channel layers, wherein the first channel layers, the second channel layers, the third channel layers, and the fourth channel layers respectively have a first width, a second width, a third width, and a fourth width in a second direction different from the first direction; and forming a first gate structure wrapping around the first channel layers and the third channel layers and a second gate structure wrapping around the second channel layers and the fourth channel layers, wherein the first width and the third width are respectively greater than the second width and the fourth width, wherein the first thickness and the third thickness are respectively greater than the second thickness and the fourth thickness.

15. The method of claim 14, wherein the second channel layers and the fourth channel layers have a dumbbell-shape in a cross-sectional view.

16. The method of claim 14, wherein the first gate structure comprises:

a first work function metal layer wrapping around the first channel layers; and a second work function metal layer wrapping around the third channel layers; and wherein the second gate structure comprises:

a third work function metal layer wrapping around the second channel layers; and a fourth work function metal layer wrapping around the fourth channel layers, wherein a material of the first work function metal layer and the third work function metal layer is different from a material of the second work function metal layer and the fourth work function metal layer.

17. The method of claim 14, wherein the first gate structure comprises a work function metal layer wrapping around the first channel layers and the third channel layers, and the second gate structure comprises the work function metal layer wrapping around the second channel layers and the fourth channel layers.

18. The method of claim 14, further comprising:

forming a first dielectric structure extending in the second direction, wherein the first dielectric structure is between the first gate structure and the second gate structure in the first direction, wherein a length of the first dielectric structure in the first direction and a length of the first gate structure and the second gate structure in the first direction are the same.

19. The method of claim 18, further comprising:

forming second dielectric structures extending in the first direction, wherein the second dielectric structures interfacing the first dielectric structure, the first gate structure, and the second gate structure in the second direction.

20. The method of claim 14, wherein the third thickness and the fourth thickness are respectively greater than the first thickness and the second thickness.

* * * * *